United States Patent
Nosaka

(10) Patent No.: US 11,115,002 B2
(45) Date of Patent: Sep. 7, 2021

(54) MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 81 days.

(21) Appl. No.: 16/550,589

(22) Filed: Aug. 26, 2019

(65) Prior Publication Data
US 2019/0379352 A1  Dec. 12, 2019

Related U.S. Application Data

(63) Continuation of application No. PCT/JP2018/009054, filed on Mar. 8, 2018.

(30) Foreign Application Priority Data

Mar. 15, 2017  (JP) .............................. JP2017-050515

(51) Int. Cl.
*H03H 9/64* (2006.01)
*H03H 9/145* (2006.01)
(Continued)

(52) U.S. Cl.
CPC .......... *H03H 9/6489* (2013.01); *H03H 9/145* (2013.01); *H03H 9/25* (2013.01);
(Continued)

(58) Field of Classification Search
CPC ........ H03H 9/6489; H03H 9/145; H03H 9/25; H03H 9/6483; H03H 9/72; H04B 1/40
(Continued)

(56) References Cited

U.S. PATENT DOCUMENTS

| 6,472,953 B1 | 10/2002 | Sakuragawa et al. |
| 2006/0181366 A1* | 8/2006 | Taniguchi .............. H03H 9/605 333/133 |

(Continued)

FOREIGN PATENT DOCUMENTS

| JP | 2000-323961 A | 11/2000 |
| JP | 2007-074459 A | 3/2007 |

(Continued)

OTHER PUBLICATIONS

Official Communication issued in International Patent Application No. PCT/JP2018/009054, dated May 15, 2018.

*Primary Examiner* — Hafizur Rahman
(74) *Attorney, Agent, or Firm* — Keating & Bennett, LLP

(57) ABSTRACT

A multiplexer includes first and second filters connected to a common terminal. The second filter has a pass band on a higher frequency side with respect to a pass band of the first filter. The first filter includes a series arm circuit, and a parallel arm circuit having a resonant frequency on a lower frequency side with respect to a frequency at a low frequency end of a pass band of the first filter, and the series arm circuit includes a series arm resonator having a resonant frequency in the pass band of the first filter and a series arm resonator that is electrically connected in parallel to the series arm resonator and that has a resonant frequency on a higher frequency side with respect to a frequency at a high frequency end of the pass band of the first filter.

20 Claims, 38 Drawing Sheets

(51) Int. Cl.
*H03H 9/25* (2006.01)
*H03H 9/72* (2006.01)
*H04B 1/40* (2015.01)

(52) U.S. Cl.
CPC ............ *H03H 9/6483* (2013.01); *H03H 9/72* (2013.01); *H04B 1/40* (2013.01)

(58) Field of Classification Search
USPC ........................................................ 333/139
See application file for complete search history.

(56) References Cited

U.S. PATENT DOCUMENTS

| | | |
|---|---|---|
| 2007/0052494 A1 | 3/2007 | Shibagaki et al. |
| 2008/0238572 A1 | 10/2008 | Funami et al. |
| 2009/0201104 A1 | 8/2009 | Ueda et al. |
| 2010/0109801 A1 | 5/2010 | Inoue et al. |
| 2010/0110940 A1 | 5/2010 | Hara et al. |
| 2010/0148887 A1* | 6/2010 | Matsuda ............. H03H 9/6476 333/133 |
| 2012/0293277 A1* | 11/2012 | Hara ..................... H03H 9/725 333/133 |
| 2013/0285768 A1 | 10/2013 | Watanabe et al. |
| 2015/0236840 A1 | 8/2015 | Link et al. |
| 2016/0156331 A1 | 6/2016 | Miwa et al. |
| 2016/0218695 A1 | 7/2016 | Nosaka |
| 2016/0301383 A1 | 10/2016 | Tani |
| 2016/0352310 A1 | 12/2016 | Tani et al. |
| 2017/0005637 A1 | 1/2017 | Nakamura |

FOREIGN PATENT DOCUMENTS

| | | |
|---|---|---|
| JP | 2008-271511 A | 11/2008 |
| JP | 2009-207116 A | 9/2009 |
| JP | 2010-109894 A | 5/2010 |
| JP | 5072047 B2 | 11/2012 |
| JP | 2015-531221 A | 10/2015 |
| JP | 2016-054374 A | 4/2016 |
| JP | 2016-136687 A | 7/2016 |
| JP | 2017-017520 A | 1/2017 |
| WO | 2012/086639 A1 | 6/2012 |
| WO | 2015/022931 A1 | 2/2015 |
| WO | 2015/099105 A1 | 7/2015 |
| WO | 2015/119176 A1 | 8/2015 |

* cited by examiner

MULTIPLEXER, RADIO FREQUENCY FRONT-END CIRCUIT, AND COMMUNICATION DEVICE

CROSS REFERENCE TO RELATED APPLICATIONS

This application claims the benefit of priority to Japanese Patent Application No. 2017-050515 filed on Mar. 15, 2017 and is a Continuation Application of PCT Application No. PCT/JP2018/009054 filed on Mar. 8, 2018. The entire contents of each application are hereby incorporated herein by reference.

BACKGROUND OF THE INVENTION

1. Field of the Invention

The present invention relates to a multiplexer including resonators, a radio frequency front-end circuit and a communication device.

2. Description of the Related Art

Recent mobile communication terminals are required to individually deal with multiband corresponding to a plurality of bands (communication bands). With miniaturization of mobile communication terminals, there is a demand for further miniaturization of components such as modules mounted on the mobile communication terminals. Accordingly, in order to cope with such a demand, a multiplexer has been developed in which one terminal of each of a plurality of filters having pass bands different from each other is directly or indirectly electrically connected to a common terminal.

For example, an acoustic wave filter may be used as a filter configuring such a multiplexer (see Japanese Patent No. 5072047, for example). Japanese Patent No. 5072047 discloses a circuit configuration for achieving the acoustic wave filter. Specifically, in the acoustic wave filter described in Japanese Patent No. 5072047, a first resonator, and a third resonator having a lower anti-resonant frequency than the first resonator are arranged in parallel with a series arm, and a second resonator is arranged with a parallel arm. By connecting the first resonator and the third resonator in parallel, a new pole is formed by the anti-resonant frequency of the third resonator, so that it is possible to provide an acoustic wave filter having excellent steepness on a low frequency side of a pass band.

However, in an acoustic wave resonator such as a surface acoustic wave resonator, there is a loss due to bulk wave radiation (hereinafter referred to as a "bulk wave loss") in a frequency band higher than the anti-resonant frequency. Therefore, when the acoustic wave filter disclosed in Japanese Patent No. 5072047 is used as a first filter having a relatively low pass band in a multiplexer, there is a problem that a loss in a pass band of the second filter having a pass band that is relatively higher than the pass band of the first filter is deteriorated.

SUMMARY OF THE INVENTION

Preferred embodiments of the present invention provide multiplexers, radio frequency front-end circuits, and communication devices that are each able to reduce a loss in a pass band of a filter having a relatively high pass band.

A multiplexer according to a preferred embodiment of the present invention includes a common terminal, a first filter that is an acoustic wave filter electrically connected to the common terminal and that has a pass band, and a second filter that is electrically connected to the common terminal and that has a pass band on a higher frequency side with respect to the pass band of the first filter, in which the first filter includes a first input/output terminal, a second input/output terminal, a series arm circuit provided on a path connecting the first input/output terminal and the second input/output terminal, and a parallel arm circuit electrically connected to a node on the path and ground, and when, in the parallel arm circuit or the series arm circuit, a frequency at which an impedance is locally minimum is defined as a resonant frequency, and a frequency at which an impedance is locally maximum is defined as an anti-resonant frequency, and when a frequency at which an impedance of a resonator is locally minimum is defined as a resonant frequency, and a frequency at which an impedance of the resonator is locally maximum is defined as an anti-resonant frequency, the parallel arm circuit has a resonant frequency located on a lower frequency side with respect to a frequency at a low frequency end of the pass band of the first filter, and the series arm circuit includes a first series arm resonator defined by an acoustic wave resonator having a resonant frequency in the pass band of the first filter, and a second series arm resonator defined by an acoustic wave resonator that is electrically connected in parallel to the first series arm resonator and that has a resonant frequency located on a higher frequency side with respect to a frequency at a high frequency end of the pass band of the first filter.

In this manner, the first series arm resonator is electrically connected in parallel to the second series arm resonator, so that power of a radio frequency signal input to the first filter is distributed between the first series arm resonator and the second series arm resonator. Further, since the resonant frequency of the second series arm resonator is located on the higher frequency side with respect to the high frequency end of the pass band of the first filter, a bulk wave loss caused by the second series arm resonator is generated at a higher frequency than a bulk wave loss caused by the first series arm resonator.

Therefore, the bulk wave loss in the pass band of the second filter when observed as a whole of the series arm circuit including the first series arm resonator and the second series arm resonator is able to be reduced, so that it is possible to reduce the loss in the pass band of the second filter. That is, according to present preferred embodiments of the present invention, by reducing the bulk wave loss within the pass band of the second filter due to composite characteristics of the first series arm resonator and the second series arm resonator, it is possible to reduce the loss in the pass band of the second filter having the relatively high pass band.

In addition, the resonant frequency of the second series arm resonator may be lower than a frequency at a low frequency end of the pass band of the second filter.

An acoustic wave resonator exhibits a high impedance in an anti-resonant frequency and in the vicinity of a high frequency side of the anti-resonant frequency. Accordingly, the impedance of the second series arm resonator is able to be increased in the pass band of the second filter, so that the impedance of the first filter observed from the common terminal is able to be increased. Therefore, when the first filter is observed from the common terminal, the loss in the pass band of the second filter is able to be reduced by reducing the bulk wave loss in the frequency band corresponding to the pass band of the second filter.

Further, the first filter may further include another series arm circuit including an acoustic wave resonator provided on the path, the series arm circuit may be electrically connected to the first input/output terminal without the other series arm circuit being interposed therebetween, and the first input/output terminal may be electrically connected to the common terminal without an acoustic wave resonator being interposed therebetween.

The deterioration in the loss in the pass band of the second filter due to the bulk wave loss of the first filter is dominantly influenced by the bulk wave loss of the series arm circuit that is most closely electrically connected to the common terminal of the first filter. Therefore, by connecting the series arm circuit in which the second series arm resonator is electrically connected in parallel to the first series arm resonator, to the common terminal without the other series arm circuit being interposed therebetween, the bulk wave loss in the pass band of the second filter is able to be reduced more effectively when the first filter is observed from the common terminal, thus effectively reducing the loss in the pass band of the second filter.

In addition, when the other series arm circuit has one or more resonant frequencies and one or more anti-resonant frequencies, a value obtained by dividing a frequency difference between an anti-resonant frequency located at a lowest frequency and a resonant frequency located at a lowest frequency of the series arm circuit including the one or more resonant frequencies and the one or more anti-resonant frequencies by the resonant frequency located at the lowest frequency is defined as a band width ratio of the series arm circuit, the parallel arm circuit has one or more resonant frequencies and one or more anti-resonant frequencies, a value obtained by dividing a frequency difference between an anti-resonant frequency located at a lowest frequency and a resonant frequency located at a lowest frequency of the parallel arm circuit having the one or more resonant frequencies and the one or more anti-resonant frequencies by the resonant frequency located at the lowest frequency is defined as a band width ratio of the parallel arm circuit, and a value obtained by dividing a frequency difference between an anti-resonant frequency of a series arm resonator and a resonant frequency of the series arm resonator by the resonant frequency is defined as a band width ratio of the series arm resonator, a band width ratio of the first series arm resonator may be wider than both a band width ratio of the other series arm circuit and a band width ratio of the parallel arm circuit.

In this manner, by using an acoustic wave resonator having a wide band width ratio as the first series arm resonator, the band width ratio of the series arm circuit is made narrower due to the composite characteristics with the second series arm resonator. As a result, the impedance of the second series arm resonator is able to be reduced. Therefore, in the series arm circuit, power distribution to the second series arm resonator in which the bulk wave loss is unlikely to occur in the pass band of the second filter is able to be increased, so that the bulk wave loss in the pass band of the second filter when the whole series arm circuit is observed is able to be reduced. Therefore, it is possible to further reduce the loss in the pass band of the second filter.

Further, the series arm circuit may further include a first impedance element electrically connected in series to the first series arm resonator, a circuit in which the first series arm resonator and the first impedance element are electrically connected in series and the second series arm resonator may be electrically connected in parallel, and the first impedance element may be a capacitor or an inductor. This makes it possible to adjust a pass band width or an attenuation band of the first filter while reducing the loss in the pass band of the second filter.

Further, the series arm circuit may further include a first impedance element electrically connected in series to the first series arm resonator, and a first switch electrically connected in series to the second series arm resonator, in which a circuit in which the first series arm resonator and the first impedance element are electrically connected in series and a circuit in which the second series arm resonator and the first switch are electrically connected in series may be electrically connected in parallel, and the first impedance element may be a capacitor or an inductor.

According to this configuration, it becomes possible to change a frequency of an attenuation pole on a high frequency side of the pass band of the first filter while reducing the loss in the pass band of the second filter. Further, the first switch may be electrically connected to the first input/output terminal or the second input/output terminal without any series arm resonator being interposed therebetween. Thus, the number of terminals of a package of a resonator and a package of a switch is able to be reduced, so that the first filter and the multiplexer including the first filter is able to be miniaturized.

Further, a second switch electrically connected in parallel to the first impedance element may also be provided.

According to this configuration, it is possible to switch a frequency at the high frequency end of the pass band in the first filter while reducing the loss in the pass band of the second filter. Further, the second switch may be electrically connected to the first input/output terminal or the second input/output terminal without any series arm resonator being interposed therebetween. Thus, the number of terminals of a package of a resonator and a package of a switch is able to be reduced, so that the first filter and the multiplexer including the first filter is able to be miniaturized.

In addition, the parallel arm circuit may include a first parallel arm resonator electrically connected between the node and the ground, and a resonant frequency of the first parallel arm resonator may be lower than the frequency at the low frequency end of the pass band of the first filter. As a result, steepness of an attenuation slope on a low frequency side of the pass band of the first filter is able to be defined by a parallel arm resonator p1.

In addition, the parallel arm circuit may further include a second parallel arm resonator electrically connected in parallel to the first parallel arm resonator, and a resonant frequency of the second parallel arm resonator may be higher than the resonant frequency of the first parallel arm resonator.

According to this, as compared with a frequency difference between an anti-resonant frequency and the resonant frequency of the first parallel arm resonator alone, a frequency difference between an anti-resonant frequency on a lowest frequency side and a resonant frequency on a lowest frequency side of the parallel arm circuit is able to be narrowed, and a new resonant frequency appears on a high frequency side of the anti-resonant frequency on the lowest frequency side. Therefore, the steepness on each side of the pass band of the first filter is improved.

In addition, the parallel arm circuit may include a first parallel arm resonator electrically connected between the node and the ground and a second impedance element electrically connected in series to the first parallel arm resonator, and a resonant frequency of the first parallel arm resonator may be lower than the frequency at the low frequency end of the pass band of the first filter. According to this, by appropriately selecting the second impedance element, the frequency difference between the anti-resonant frequency and the resonant frequency of the parallel arm circuit is able to be adjusted appropriately, so that the steepness of the attenuation slope on the low frequency side of the pass band is able to be adjusted. Therefore, the pass band width or the frequency of the attenuation pole on the low frequency side of the pass band is able to be set as appropriate.

Further, the parallel arm circuit may further include a third switch electrically connected in parallel to the second impedance element, and the first parallel arm resonator and the second impedance element may configure a first frequency variable circuit that changes a frequency of at least one of a resonant frequency and an anti-resonant frequency of the parallel arm circuit by switching between conduction and non-conduction of the third switch.

According to this configuration, the resonant frequency of the parallel arm circuit is able to be switched in response to the switching of the third switch between an on state and an off state, so that the frequency of the attenuation pole of the first filter is able to be switched.

Further, the parallel arm circuit may further include a second parallel arm resonator electrically connected between the node and the ground, the second parallel arm resonator and a circuit in which the first parallel arm resonator and the first frequency variable circuit are electrically connected in series may be electrically connected in parallel, and a resonant frequency of the second parallel arm resonator may be higher than a resonant frequency of the first parallel arm resonator.

According to this configuration, both the resonant frequency at the lowest frequency side and the anti-resonant frequency at the lowest frequency side of the parallel arm circuit is able to be switched in response to the switching between the on state and the off state of the third switch. Therefore, since both the frequency of the attenuation pole on the low frequency side of the pass band and the frequency at the low frequency end of the pass band are able to be switched for the first filter, it is possible to switch the frequency of the attenuation pole on the low frequency side of the pass band while reducing the loss at the low frequency end of the pass band of the first filter.

Further, the parallel arm circuit may further include a second parallel arm resonator electrically connected between the node and the ground, and a fourth switch electrically connected in series to the second parallel arm resonator, a circuit in which the second parallel arm resonator and the fourth switch are electrically connected in series, and a circuit in which the first parallel arm resonator and the first frequency variable circuit are electrically connected in series may be electrically connected in parallel, and a resonant frequency of the second parallel arm resonator may be higher than a resonant frequency of the first parallel arm resonator.

According to this configuration, the number of attenuation poles on the high frequency side of the pass band of the first filter is changed by switching the number of the resonant frequencies and the anti-resonant frequencies on the high frequency side of the parallel arm circuit in response to the switching of an on state and an off state of the fourth switch. In addition, in response to the switching between the on state and the off state of the third switch, both the resonant frequency at the lowest frequency side and the anti-resonant frequency at the lowest frequency side of the parallel arm circuit are changed, so that the frequency at the low frequency end of the pass band and the frequency at the attenuation pole on the low frequency side of the pass band of the first filter is able to be changed.

In addition, the parallel arm circuit may include a first parallel arm resonator electrically connected between the node and the ground, a second parallel arm resonator electrically connected between the node and the ground, and a fourth switch electrically connected in series to the second parallel arm resonator, a resonant frequency of the first parallel arm resonator may be lower than the frequency at the low frequency end of the pass band of the first filter and a resonant frequency of the second parallel arm resonator may be higher than the resonant frequency of the first parallel arm resonator.

According to this configuration, the number of attenuation poles on the high frequency side of the pass band of the first filter is changed by switching the number of the resonant frequencies and the anti-resonant frequencies on the high frequency side of the parallel arm circuit in response to the switching of an on state and an off state of the fourth switch. Therefore, it is possible to change the number of the attenuation poles on the high frequency side of the pass band of the first filter.

In addition, the parallel arm circuit may further include a third impedance element electrically connected in parallel to the fourth switch, and the fourth switch and the third impedance element may configure a second frequency variable circuit that changes a frequency of at least one of the resonant frequency and the anti-resonant frequency of the parallel arm circuit by switching between conduction and non-conduction of the fourth switch.

According to this configuration, it is possible to change the resonant frequency on the high frequency side and the anti-resonant frequency on the low frequency side of the parallel arm circuit in response to the switching between the on state and the off state of the fourth switch. Therefore, both of the frequency of the attenuation pole on the high frequency side of the pass band and the frequency at the high frequency end of the pass band of the first filter is able to be changed, so that the frequency of the attenuation pole on the high frequency side of the pass band is able to be changed while reducing the loss at the high frequency end of the pass band.

Additionally, the parallel arm circuit may include a first parallel arm resonator electrically connected between the node and the ground, a second impedance element electrically connected in series to the first parallel arm resonator, a third switch electrically connected in parallel to the second impedance element, a second parallel arm resonator electrically connected between the node and the ground, a third impedance element electrically connected in series to the second parallel arm resonator, and a fourth switch electrically connected in parallel to the third impedance element, a circuit in which the first parallel arm resonator and the second impedance element are electrically connected in series, and a circuit in which the second parallel arm resonator and the third impedance element are electrically connected in series may be electrically connected in parallel, the second impedance element and the third switch may configure a first frequency variable circuit that changes a frequency of at least one of a resonant frequency and an anti-resonant frequency of the parallel arm circuit by switching between conduction and non-conduction of the third switch, the third impedance element and the fourth switch may configure a second frequency variable circuit that changes a frequency of at least one of a resonant frequency and an anti-resonant frequency of the parallel arm circuit by switching between conduction and non-conduction of the fourth switch, a resonant frequency of the first parallel arm resonator may be lower than a frequency at the low frequency end of the pass band of the first filter, and a resonant frequency of the second parallel arm resonator may be higher than the resonant frequency of the first parallel arm resonator.

According to this configuration, since both a resonant frequency on a low frequency side and an anti-resonant frequency on a low frequency side of the parallel arm circuit is able to be changed in response to switching of an on state and an off state of the third switch, a frequency of an attenuation pole on the low frequency side of the pass band is able to be changed while a loss at the low frequency end of the pass band is able to be reduced.

Further, since both a resonant frequency on a high frequency side and the anti-resonant frequency on the low frequency side of the parallel arm circuit is able to be changed in response to switching between an on state and an off state of the fourth switch, a frequency of an attenuation pole on the high frequency side of the pass band is able to be changed while a loss at the high frequency end of the pass band is able to be reduced.

Also, the first frequency variable circuit may be electrically connected between the first parallel arm resonator and the ground, and the second frequency variable circuit may be electrically connected between the second parallel arm resonator and the ground. As a result, a loss in the pass band of the first filter is able to be reduced. Further, since the number of terminals of a package of a resonator and a package of a switch is able to be reduced, the first filter and the multiplexer including the first filter is able to be miniaturized.

In addition, the first filter may include an acoustic wave resonator including an IDT electrode defined by a plurality of electrode fingers on a substrate, at least a portion of the substrate has piezoelectricity, and when a value obtained by dividing a frequency difference between an anti-resonant frequency of an acoustic wave resonator and a resonant frequency of the acoustic wave resonator by the resonant frequency is defined as a band width ratio of the acoustic wave resonator, a first adjustment film that adjusts the band width ratio is between the substrate and the IDT electrode of at least one acoustic wave resonator of acoustic wave resonators defining the first filter.

Thus, the band width ratio of the first series arm resonator is able to be set by adjusting a film thickness of the first adjustment film. For example, when it is desired to set the band width ratio of the first series arm resonator to be large, the film thickness of the first adjustment film of the first series arm resonator may be made to be thin.

In addition, each of the first series arm resonator and the second series arm resonator may be the acoustic wave resonator including the IDT electrode, and the first adjustment film may not be provided between the substrate and the IDT electrode of the first series arm resonator, or the first adjustment film having a film thickness thinner than that of the first adjustment film provided between the substrate and the IDT electrode of at least one other acoustic wave resonator defining the first filter may be provided.

Thus, a band width ratio of the first series arm resonator is able to be set to be larger than a band width ratio of the at least one other acoustic wave resonator.

In addition, each of the first series arm resonator and first parallel arm resonator may be an acoustic wave resonator including an IDT electrode defined by a plurality of electrode fingers on a substrate, at least a portion of the substrate has piezoelectricity, and when a value obtained by dividing a frequency difference between an anti-resonant frequency of the acoustic wave resonator and a resonant frequency of the acoustic wave resonator by the resonant frequency is defined as a band width ratio of the acoustic wave resonator, a second adjustment film that adjusts the band width ratio may cover at least the IDT electrode of the second series arm resonator of the first series arm resonator and the second series arm resonator.

Thus, the band width ratio of the first series arm resonator is able to be set by adjusting the film thickness of the second adjustment film. For example, when it is desired to set the band width ratio of the first series arm resonator to be large, the film thickness of the second adjustment film of the first series arm resonator may be thin.

In addition, the IDT electrode of the first series arm resonator may not be covered with the second adjustment film or may be covered with the second adjustment film having a film thickness thinner than that of the second adjustment film that covers the IDT electrode of at least one other acoustic wave resonator defining the first filter.

Thus, the band width ratio of the first series arm resonator is able to be set to be larger than the band width ratio of the at least one other acoustic wave resonator.

A radio frequency front-end circuit according to a preferred embodiment of the present invention includes any of the above multiplexers described above, and an amplifier circuit electrically connected to the multiplexer. Thus, a multiband-compatible radio frequency front-end circuit with a low loss is able to be provided.

In addition, a communication device according to aspect preferred embodiment of the present invention includes a Radio Frequency (RF) signal processing circuit that processes a radio frequency signal to be transmitted and received by an antenna element, and the radio frequency front-end circuit that transmits the radio frequency signal between the antenna element and the RF signal processing circuit.

Thus, a multiband-compatible communication device with a low loss is able to be provided.

With the multiplexers, the radio frequency front-end circuits, and the communication devices according to preferred embodiments of the present invention, loss in a pass band of a filter having the relatively high pass band is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
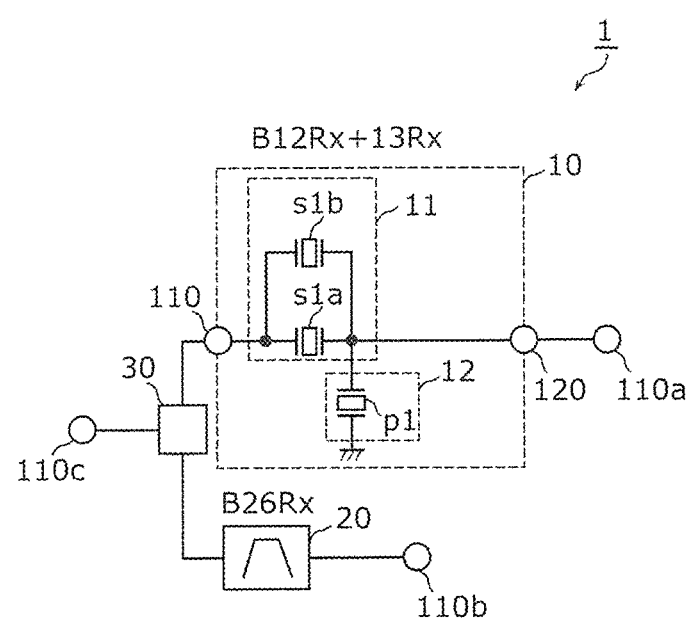
FIG. 1 is a circuit block diagram of a multiplexer according to Preferred Embodiment 1 of the present invention.

Hereinafter, the preferred embodiments of the present invention will be described in detail with reference to examples and drawings. Note that the preferred embodiments described below are all inclusive or specific examples. The numerical values, shapes, materials, elements, arrangement and connection configurations of the elements shown in the following preferred embodiments are merely examples, and are not intended to limit the scope of the present invention. Among the elements in the following preferred embodiments, the elements that are not described in the independent claims will be described as arbitrary elements. Also, the size or size ratio of the elements illustrated in the drawings is not necessarily strict. In addition, in the drawings, the same reference signs are used for the same or substantially same elements, and a description thereof may be omitted or simplified. In addition, a constant may be appropriately adjusted in accordance with requirement specifications or the like for circuit elements such as a resonator or the like. For this reason, the circuit elements may have the same sign but different constants. In addition, in the following description, the "low frequency end of a pass band" means the "lowest frequency in the pass band". Additionally, the "high frequency end of a pass band" means the "highest frequency in the pass band". In addition, in the following description, the "low frequency side of a pass band" means "outside of the pass band" and the "lower side (lower frequency side) than the pass band". Additionally, the "high frequency side of a pass band" means "outside of the pass band" and the "higher side (higher frequency side) than the pass band". In addition, in the following description, each switch is treated as an ideal switch that has no capacitance component (that is, infinitive impedance) when the switch is in an off state (that is, non-conductive), and that has a resistance component of zero (that is, impedance of zero) when the switch is in an on state (that is, conductive).

A resonant frequency in a resonator or a circuit is, unless otherwise specified, a resonant frequency that produces an attenuation pole in a pass band or in the vicinity of the pass band of a filter including the resonator or the circuit, and is a frequency of a "resonance point" that is a singular point where an impedance of the resonator or the circuit is locally minimum (ideally, a point where the impedance is zero).

An anti-resonant frequency in a resonator or a circuit is, unless otherwise specified, an anti-resonant frequency that produces an attenuation pole in a pass band or in the vicinity of the pass band of a filter including the resonator or the circuit, and is a frequency of an "anti-resonance point" that is a singular point where an impedance of the resonator or the circuit is locally maximum (ideally, a point where the impedance is infinity).

Note that, in the following preferred embodiments, a series arm circuit and a parallel arm circuit are defined as follows.

A series arm circuit is, on a path connecting one input/output terminal and the other input/output terminal, a circuit provided between the one input/output terminal or the other input/output terminal and a node, on the path, where the parallel arm circuit is electrically connected, or a circuit provided between one node, on the path, where one parallel arm circuit is electrically connected, and another node, on the path, where another parallel arm circuit is electrically connected.

The parallel arm circuit is a circuit provided between one node on the path and ground.

Preferred Embodiment 1

FIG. 1 is a circuit block diagram of a multiplexer 1 according to Preferred Embodiment 1 of the present invention. In this figure, a circuit configuration of a filter 10 is also illustrated.

The multiplexer 1 preferably includes a common terminal 110c, the filter 10 (first filter), and a filter 20 (second filter). In the present preferred embodiment, the multiplexer 1 is preferably used in reception that is compatible with a plurality of bands defined in Third Generation Partnership Project (3GPP), and specifically corresponds to Band12Rx+ 13Rx (hereinafter sometimes abbreviated as "B12Rx+ 13Rx") that is a reception band obtained by synthesizing a Band12 reception band (about 729 MHz to about 746 MHz) and a Band13 reception band (about 746 MHz to about 756 MHz), and Band26Rx (hereinafter sometimes abbreviated as "B26Rx") that is a Band26 reception band (about 859 MHz to about 894 MHz), for example. Such a multiplexer 1 is used, for example, as a multiplexer compatible with Long Term Evolution (LTE).

Note that the multiplexer 1 is not limited to a multiplexer used in reception, and may instead be a multiplexer used in transmission, or a multiplexer corresponding to both transmission and reception of such as a duplexer. Also, the number of filters included in the multiplexer 1 and a corresponding band are not limited to those described above.

The filter 10 is preferably an acoustic wave filter including an input/output terminal 110 (a first input/output terminal) and an input/output terminal 120 (a second input/output terminal), the input/output terminal 110 as one input/output terminal is electrically connected to the common terminal 110c of the multiplexer 1, and the input/output terminal 120 as the other input/output terminal is electrically connected to an individual terminal 110a of the multiplexer 1. In the present preferred embodiment, the filter 10 is preferably, for example, a reception filter corresponding to B12Rx+13Rx, B12Rx+13Rx is set as a pass band, and Band12Tx that is set as a transmission band of Band12 and Band13Tx that is a transmission band of Band 13 (hereinafter sometimes abbreviated as "B12Tx" and "B13Tx", respectively) are set as attenuation bands.

The filter 20 is a filter in which the input/output terminal 110 as one input/output terminal is electrically connected to the common terminal 110c of the multiplexer 1 and the other input/output terminal is electrically connected to the individual terminal 110b of the multiplexer 1, and has a pass band on a higher frequency side with respect to the pass band of the filter 10. Specifically, a frequency at a low frequency end of the pass band of the filter 20 is located at a higher frequency side with respect to a frequency at a high frequency end of the pass band of the filter 10. In the present preferred embodiment, the filter 20 is preferably, for example, a reception filter corresponding to B26Rx, B26Rx is set as a pass band and Band26Tx (hereinafter sometimes abbreviated as "B26Tx") that is a Band26 transmission band is set as an attenuation band.

Note that a configuration of the filter 20 is not particularly limited, and an acoustic wave filter, an LC filter, a dielectric filter, or the like may be appropriately used in accordance with requirement specifications or the like of a size and electrical characteristics of the filter 20.

The input/output terminal 110 of the filter 10 and the one input/output terminal of the filter 20 are preferably directly or indirectly electrically connected to the common terminal 110c with a branch circuit 30 interposed therebetween. That is, the branch circuit 30 is a branch point (common connection point) of wiring, or a switch or a phase shifter that is able to obtain one or more conductions, and one input/output terminal of each of the filters 10 and 20 is electrically connected to the common terminal 110c directly or with the phase shifter or the switch interposed therebetween.

The filter 10 includes a series arm circuit 11 provided on a path connecting the input/output terminal 110 (first input/output terminal) and the input/output terminal 120 (second input/output terminal), and a parallel arm circuit 12 electrically connected to a node on the path and ground.

In the following description, in the parallel arm circuit or the series arm circuit, a frequency at which an impedance is locally minimum is defined as a resonant frequency, and a frequency at which the impedance is locally maximum is defined as an anti-resonant frequency and a frequency at which an impedance of a resonator is locally minimum is defined as a resonant frequency, and a frequency at which the impedance of the resonator is locally maximum is defined as an anti-resonant frequency.

The series arm circuit 11 preferably includes a series arm resonator s1a (first series arm resonator) having a resonant frequency within the pass band of the filter 10 (first filter), and a series arm resonator s1b (second series arm resonator) electrically connected in parallel with the series arm resonator s1a and having a resonant frequency located on the higher frequency side with respect to the frequency at the high frequency end of the pass band of the filter 10.

The series arm resonator s1a is electrically connected between the input/output terminal 110 and the input/output terminal 120, and preferably has a resonant frequency within a pass band of B12Rx+B13Rx in the present preferred embodiment.

The series arm resonator s1b is electrically connected in parallel with the series arm resonator s1a, and in the present preferred embodiment, is preferably electrically connected in parallel with the series arm resonator s1a without other circuit elements being interposed therebetween, and has, for example, a resonant frequency higher than about 756 MHz (located on a higher frequency side) that is a high frequency end of the pass band of B12Rx+B13Rx.

Each of the series arm resonators s1a and s1b may be defined by a plurality of acoustic wave resonators, and for example, may be defined by a plurality of division resonators in which one acoustic wave resonator is subjected to series division or the like.

The parallel arm circuit 12 preferably has a resonant frequency located on a lower frequency side with respect to the low frequency end of the pass band of the filter 10 (first filter), and is configured with only a parallel arm resonator p1 that is preferably one acoustic wave resonator in the present preferred embodiment. That is, in the present preferred embodiment, the resonant frequency of the parallel arm circuit 12 is equal or substantially equal to a resonant frequency of the parallel arm resonator p1, and the parallel arm resonator p1 has the resonant frequency lower than about 729 MHz (located on a lower frequency side) that is a low frequency end of B12Rx+B13Rx. Thus, steepness of an attenuation slope on the low frequency side of the pass band of the filter 10 is able to be defined by the parallel arm resonator p1.

The parallel arm resonator p1 may be defined by a plurality of acoustic wave resonators, and for example, may be defined by a plurality of division resonators in which one acoustic wave resonator is subjected to series division or the like. In addition, a configuration of the parallel arm circuit 12 is not limited to a parallel arm resonator using an acoustic wave resonator as described above, but may be, for example, an LC resonant circuit. Further, the configuration is not limited to a resonant circuit, but may be an impedance element such as an inductance element or a capacitance element.

According to the filter 10 configured as described above, it is possible to reduce a loss in a pass band of the other filter (here, filter 20) of the multiplexer 1 together with the filter 10 that is an acoustic wave filter. The details of this advantageous effect will be described later.

Next, characteristics of the filter 10 (first filter) according to the present preferred embodiment will be described, compared with comparative examples (Comparative Examples 1, and 2), by using examples (Examples 1 to 4). Examples 1 to 4 have a configuration of the preferred embodiment. In other words, in Examples 1 to 4, the series arm resonator s1b has a resonant frequency that is located on the higher frequency side with respect to the high frequency end of the pass band of the filter 10. In contrast, in Comparative Example 1, it is different in that the series arm resonator s1b has a resonant frequency located on the lower frequency side with respect to the high frequency end of the pass band of the filter 10. In addition, in Comparative example 2, it is different in that the series arm resonator s1b is not provided. In other words, in Comparative Example 2, the series arm circuit is defined by only the series arm resonator s1a.

Circuit constants of filters according to Examples 1 to 4, and Comparative Examples 1 and 2 are shown in Table 1. Here, a band width ratio (BWR) is defined as a value obtained by dividing a frequency difference (fa−fr) between an anti-resonant frequency (fa) and a resonant frequency (fr) by the resonant frequency (fr) in a case of a resonator alone (that is, (fa−fr)/fr) (or percentage thereof), and is defined as a value obtained by dividing a frequency difference (fa1−fr1) between an anti-resonant frequency (fa1) located at the lowest frequency and a resonant frequency (fr1) located at the lowest frequency by the resonant frequency (fr1) located at the lowest frequency in a case of a series arm circuit or a parallel arm circuit (that is, (fa1−fr1)/fr1) (or percentage thereof). Note that in this case, the series arm circuit or the parallel arm circuit has at least one resonant frequency and at least one anti-resonant frequency. Additionally, a capacitance value here is a value of an electrostatic capacity of an acoustic wave resonator, and a definition thereof will be described later.

TABLE 1

|  |  |  | Resonant Frequency fr (MHz) | Anti-Resonant Frequency fa (MHz) | Band Width Ratio BWR (%) | Capacitance Value (pF) |
| --- | --- | --- | --- | --- | --- | --- |
| Example 1 | Series Arm Circuit 11 | Series Arm Resonator s1a | 750 | 784 | 4.50 | 2.0 |
|  |  | Series Arm Resonator s1b | 1200 | 1254 | 4.50 | 0.5 |
|  | Parallel Arm Circuit 12 | Parallel Arm Resonator p1 | 708 | 740 | 4.50 | 6.0 |
| Example 2 | Series Arm Circuit 11 | Series Arm Resonator s1a | 750 | 784 | 4.50 | 2.0 |
|  |  | Series Arm Resonator s1b | 830 | 867 | 4.50 | 0.5 |

TABLE 1-continued

|  |  |  | Resonant Frequency fr (MHz) | Anti-Resonant Frequency fa (MHz) | Band Width Ratio BWR (%) | Capacitance Value (pF) |
|---|---|---|---|---|---|---|
| | Parallel Arm Circuit 12 | Parallel Arm Resonator p1 | 708 | 740 | 4.50 | 6.0 |
| Example 3 | Series Arm Circuit 11 | Series Arm Resonator s1a | 750 | 814 | 8.50 | 1.5 |
| | | Series Arm Resonator s1b | 1200 | 1254 | 4.50 | 1.5 |
| | Parallel Arm Circuit 12 | Parallel Arm Resonator p1 | 708 | 740 | 4.50 | 6.0 |
| Example 4 | Series Arm Circuit 11 | Series Arm Resonator s1a | 750 | 814 | 8.50 | 1.5 |
| | | Series Arm Resonator s1b | 830 | 867 | 4.50 | 1.0 |
| | Parallel Arm Circuit 12 | Parallel Arm Resonator p1 | 708 | 740 | 4.50 | 6.0 |
| Comparative Example 1 | Series Arm Circuit 11 | Series Arm Resonator s1a | 750 | 784 | 4.50 | 2.0 |
| | | Series Arm Resonator s1b | 705 | 737 | 4.50 | 2.0 |
| | Parallel Arm Circuit 12 | Parallel Arm Resonator p1 | 705 | 737 | 4.50 | 6.0 |
| Comparative Example 2 | Series Arm Circuit 11 | Series Arm Resonator s1a | 750 | 784 | 4.50 | 2.0 |
| | Parallel Arm Circuit 12 | Parallel Arm Resonator p1 | 708 | 740 | 4.50 | 6.0 |

Here, a relationship among filter characteristics, a resonant frequency, and an anti-resonant frequency of a common, ladder band pass filter defined by a series arm circuit including only a series arm resonator and a parallel arm circuit including only a parallel arm resonator circuit will be described.

The parallel arm circuit has a resonant frequency frp at which an impedance |Z| is locally minimum, and an anti-resonant frequency fap (>frp) at which the impedance |Z| is locally maximum. Also, the series arm circuit has a resonant frequency frs at which an impedance |Z| is locally minimum, and an anti-resonant frequency fas (>frs>frp) at which the impedance |Z| is locally maximum. In configuring the ladder-type band pass filter, the anti-resonant frequency fap of the parallel arm circuit and the resonant frequency frs of the series arm circuit are brought close to each other. Thus, an attenuation pole is produced at the resonant frequency frp at which the impedance of the parallel arm circuit approaches a local minimum, and the vicinity of the resonant frequency frp becomes a low frequency side blocking region. Further, with this, when a frequency becomes higher, the impedance of the parallel arm circuit approaches a local maximum in the vicinity of the anti-resonant frequency fap, and the impedance of the series arm circuit approaches a local minimum in the vicinity of the resonant frequency frs. Thus, the vicinity of each of the anti-resonant frequency fap and the resonant frequency frs, becomes the pass band on a signal path from an input terminal to an output terminal. Further, when the frequency becomes high and comes close to the anti-resonant frequency fas, an attenuation pole is formed at the anti-resonant frequency fas at which the impedance of the series arm circuit is high, and the vicinity of the anti-resonant frequency fas becomes a high frequency side blocking region. That is, the pass band is produced by the anti-resonant frequency fap of the parallel arm circuit and the resonant frequency frs of the series arm circuit, the attenuation pole on the low frequency side of the pass band is produced by the resonant frequency frp of the parallel arm circuit, and the attenuation pole on the high frequency side of the pass band is produced by the anti-resonant frequency fas of the series arm circuit.

Next, characteristics of filters (first filters) according to Examples 1 to 4 will be described.

Figure 2:
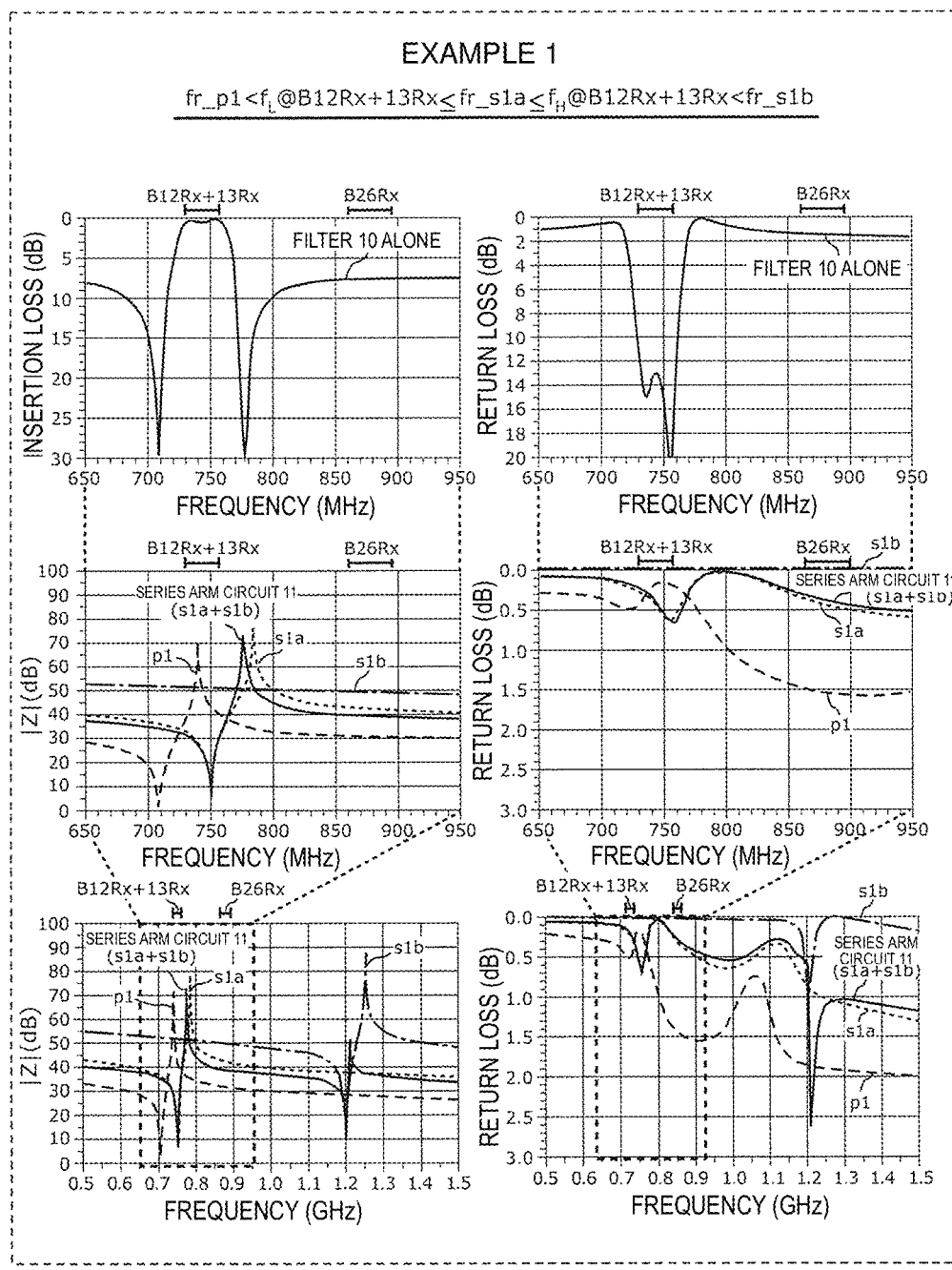
FIG. 2 includes graphs illustrating various characteristics relating to a filter (first filter) of Example 1.

FIG. 2 includes graphs illustrating various characteristics relating to a filter according to Example 1. Specifically, in the left column of the figure, filter characteristics (transmission characteristics), the impedance characteristics of the resonator alone and the series arm circuit or the parallel arm circuit, and the impedance characteristics in a wider band are illustrated in order from the top. Reflection characteristics of an input/output terminal 110 side (i.e., common terminal 110c side) are illustrated in the right column of the figure, and reflection characteristics of the filter 10 alone (i.e., a first filter alone), reflection characteristics of the resonator alone and the resonance circuit, and the reflection characteristics in the wider band are illustrated in order from the top. This is the same as in the following FIG. 3 to FIG. 7.

Note that the characteristics of the filter 10 alone are characteristics obtained by eliminating deviation in impedance matching due to non-connection between the filter (filter 20 in this example) other than the filter 10 and the common terminal 110c in the multiplexer 1.

As illustrated in FIG. 2 and shown in Table 1, in Example 1, a resonant frequency (fr_s1a) of the series arm resonator s1a, a resonant frequency (fr_s1b) of the series arm resonator s1b, the resonant frequency (fr_p1) of the parallel arm resonator p1, a frequency ($f_L$@B12Rx+13Rx) at the low frequency end of the pass band of the filter 10, and a frequency ($f_H$@B12Rx+13Rx) at the high frequency end of the pass band of the filter 10 satisfy the following first relationship.

$$fr\_p1 < f_L@B12Rx+13Rx \leq fr\_s1a \leq f_H@B12Rx+13Rx < fr\_s1b$$

Figure 3:
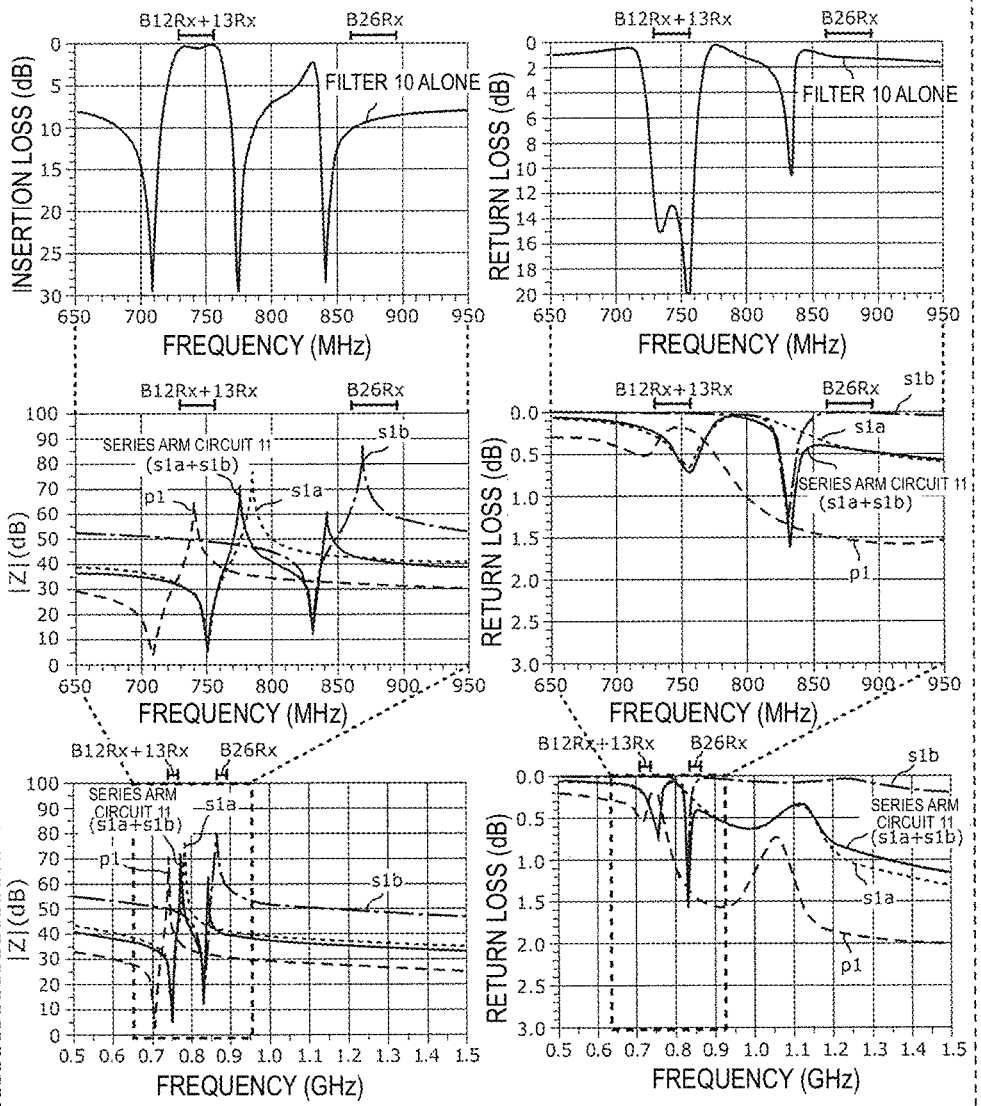
FIG. 3 includes graphs illustrating various characteristics relating to a filter (first filter) of Example 2.

FIG. 3 includes graphs illustrating various characteristics relating to a filter according to Example 2.

As illustrated in FIG. 3 and shown in Table 1, in Example 2, in addition to the above-described first relation, the following second relation in which the resonant frequency of the series arm resonator s1b (second series arm resonator) is lower than a frequency (f$_L$@B26Rx) at the low frequency end of the pass band of the filter 20 is satisfied.

$$fr\_s1b < f_L@B26Rx$$

In these Examples 1 and 2, a band width ratio (BWR_s1*b*) of the series arm resonator s1*b* is equal or substantially equal to a band width ratio of the parallel arm circuit 12. Here, since the parallel arm circuit 12 includes only the parallel arm resonator p1, the band width ratio of the parallel arm circuit 12 is equal or substantially equal to a band width ratio (BWR_p1) of the parallel arm resonator p1. Further, a band width ratio (BWR_s1*a*) of the series arm resonator s1*a* is equal or substantially equal to the band width ratio of the parallel arm circuit 12. In other words, in Examples 1 and 2, a relationship among the band width ratios is as follows.

$$BWR\_s1a = BWR\_s1b = BWR\_p1$$

In contrast, in Examples 3 and 4, the band width ratio (BWR_s1*b*) of the series arm resonator s1*b* is wider than the band width ratio (i.e., BWR_p1) of the parallel arm circuit 12. In other words, in Examples 3 and 4, the band width ratios satisfy the following third relationship.

$$BWR\_s1b > BWR\_s1a = BWR\_p1$$

The relationship between the band width ratio (BWR_s1*a*) of the series arm resonator s1*a* and the band width ratio (i.e., BWR_p1) of the parallel arm circuit 12 is not limited to the above, and may be different from each other.

Figure 4:
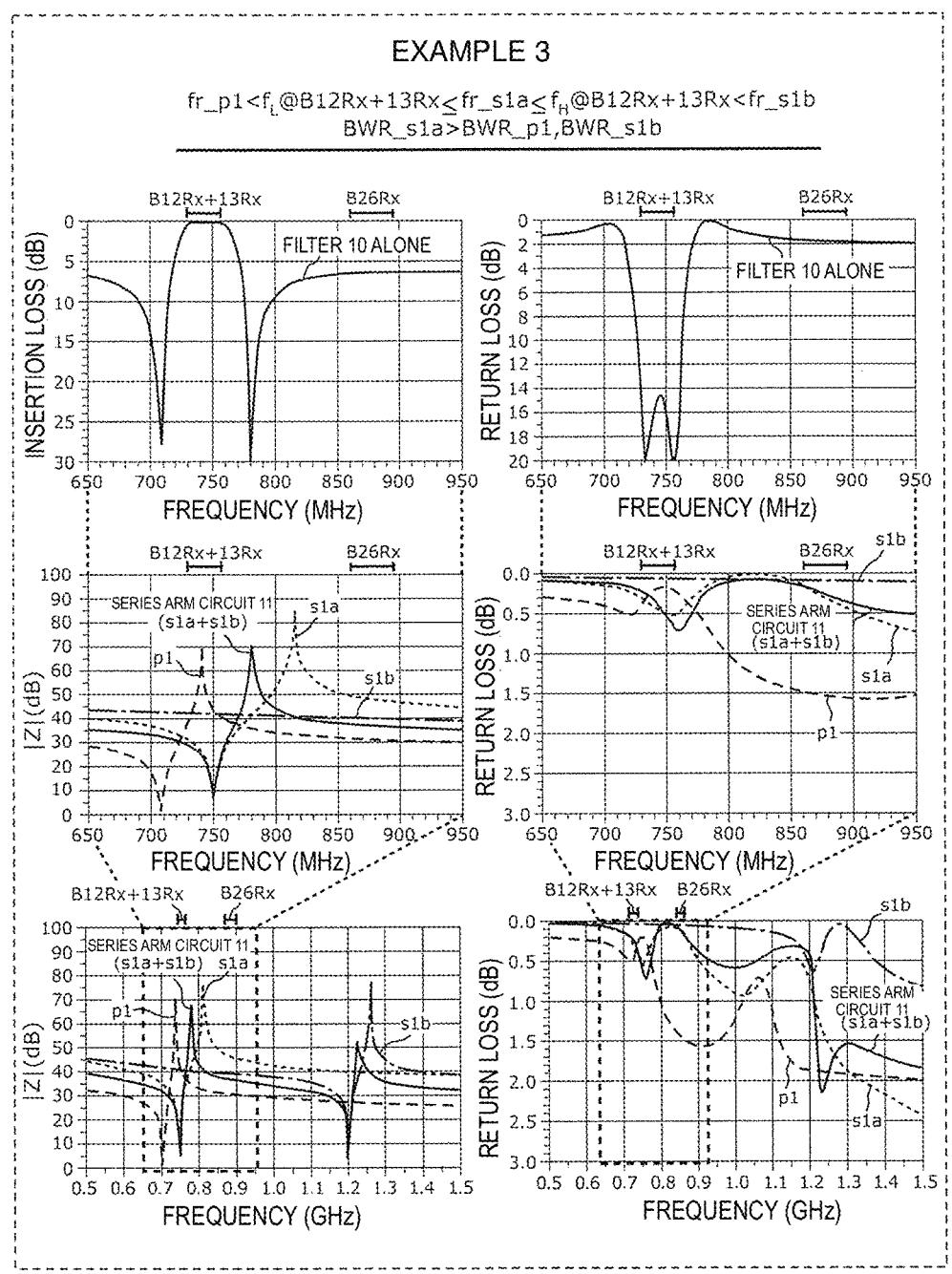
FIG. 4 includes graphs illustrating various characteristics relating to a filter (first filter) of Example 3.

FIG. 4 includes graphs illustrating various characteristics relating to a filter according to Example 3.

As illustrated in FIG. 4 and shown in Table 1, in Example 3, the third relationship is satisfied in addition to the above first relationship.

Figure 5:
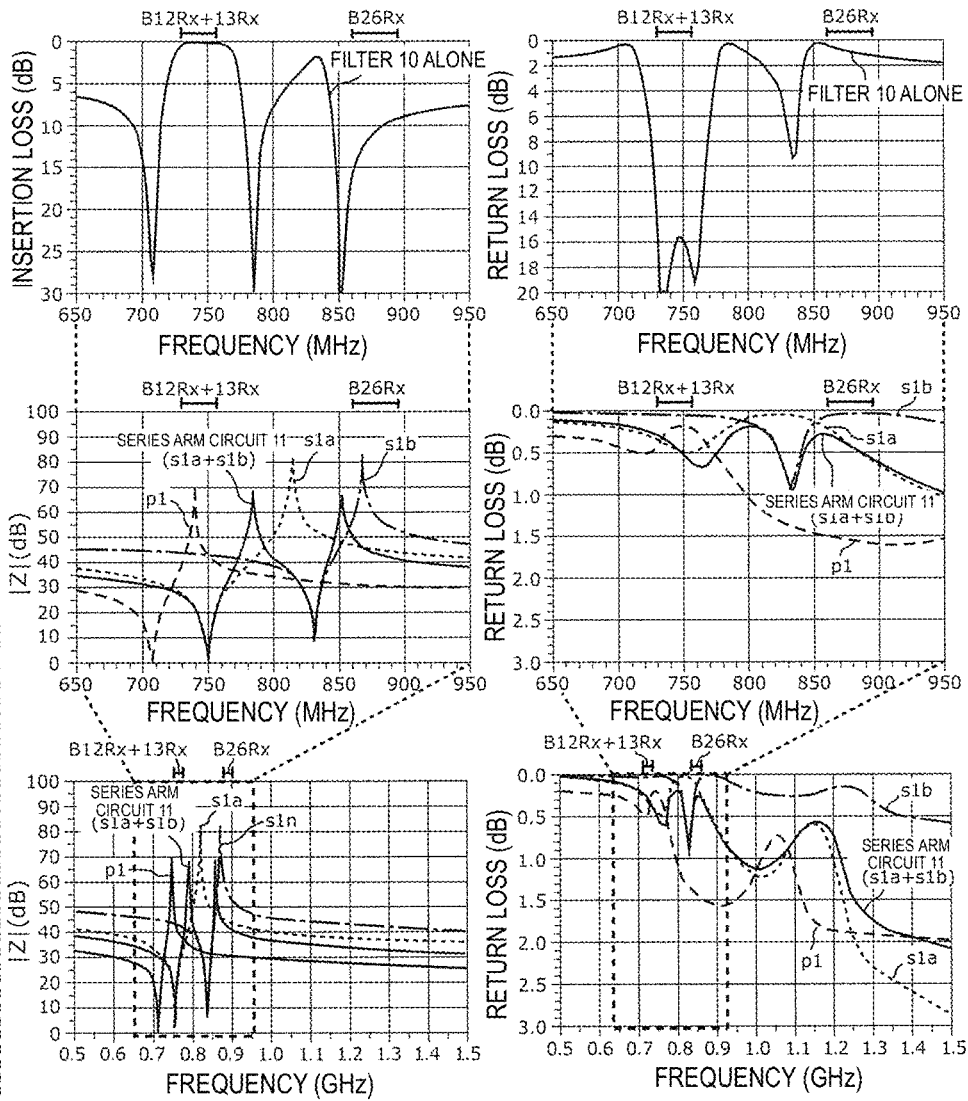
FIG. 5 includes graphs illustrating various characteristics relating to a filter (first filter) of Example 4.

FIG. 5 includes graphs illustrating various characteristics relating to a filter according to Example 4.

As illustrated in FIG. 5 and shown in Table 1, in Example 4, the third relationship is satisfied in addition to the above first and second relationships.

Although a return loss of the filter 10 is ideally zero in a frequency band on the high frequency side of the pass band, the return loss increases in the frequency band when a bulk wave loss becomes large. Therefore, when the filter 10 and the filter 20 having the higher pass band than the filter 10 defines a multiplexer, a loss in the pass band of the filter 20 in which the pass band is located in the frequency band is deteriorated in a case where the return loss in the frequency band of the filter 10 is large (the bulk wave loss is large).

As illustrated in FIG. 2 to FIG. 5, in Examples 1 to 4, since the series arm resonator s1*b* having the resonant frequency higher than the frequency at the high frequency end of the pass band of the filter 10 is provided, a return loss of the series arm circuit 11 is able to be reduced more than a return loss of the series arm resonator s1*a* alone in the frequency band corresponding to the pass band of the filter 20 (pass band of the second filter, here B26Rx). Thus, in the multiplexer 1, the loss in the pass band of the filter 20 having a higher pass band than the filter 10 is able to be reduced.

That is, in the series arm resonator s1*a* that is an acoustic wave resonator, a bulk wave loss caused by the series arm resonator s1*a* is generated on the high frequency side of the anti-resonant frequency, and a return loss increases. However, since the resonant frequency (fr_s1*a*) of the series arm resonator s1*a* is located within the pass band of the filter 10, the anti-resonant frequency (fa_s1*a*) is located outside the pass band of the filter 10, and specifically, is located on the higher frequency side with respect to the high frequency end of the pass band. Therefore, even when the bulk wave loss is generated, the characteristics in the pass band of the filter 10 is not affected. However, since the pass band of the filter 20 is located on the higher frequency side with respect to the pass band of the filter 10, when the filter 20 is applied to the multiplexer, the loss in the pass band due to influence of the bulk wave loss may be deteriorated.

In this regard, in the present preferred embodiment, since the series arm resonator S1*b* is electrically connected in parallel to the series arm resonator s1*a*, power of a radio frequency signal input to the filter 10 is distributed between the series arm resonator s1*a* and the series arm resonator s1*b*. Further, since the resonant frequency of the series arm resonator s1*b* is located on the higher frequency side with respect to the high frequency end of the pass band of the filter 10, the bulk wave loss caused by the series arm resonator s1*b* is generated at a higher frequency than the bulk wave loss caused by the series arm resonator s1*a*.

Therefore, the bulk wave loss in the frequency band corresponding to the pass band of the filter 20 when observed as the whole series arm circuit 11 including the series arm resonator s1*a* and the series arm resonator s1*b* is able to be reduced, so that the loss in the pass band of the filter 20 is able to be reduced. In other words, according to the present preferred embodiment, by reducing the bulk wave loss in the frequency band corresponding to the pass band of the filter 20 due to composite characteristics of the series arm resonator s1*a* and the series arm resonator s1*b*, it is possible to reduce the loss in the pass band of the filter 20 having the pass band higher than that of the filter 10 in the multiplexer 1.

Next, characteristics of filters according to Comparative Examples 1 and 2 will be described.

Figure 6:
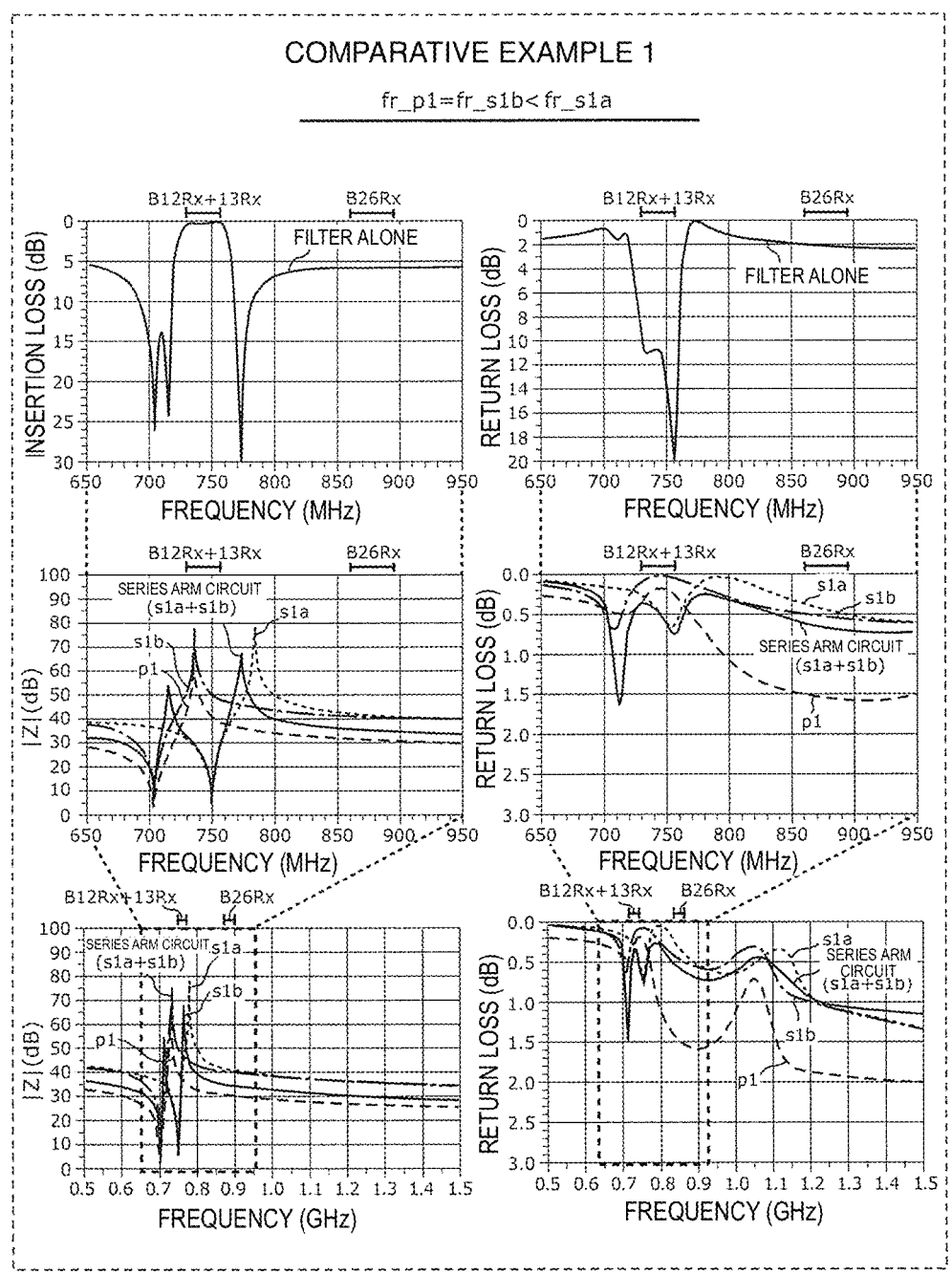
FIG. 6 includes graphs illustrating various characteristics relating to a filter (first filter) of Comparative Example 1.

FIG. 6 includes graphs illustrating various characteristics relating to a filter of Comparative Example 1.

As described above, in Comparative Example 1, the resonant frequency (fr_s1*b*) of the series arm resonator s1*b* is located on the lower frequency side with respect to the high frequency end of the pass band f$_H$@B12Rx+13Rx of the filter 10, and specifically, as illustrated in the figure and shown in Table 1, is equal to the resonant frequency (fr_p1) of the parallel arm resonator p1 (i.e., fr_p1=fr_s1*b*<fr_s1*a*).

Figure 7:
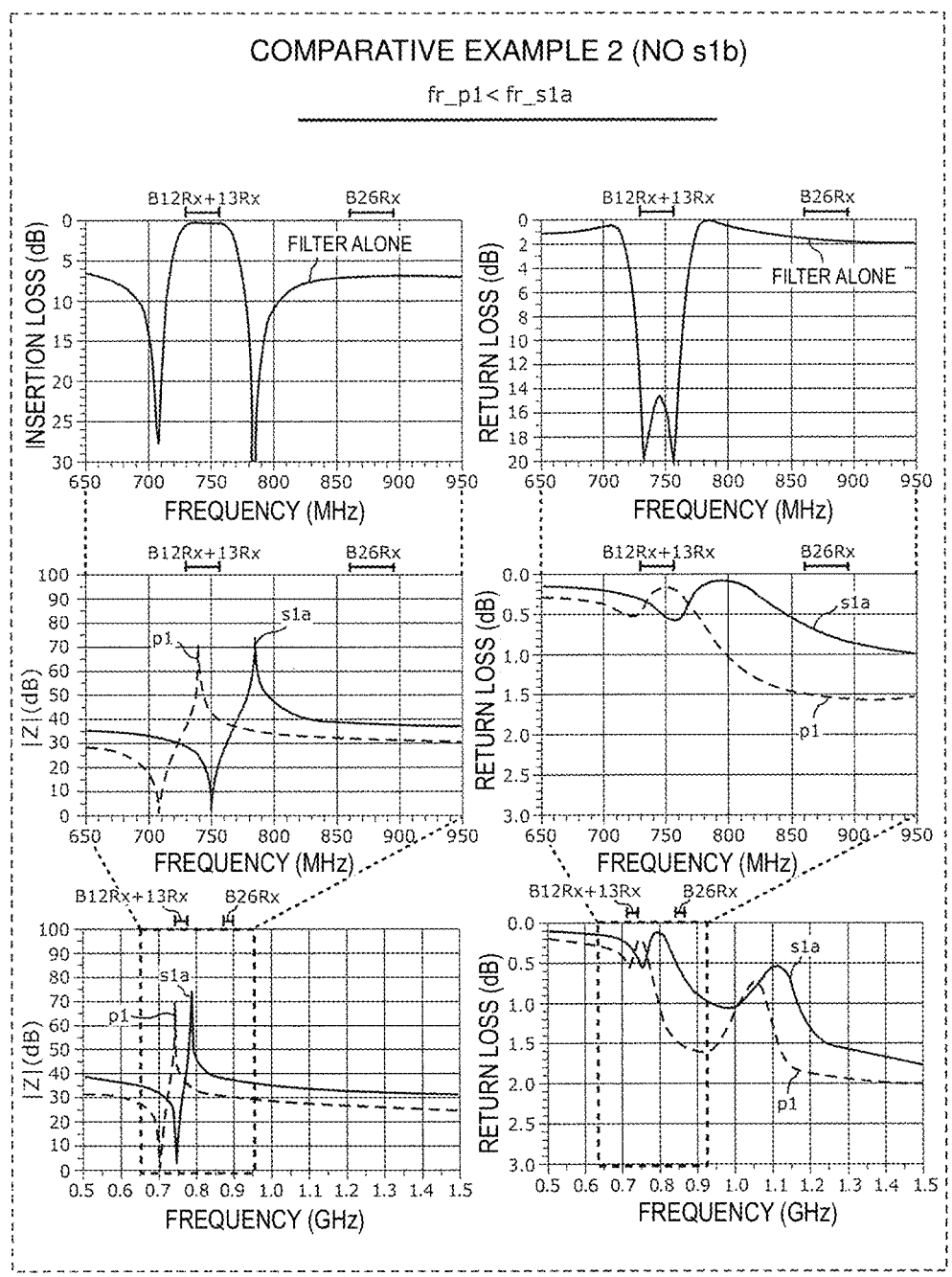
FIG. 7 includes graphs illustrating various characteristics relating to a filter (first filter) of Comparative Example 2.

FIG. 7 includes graphs illustrating various characteristics relating to a filter of Comparative Example 2.

As described above, in Comparative Example 2, the series arm resonator s1*b* that is electrically connected in parallel to the series arm resonator s1*a* is not provided.

Figure 8:
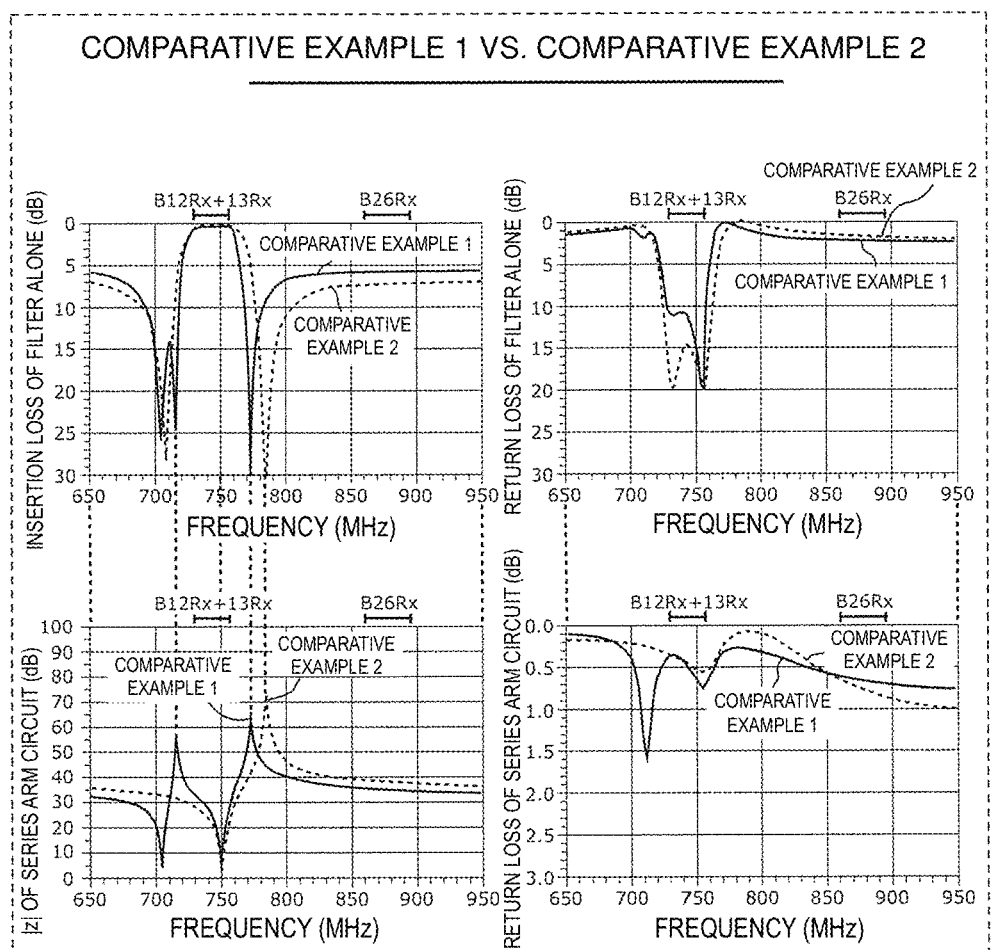
FIG. 8 includes graphs comparing various characteristics of the filters according to Comparative Example 1 and Comparative Example 2.

FIG. 8 includes graphs comparing various characteristics of the filters according to Comparative Example and Comparative Example 2. Specifically, filter characteristics (transmission characteristics) are illustrated in the upper portion in the left column of the figure, and impedance characteristics of the series arm circuit are illustrated in the lower part. Reflection characteristics are illustrated in the right column of the figure, reflection characteristics of the filter alone are illustrated in the upper part, and reflection characteristics of the series arm circuit are illustrated in the lower part. This is the same as in the following FIG. 9 to FIG. 12.

As illustrated in FIG. 6 and FIG. 7, in both of Comparative Examples 1 and 2, a bulk wave loss larger than the bulk wave loss caused by the series arm resonator s1*a* is generated in the frequency band corresponding to the pass band (B26Rx) of the filter 20.

Specifically, in Comparative Example 2, since the series arm resonator s1*b* is not provided, reflection characteristics of the series arm circuit is equal or substantially equal to reflection characteristics of the series arm resonator s1*a* alone. That is, a radio frequency signal input to the filter (first filter) is supplied to the series arm resonator s1a without being subjected to power distribution. Therefore, the bulk wave loss generated by the series arm resonator s1a cannot be reduced or prevented, and the return loss in the frequency band corresponding to the pass band (B26Rx) of the filter 20 is large.

In addition, in Comparative Example 1, it seems to be possible to reduce the bulk wave loss in the frequency band corresponding to the pass band of the filter 20 due to the power distribution between the series arm resonator s1a and the series arm resonator s1b.

However, as illustrated in FIG. 8, in Comparative Example 1, since the series arm resonator s1b having a resonant frequency lower than the resonant frequency of the series arm resonator s1a is provided, bulk wave losses are generated in both the series arm resonator s1a and the series arm resonator s1b in the frequency band on the high frequency side of the pass band of the filter 10. Therefore, the return loss in the frequency band corresponding to the pass band (B26Rx) of the filter 20 is deteriorated.

As described above, as illustrated in FIG. 8, the return loss in the frequency band corresponding to the pass band of the filter 20 is reduced in Comparative Example 2 compared to Comparative Example 1 (2.3 dB in Comparative Example 1 and 1.9 dB in Comparative Example 2). That is, from a viewpoint of reducing the loss in the pass band of the filter 20, Comparative Example 2 is superior to Comparative Example 1. For this reason, effects derived from Examples 1 to 4 will be described in comparison with Comparative Example 2.

Figure 9:
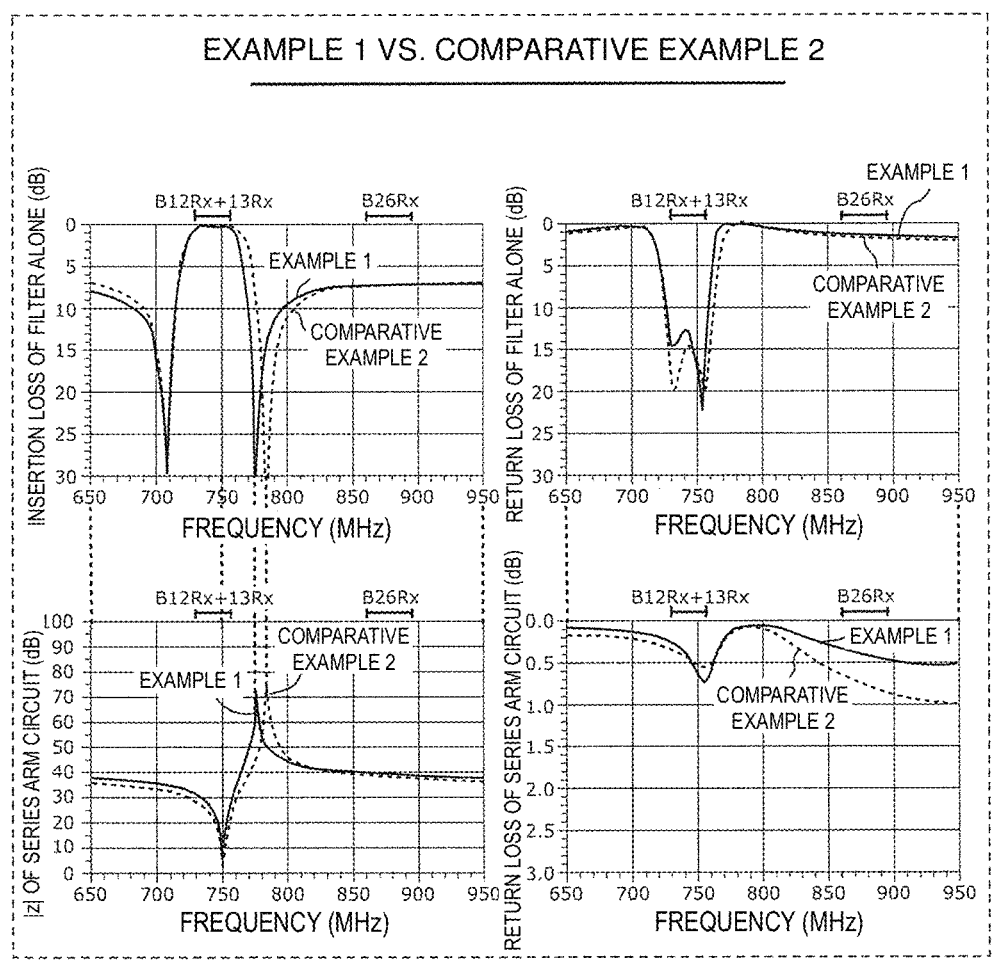
FIG. 9 includes graphs comparing various characteristics of the filters according to Example 1 and Comparative Example 2.

FIG. 9 includes graphs comparing various characteristics of the filters according to Example 1 and Comparative Example 2.

As illustrated in the lower portion in the left column of the figure, in Example 1, the series arm resonator s1b is electrically connected in parallel to the series arm resonator s1a, so that the band width ratio of the series arm circuit is narrower than that in the Comparative Example 2. Therefore, as illustrated in the upper portion in the left column of the figure, in Example 1, steepness of an attenuation slope on the high frequency side of the pass band is improved as compared with Comparative Example 2.

Further, as described above, in the pass band (B26Rx) of the filter 20, the bulk wave loss is generated in the series arm resonator s1a, but in the series arm resonator s1b, the bulk wave loss is hardly generated. Therefore, as illustrated in the lower portion in the right column of the figure, in Example 1 in which the input radio frequency signal is subjected to power distribution between the series arm resonator s1a and the series arm resonator s1b, a bulk wave loss caused by the series arm circuit 11 is able to be reduced in the pass band of the filter as compared to the Comparative Example 2 without being subjected to power distribution. As a result, as illustrated in the upper portion in right column of the figure, in Example 1, the return loss of the filter 10 in the frequency band corresponding to the pass band (B26Rx) of the filter 20 is able to be reduced as compared to the Comparative Example 2 (about 1.5 dB in Example 1 and about 1.9 dB in Comparative Example 2).

Figure 10:
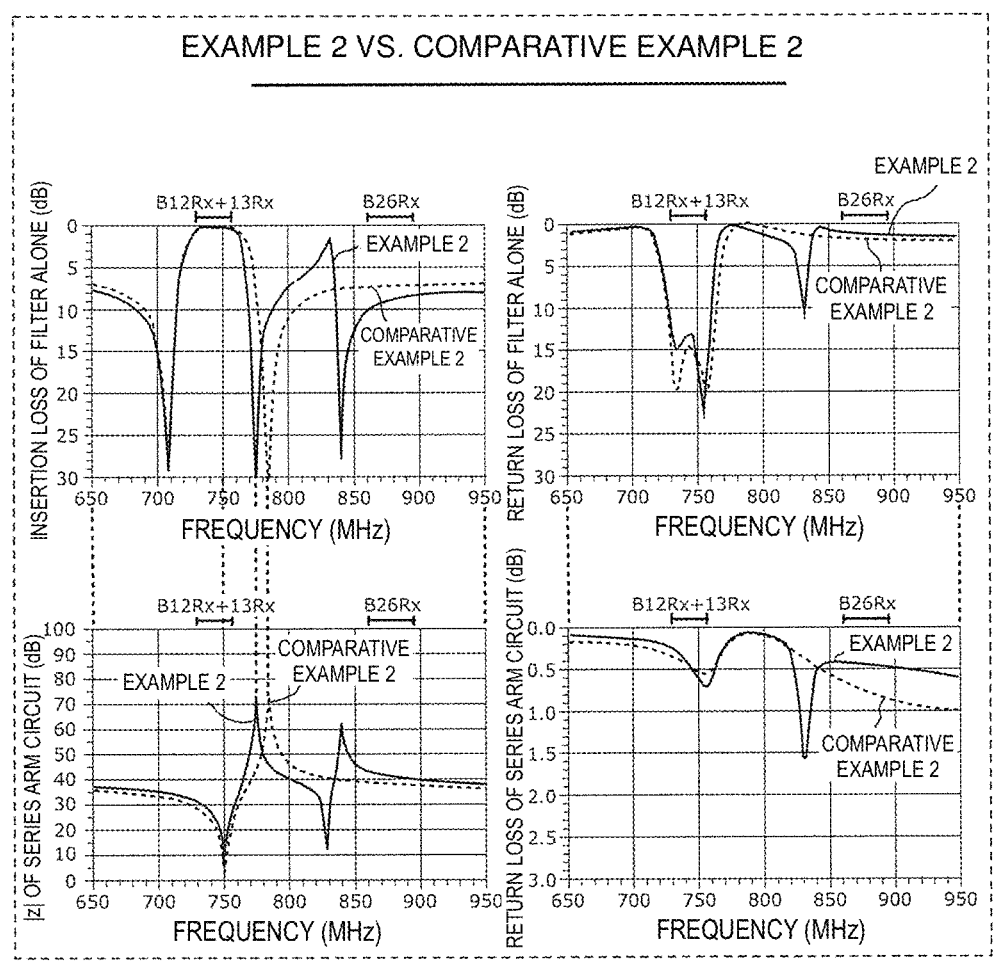
FIG. 10 includes graphs comparing various characteristics of the filters according to Example 2 and Comparative Example 2.

FIG. 10 includes graphs comparing various characteristics of the filters according to Example 2 and Comparative Example 2.

As illustrated in the lower portion in the left column and the upper portion in the left column of the figure, in Example 2, the series arm resonator s1b is electrically connected in parallel to the series arm resonator s1a in the same manner as that in Example 1, so that the return loss of the filter 10 in the frequency band corresponding to the pass band (B26Rx) of the filter 20 is able to be reduced as illustrated in the upper portion in the right column of the figure.

Here, in Example 2, the resonant frequency of the series arm resonator s1b is lower than the frequency at the low frequency end of the pass band of the second filter, as compared to Example 1. In this regard, an electrostatic capacity of an acoustic wave resonator has frequency characteristics, and specifically, capacitance characteristics of a high impedance in the vicinity of the high frequency side of an anti-resonant frequency. As a result, in Example 2, an electrostatic capacity of the series arm resonator s1b is able to be made smaller in the pass band (B26Rx) of the filter 20 than that in Example 1, so that the impedance of the filter 10 observed from the common terminal 110c is able to be increased. Accordingly, the return loss of the filter 10 in the frequency band corresponding to the pass band (B26Rx) of the filter 20 is able to be further reduced (about 1.3 dB in Example 2, and about 1.5 dB in Example 1).

That is, according to Example 2, since the impedance of the series arm resonator s1b is able to be increased in the pass band of the filter 20, the impedance of the filter 10 observed from the common terminal 110c is able to be increased. Therefore, when the filter 10 is observed from the common terminal 110c, the loss in the pass band of the filter 20 is able to be reduced by reducing the bulk wave loss in the frequency band corresponding to the pass band of the filter 20.

Figure 11:
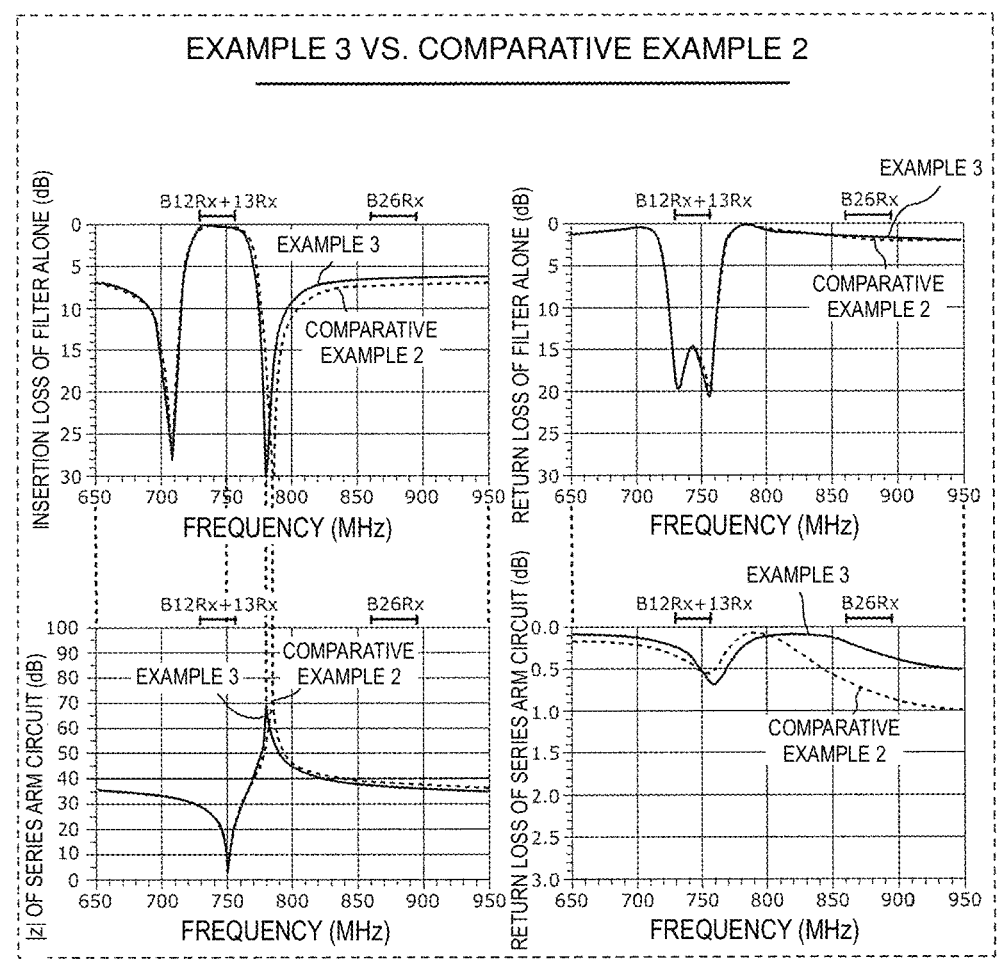
FIG. 11 includes graphs comparing various characteristics of the filters according to Example 3 and Comparative Example 2.

FIG. 11 includes graphs comparing various characteristics of the filters according to Example 3 and Comparative Example 2.

In Example 3, by using an acoustic wave resonator having a wide band width ratio as the series arm resonator s1a, as illustrated in the lower portion in the left column of the figure, the band width ratio of the series arm circuit 11 exhibiting composite characteristics with the series arm resonator s1b becomes narrower than that of Example 1, and becomes equal or approximately equal to the band width ratio of the Comparative Example 2. Therefore, as illustrated in the upper portion in the left column of the figure, in Example 3, the steepness of the attenuation slope on the high frequency side of the pass band is about the same as that in Comparative Example 2. In Example 3, the return loss of the filter 10 in the frequency band corresponding to the pass band (B26Rx) of the filter 20 is able to be reduced, compared with Comparative Example 2, as illustrated in the upper portion in the right column of the figure, by the similar action as that in Example (about 1.8 dB in Example 3 and about 1.9 dB in Comparative Example 2).

Figure 12:
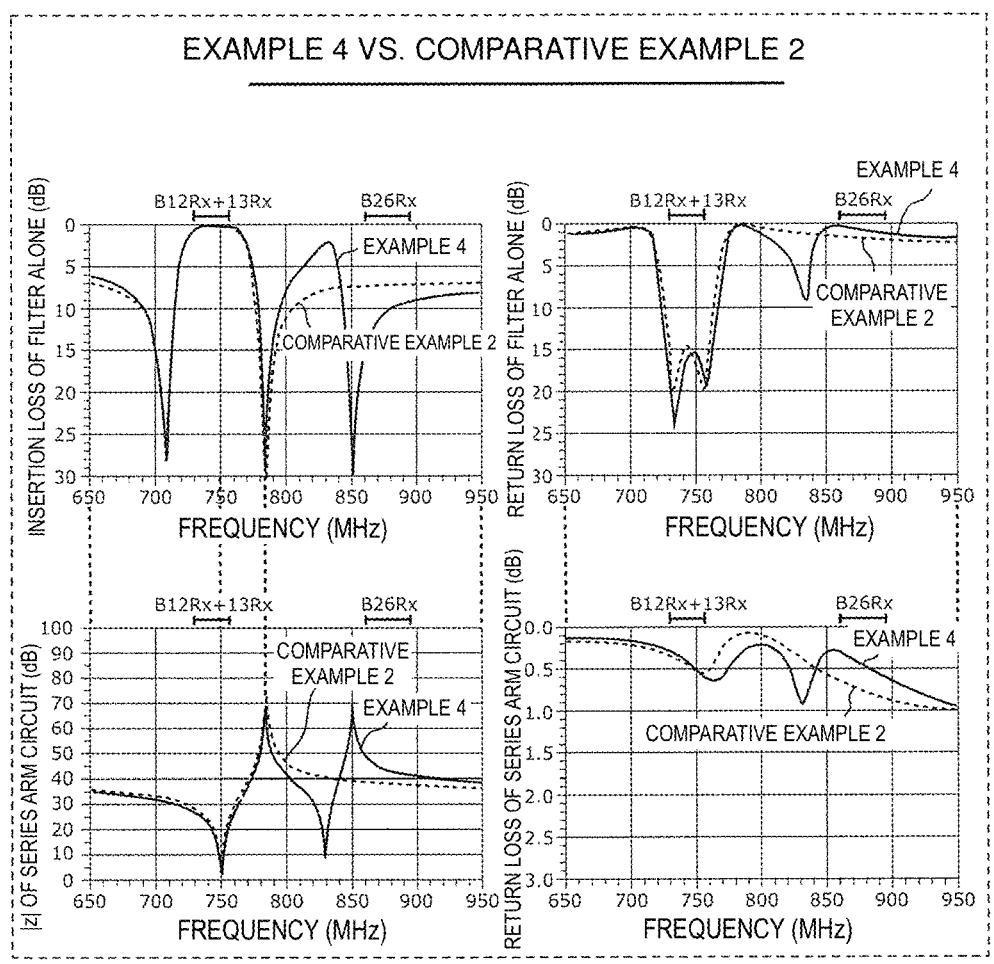
FIG. 12 includes graphs comparing various characteristics of the filters according to Example 4 and Comparative Example 2.

FIG. 12 includes graphs comparing various characteristics of the filters according to Example 4 and Comparative Example 2.

In Example 4, by using an acoustic wave resonator having a wide band width ratio as the series arm resonator s1a, similarly to Example 3, the band width ratio of the series arm circuit 11 exhibiting the composite characteristics with the series arm resonator s1b becomes narrow, and becomes the same or approximately the same as the band width ratio of Comparative Example 2. Therefore, as illustrated in the upper portion in the left column of the figure, in Example 4, the steepness of the attenuation slope on the high frequency side of the pass band is the same or about the same as that in Comparative Example 2. In Example 4, the return loss of the filter 10 in the frequency band corresponding to the pass band (B26Rx) of the filter 20 is able to be reduced, compared with Example 2, as illustrated in the upper portion in the right column of the figure by the similar action as that in Example 1 (about 1.2 dB in Example 4 and about 1.9 dB in Comparative Example 2).

Here, in Example 4, the resonant frequency of the series arm resonator s1b is lower than the frequency at the low frequency end of the pass band of the filter 20, as compared to the Example 3. Therefore, in Example 4, the return loss of the filter 10 in the frequency band corresponding to the passband (B26Rx) of the filter 20 is able to be further reduced by the similar action as that in Example 2 (about 1.2 dB in Example 4 and about 1.8 dB in Example 3), compared to Example 3.

In Examples 3 and 4, as compared with Examples 1 and 2 in which an acoustic wave resonator having a wide band width ratio is used as the series arm resonator s1a, the band width ratio of the series arm circuit 11 is made to be narrower by the composite characteristics with the series arm resonator s1b. With this configuration, in Examples 3 and 4, the impedance of the series arm resonator S1b is able to be made to be lower than those of Examples 1 and 2. Therefore, in the series arm circuit 11, power distribution to the series arm resonator s1b in which the bulk wave loss in the frequency band corresponding to the pass band (B26Rx) of the filter 20 is unlikely to occur is able to be increased, so that the return loss in the frequency band corresponding to the pass band (B26Rx) of the filter 20 when observed as the whole series arm circuit 11 is able to be reduced. Therefore, the loss in the pass band of the filter 20 is able to be reduced.

In summary, according to Examples 1 to 4, since the series arm resonator s1b having the resonant frequency higher than the frequency at the high frequency end of the pass band of the filter 10 is provided, as compared to the Comparative Examples 1 and 2, the return loss is able to be reduced in the frequency band corresponding to the pass band of the filter 20. Further, when the resonant frequency of the series arm resonator s1b is higher than the frequency at the high frequency end of the pass band of the filter 10, and is lower than the pass band of the filter 20, the return loss in the frequency band corresponding to the pass band of the filter 20 is able to be further reduced. Furthermore, when the band width ratio of the series arm resonator s1a is wider than the band width ratio of the parallel arm circuit 12, the return loss in the frequency band corresponding to the pass band of the filter 20 is able to be further reduced.

The return losses in the frequency band corresponding to the pass band of the filter 20 in Examples 1 to 4 and Comparative Examples 1 and 2 are has follows.

Example 1 about 1.5 dB
Example 2 about 1.3 dB
Example 3 about 1.8 dB
Example 4 about 1.2 dB
Comparative Example 1 about 2.3 dB
Comparative Example 2 about 1.9 dB Modification So far, for the sake of simplicity, a ladder filter circuit defined by one series arm circuit 11 and one parallel arm circuit 12 is described as an example of a filter corresponding to B12Rx+13Rx. However, a configuration of the filter may be appropriately adjusted according to the required transmission characteristics and attenuation characteristics, and the like, and is not limited to the above configuration.

Figure 13:
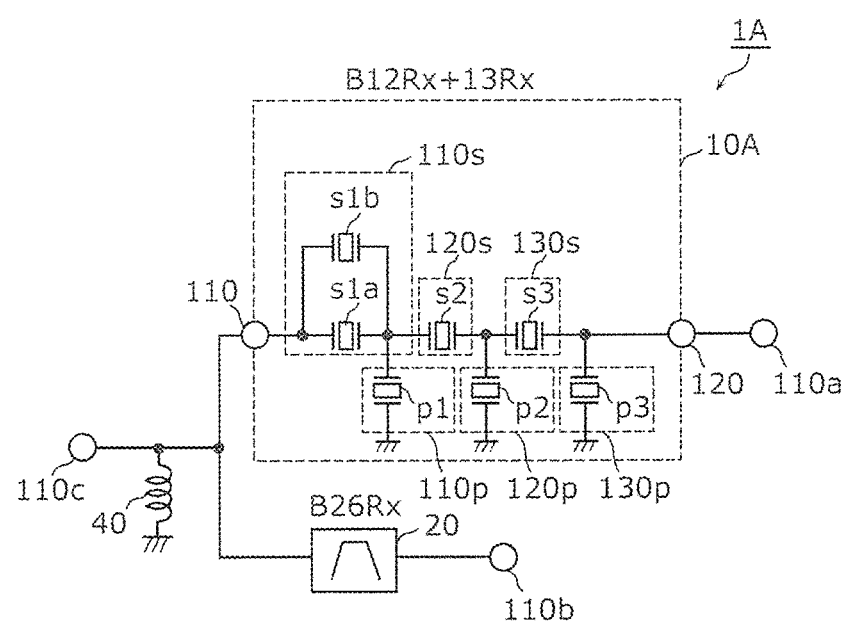
FIG. 13 is a circuit block diagram of a multiplexer according to a modification of Preferred Embodiment 1 of the present invention.

FIG. 13 is a circuit block diagram of a multiplexer 1A according to a modification of Preferred Embodiment 1. Note that in the figure, a circuit configuration of the filter 10A is also illustrated.

As illustrated in FIG. 13, the filter 10A is an example of a specific circuit configuration of the filter 10. As illustrated in the figure, the filter 10A preferably includes three series arm circuits 110s, 120s, and 130s provided on a series arm connecting the input/output terminal 110 and the input/output terminal 120, and three parallel arm circuits 110p, 120p, and 130p. Here, the series arm circuit 110s corresponds to the series arm circuit 11 of the above-described filter 10. That is, the filter 10A is provided with other series arm circuits (series arm circuits 120s and 130s) including acoustic wave resonators provided on a path connecting the input/output terminal 110 and the input/output terminal 120, in addition to the filter 10. The parallel arm circuit 110p corresponds to the parallel arm circuit 12 of the above-described filter 10. In addition, each of the two series arm circuits 120s and 130s is configured with only one series arm resonator s2 or s3, respectively, and each of the two parallel arm circuits 120p and 130p is configured with only one parallel arm resonator p2 or p3, respectively.

The series arm circuit 110s is electrically connected to the input/output terminal 110 without other series arm circuits (the series arm circuits 120s and 130s) interposed therebetween, and the input/output terminal 110 is electrically connected to the common terminal 110c without an acoustic wave resonator interposed therebetween.

Further, in the multiplexer 1A, a matching inductor 40 for impedance matching is preferably provided, but may not be necessary.

Next, characteristics of the filter 10A according to the present modification will be described in comparison with the comparative examples (Comparative Examples 3 and 4) by using the examples (Examples 5 to 8). Examples 5 to 8 have the configurations and characteristics described in Example 1 to 4, respectively, and Comparative Examples 3 and 4 have the configurations and characteristics described in Comparative Examples 1 and 2, respectively. In Comparative Example 4, the series arm resonator s1b is not provided in the same manner as that in Comparative Example 2.

Circuit constants of the filters according to Examples 5 to 8 and Comparative Examples 3 and 4 (first filters) are shown in Table 2.

TABLE 2

|  |  |  | Resonant Frequency fr (MHz) | Anti-Resonant Frequency fa (MHz) | Band Width Ratio BWR (%) | Capacitance Value (pF) |
| --- | --- | --- | --- | --- | --- | --- |
| Example 5 | Series Arm Circuit 110 s | Series Arm Resonator s1a | 743.3 | 775.6 | 4.35 | 1.82 |
|  |  | Series Arm Resonator s1b | 1200.0 | 1254.0 | 4.50 | 0.68 |

TABLE 2-continued

| | | | Resonant Frequency fr (MHz) | Anti-Resonant Frequency fa (MHz) | Band Width Ratio BWR (%) | Capacitance Value (pF) |
|---|---|---|---|---|---|---|
| | Series Arm Circuit 120 s | Series Arm Resonator s2 | 753.1 | 785.1 | 4.24 | 2.63 |
| | Series Arm Circuit 130 s | Series Arm Resonator s3 | 740.6 | 773.0 | 4.38 | 1.81 |
| | Parallel Arm Circuit 110 p | Parallel Arm Resonator p1 | 717.2 | 750.5 | 4.64 | 4.21 |
| | Parallel Arm Circuit 120 p | Parallel Arm Resonator p2 | 705.5 | 739.3 | 4.78 | 9.24 |
| | Parallel Arm Circuit 130 p | Parallel Arm Resonator p3 | 711.0 | 744.5 | 4.72 | 7.00 |
| Example 6 | Series Arm Circuit 110 s | Series Arm Resonator s1a | 742.9 | 775.2 | 4.35 | 2.12 |
| | | Series Arm Resonator s1b | 830.7 | 868.1 | 4.50 | 0.57 |
| | Series Arm Circuit 120 s | Series Arm Resonator s2 | 751.9 | 783.9 | 4.26 | 1.89 |
| | Series Arm Circuit 130 s | Series Arm Resonator s3 | 737.1 | 769.7 | 4.42 | 2.87 |
| | Parallel Arm Circuit 110 p | Parallel Arm Resonator p1 | 716.4 | 749.7 | 4.65 | 5.14 |
| | Parallel Arm Circuit 120 p | Parallel Arm Resonator p2 | 706.8 | 740.5 | 4.77 | 9.78 |
| | Parallel Arm Circuit 130 p | Parallel Arm Resonator p3 | 708.4 | 742.0 | 4.75 | 7.76 |
| Example 7 | Series Arm Circuit 110 s | Series Arm Resonator s1a | 743.5 | 808.1 | 8.69 | 0.86 |
| | | Series Arm Resonator s1b | 1200.0 | 1254.0 | 4.50 | 1.29 |
| | Series Arm Circuit 120 s | Series Arm Resonator s2 | 753.9 | 785.8 | 4.24 | 2.61 |
| | Series Arm Circuit 130 s | Series Arm Resonator s3 | 740.8 | 773.2 | 4.38 | 1.78 |
| | Parallel Arm Circuit 110 p | Parallel Arm Resonator p1 | 715.1 | 748.5 | 4.67 | 5.54 |
| | Parallel Arm Circuit 120 p | Parallel Arm Resonator p2 | 705.9 | 739.6 | 4.78 | 7.85 |
| | Parallel Arm Circuit 130 p | Parallel Arm Resonator p3 | 711.6 | 745.1 | 4.71 | 6.20 |
| Example 8 | Series Arm Circuit 110 s | Series Arm Resonator s1a | 740.8 | 805.6 | 8.75 | 1.20 |
| | | Series Arm Resonator s1b | 827.3 | 864.5 | 4.50 | 1.08 |
| | Series Arm Circuit 120 s | Series Arm Resonator s2 | 753.0 | 785.0 | 4.25 | 1.86 |
| | Series Arm Circuit 130 s | Series Arm Resonator s3 | 737.0 | 769.6 | 4.42 | 2.85 |
| | Parallel Arm Circuit 110 p | Parallel Arm Resonator p1 | 714.2 | 747.6 | 4.68 | 7.00 |
| | Parallel Arm Circuit 120 p | Parallel Arm Resonator p2 | 708.5 | 742.1 | 4.75 | 8.58 |
| | Parallel Arm Circuit 130 p | Parallel Arm Resonator p3 | 709.0 | 742.6 | 4.74 | 5.88 |
| Comparative Example 3 | Series Arm Circuit 110 s | Series Arm Resonator s1a | 739.9 | 772.4 | 4.39 | 2.07 |
| | | Series Arm Resonator s1b | 714.3 | 747.7 | 4.68 | 0.75 |
| | Series Arm Circuit 120 s | Series Arm Resonator s2 | 751.3 | 783.3 | 4.26 | 1.67 |
| | Series Arm Circuit 130 s | Series Arm Resonator s3 | 733.5 | 766.2 | 4.46 | 4.12 |
| | Parallel Arm Circuit 110 p | Parallel Arm Resonator p1 | 714.3 | 747.7 | 4.68 | 6.65 |
| | Parallel Arm Circuit 120 p | Parallel Arm Resonator p2 | 700.9 | 734.8 | 4.84 | 6.74 |
| | Parallel Arm Circuit 130 p | Parallel Arm Resonator p3 | 711.5 | 745.0 | 4.71 | 7.72 |
| Comparative Example 4 | Series Arm Circuit 110 s | Series Arm Resonator s1a | 736.7 | 769.3 | 4.42 | 2.78 |
| | Series Arm Circuit 120 s | Series Arm Resonator s2 | 741.4 | 773.8 | 4.37 | 3.73 |
| | Series Arm Circuit 130 s | Series Arm Resonator s3 | 740.4 | 772.8 | 4.38 | 1.71 |
| | Parallel Arm Circuit 110 p | Parallel Arm Resonator p1 | 715.1 | 748.5 | 4.67 | 5.28 |

TABLE 2-continued

|  |  | Resonant Frequency fr (MHz) | Anti-Resonant Frequency fa (MHz) | Band Width Ratio BWR (%) | Capacitance Value (pF) |
|---|---|---|---|---|---|
| Parallel Arm Circuit 120 p | Parallel Arm Resonator p2 | 700.5 | 734.4 | 4.85 | 7.29 |
| Parallel Arm Circuit 130 p | Parallel Arm Resonator p3 | 712.4 | 745.9 | 4.70 | 7.24 |

Figure 14:
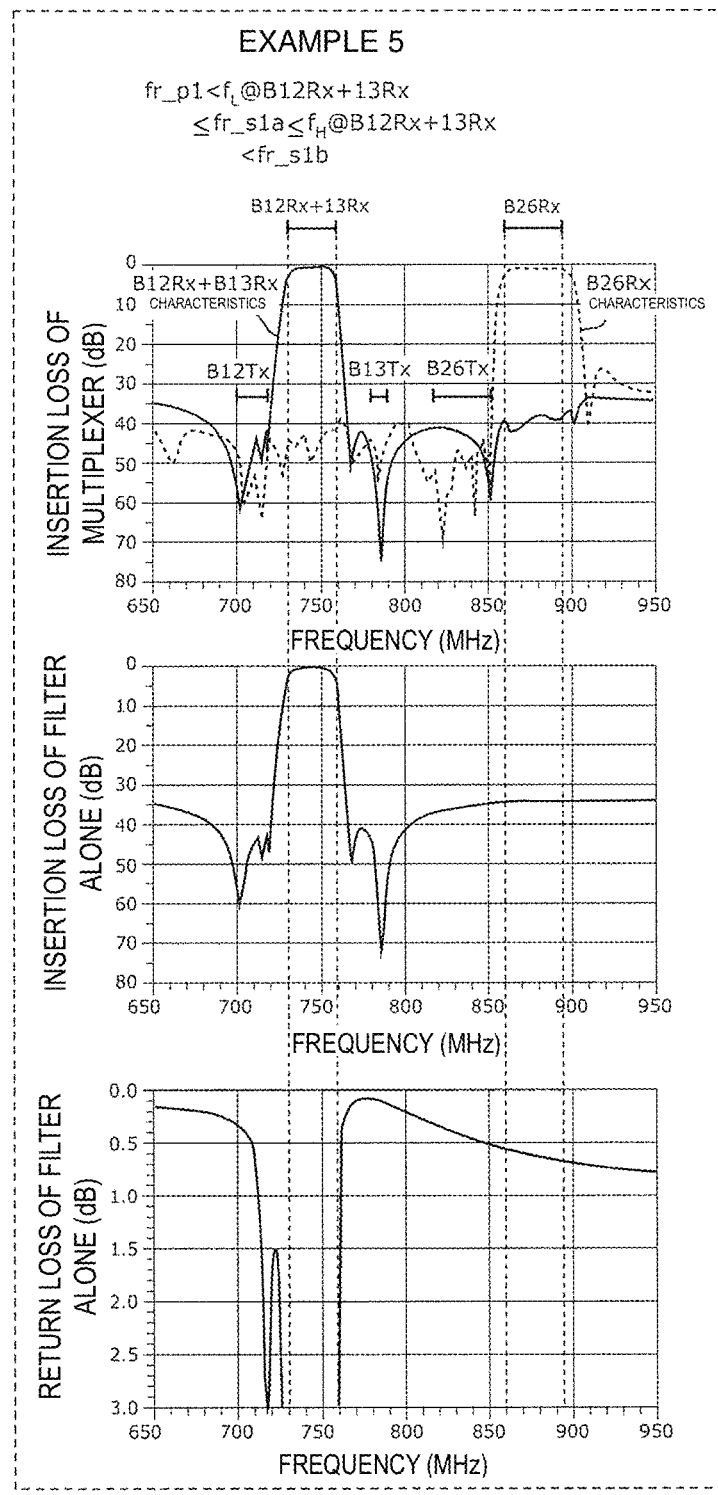
FIG. 14 includes graphs illustrating various characteristics relating to a multiplexer of Example 5.
Figure 15:
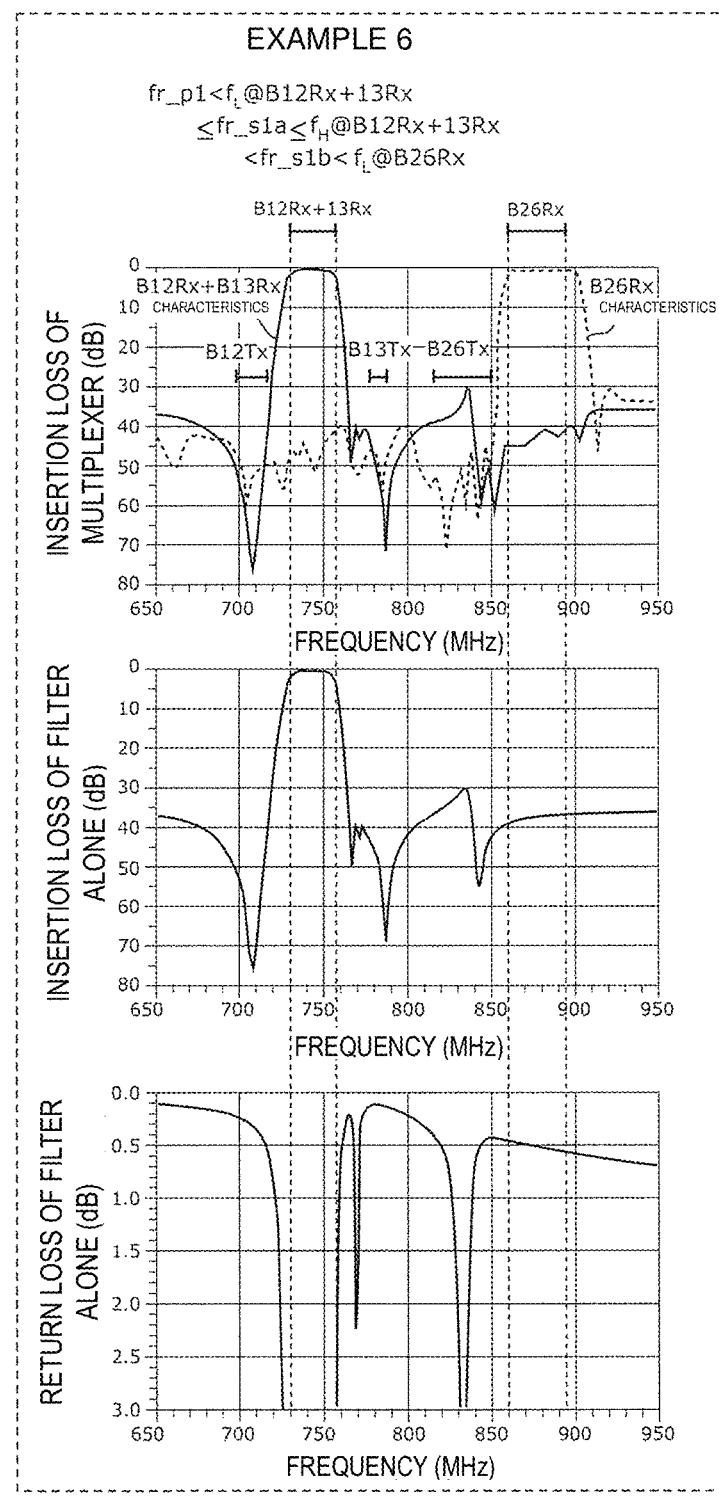
FIG. 15 includes graphs illustrating various characteristics relating to a multiplexer of Example 6.
Figure 16:
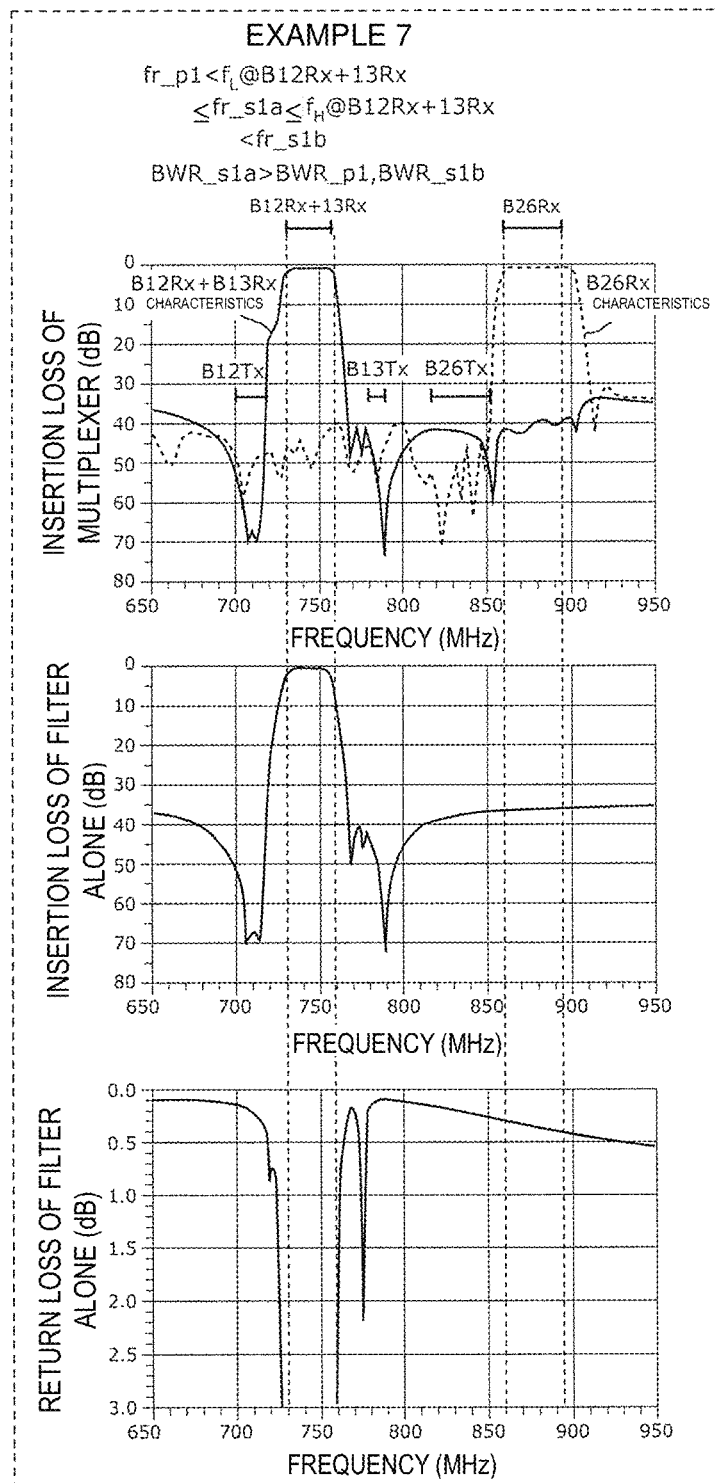
FIG. 16 includes graphs illustrating various characteristics relating to a multiplexer of Example 7.
Figure 17:
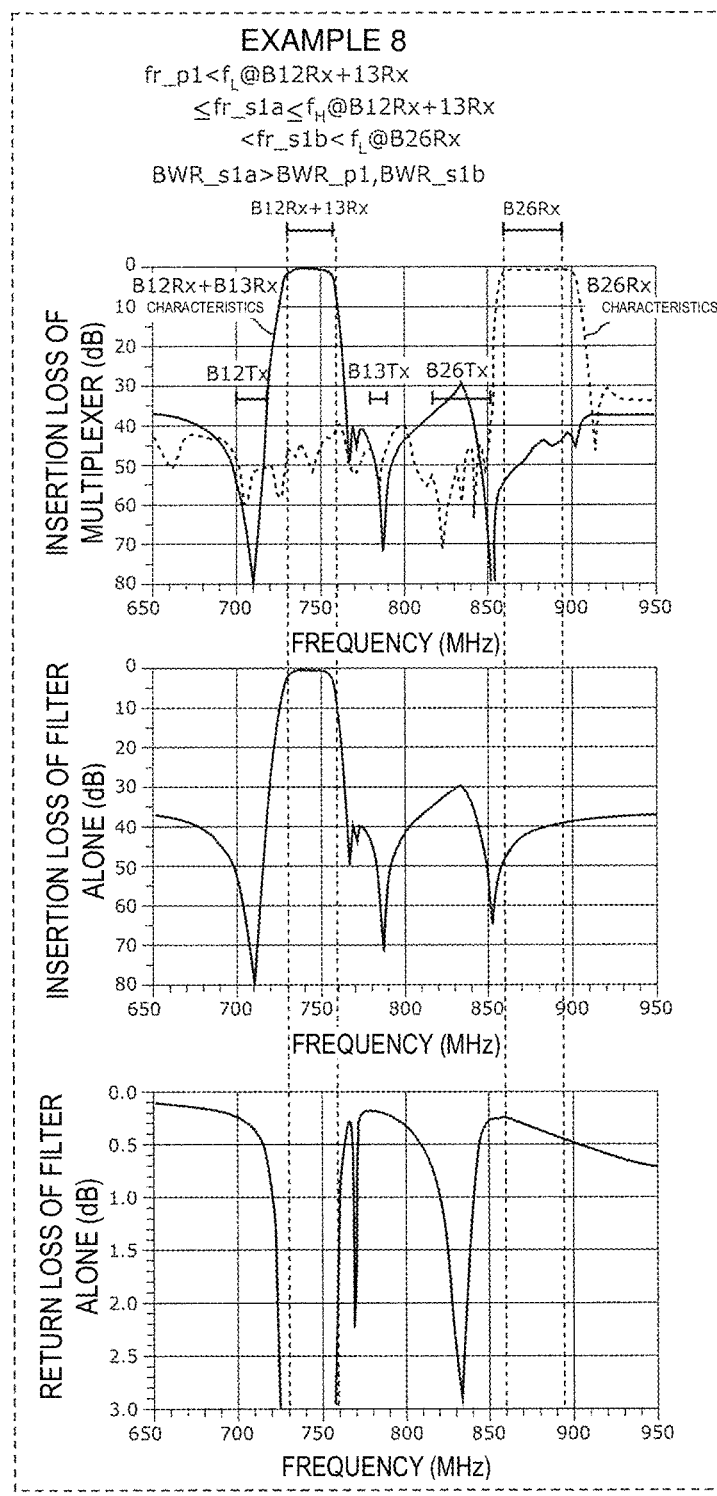
FIG. 17 includes graphs illustrating various characteristics relating to a multiplexer of Example 8.

FIG. 14 includes graphs illustrating various characteristics relating to a multiplexer of Example 5. FIG. 15 includes graphs illustrating various characteristics relating to a multiplexer of Example 6. FIG. 16 includes graphs illustrating various characteristics relating to a multiplexer of Example 7. FIG. 17 includes graphs illustrating various characteristics relating to a multiplexer of Example 8. Specifically, in these figures, transmission characteristics of the multiplexer, filter characteristics (transmission characteristics) of the filter alone corresponding to B12Rx+13Rx, and reflection characteristics of the filter alone are illustrated in order from the top.

Note that the transmission characteristics of the multiplexer include transmission characteristics (hereinafter described as "B12Rx+13Rx characteristics") of a path provided with a filter corresponding to B12Rx+13Rx and transmissions characteristics (hereinafter described as "B26Rx characteristics") of a path provided with a filter corresponding to B26Rx.

For the multiplexers according to Examples 5 to 8 and Comparative Examples 3 and 4, losses in the pass band (I. Loss: Insertion Loss) and attenuations in the attenuation band (Att.: Attenuation) in the B12Rx+13Rx characteristics are shown in Table 3. Further, for the multiplexers according to Examples 5 to 8 and Comparative Example 3 and 4, losses in the pass band and attenuations in the attenuation band (Att.: Attenuation) in the B26Rx characteristics are shown in Table 4. Further, for the multiplexers according to Examples 5 to 8 and Comparative Examples 3 and 4, return losses (R. Loss: Return Loss) in the B26Rx band in filter alone characteristics corresponding to B12Rx+13Rx are shown in Table 5.

TABLE 3

|  | I. Loss (dB) | | Att. (dB) | |
|---|---|---|---|---|
|  | B12Rx | B13Rx | B12Tx | B13Tx |
| Example 5 | 2.50 | 2.38 | 43.51 | 45.07 |
| Example 6 | 2.04 | 2.27 | 42.84 | 44.42 |
| Example 7 | 2.00 | 2.03 | 47.93 | 42.88 |
| Example 8 | 2.01 | 2.02 | 45.87 | 43.86 |
| Comparative Example 3 | 2.01 | 2.04 | 48.16 | 42.79 |
| Comparative Example 4 | 2.01 | 2.03 | 42.94 | 42.98 |

TABLE 4

|  | I. Loss (dB) B26Rx | Att. (dB) B26Tx |
|---|---|---|
| Example 5 | 2.25 | 43.91 |
| Example 6 | 2.26 | 44.24 |
| Example 7 | 1.98 | 44.59 |

TABLE 4-continued

|  | I. Loss (dB) B26Rx | Att. (dB) B26Tx |
|---|---|---|
| Example 8 | 1.92 | 45.02 |
| Comparative Example 3 | 1.84 | 53.09 |
| Comparative Example 4 | 1.80 | 52.29 |

TABLE 5

|  | R. Loss (dB) B26Rx |
|---|---|
| Example 5 | 0.68 |
| Example 6 | 0.79 |
| Example 7 | 0.49 |
| Example 8 | 0.57 |
| Comparative Example 3 | 0.42 |
| Comparative Example 4 | 0.45 |

As shown in these tables, in any of Examples 5 to 8, the return loss in the frequency band of B26Rx is reduced in the filter alone characteristics corresponding to B12Rx+13Rx in comparison with Comparative Example 3 and 4. That is, since Examples 5 to 8 have the configurations of Examples 1 to 4, respectively, the same advantageous effects as those of Examples 1 to 4 are achieved.

Specifically, in Examples 5 to 8, the series arm resonator s1$b$ is electrically connected in parallel to the series arm resonator s1$a$. Therefore, the radio frequency signal input to the filter 10A corresponding to B12Rx+13Rx is subjected to power distribution between the series arm resonator s1$a$ and the series arm resonator s1$b$. Here, the resonant frequency of the series arm resonator s1$b$ is higher than the frequency (about 756 MHz, for example) at the high frequency end of the pass band of the filter corresponding to B12Rx+13Rx. Therefore, in the frequency band corresponding to the pass band (B26Rx) of the filter 20, the series arm resonator s1$b$ is less likely to generate the bulk wave loss compared with the series arm resonator s1$a$. Therefore, the bulk wave loss in B26Rx when observed as a whole of the series arm circuit is able to be reduced. Therefore, the loss in the pass band of the filter 20 is able to be reduced. That is, the loss in the pass band is able to be reduced, regarding B26Rx characteristics of the multiplexer.

According to Examples 6 and 8, compared to Examples 5 and 7, the resonant frequency of the series arm resonator s1$b$ is lower than the frequency (about 859 MHz, for example) at the low frequency end of the pass band of the filter 20. In this regard, the return losses of Examples 7 and 8 are worse than those of Examples 5 and 6 in the filter 10A alone corresponding to B12Rx+13Rx. However, as described in Example 2, since a capacitance of the series arm resonator s1$b$ is able to be made to be small in the B26Rx, the impedance observed from the common terminal 110$c$ to the filter 10A is able to be increased. Therefore, it is possible to reduce the loss in the pass band, regarding the B26Rx characteristics of the multiplexer.

According to Examples 7 and 8, the band width ratio of the series arm resonator s1a is wider than that in Examples 5 and 6. Specifically, in Examples 7 and 8, the band width ratio of the series arm resonator s1a is wider than any of the band width ratios of the series arm circuits different from the series arm circuit that has the series arm resonators s1a among one or more series arm circuits (here, the three series arm circuits 110s, 120s, and 130s) provided in the filter 10A and the parallel arm circuits (here, the series arm circuits 120s and 130s, and the parallel arm circuits 110p, 120p, and 130p).

Note that, from the viewpoint of reducing the loss in the pass band regarding the B26Rx characteristics of the multiplexer, it is preferable that the band width ratio of the series arm resonator s1a is wider than that of any of the series arm circuits 120s and 130s and the parallel arm circuits 110p, 120p and 130p, as in Examples 7 and 8. However, when the band width ratio of the series arm resonator s1a is wider than at least one band width ratio among the band width ratios of the series arm circuits 120s and 130s and the parallel arm circuits 110p, 120p and 130p, the above-described loss is able to be reduced than when the configuration is not above described one.

Here, deterioration in the loss in the pass band of the filter 20 due to the bulk wave loss in the filter 10A is dominated by influence of the bulk wave loss in the series arm circuit electrically connected closest to the common terminal 110c of the filter 10A (i.e., the series arm circuit electrically connected to the common terminal without other series arm circuits interposed therebetween). According to Examples 5 to 8, the series arm circuit 110s in which the series arm resonator s1b is electrically connected in parallel to the series arm resonator s1a is electrically connected to the common terminal 110c without other series arm circuits interposed therebetween. Therefore, when the filter 10A is observed from the common terminal 110c, the bulk wave loss in the pass band of the filter 20 is able to be further reduced, so that the loss in the pass band of the filter 20 is able to be effectively reduced.

Each acoustic wave resonator (each series arm resonator and each parallel arm resonator) included in the filters 10 and 10A according to the present preferred embodiment and the modifications is preferably an acoustic wave resonator using a surface acoustic wave (SAW). The SAW includes not only a surface acoustic wave but also a boundary acoustic wave, for example.

Figure 18A:
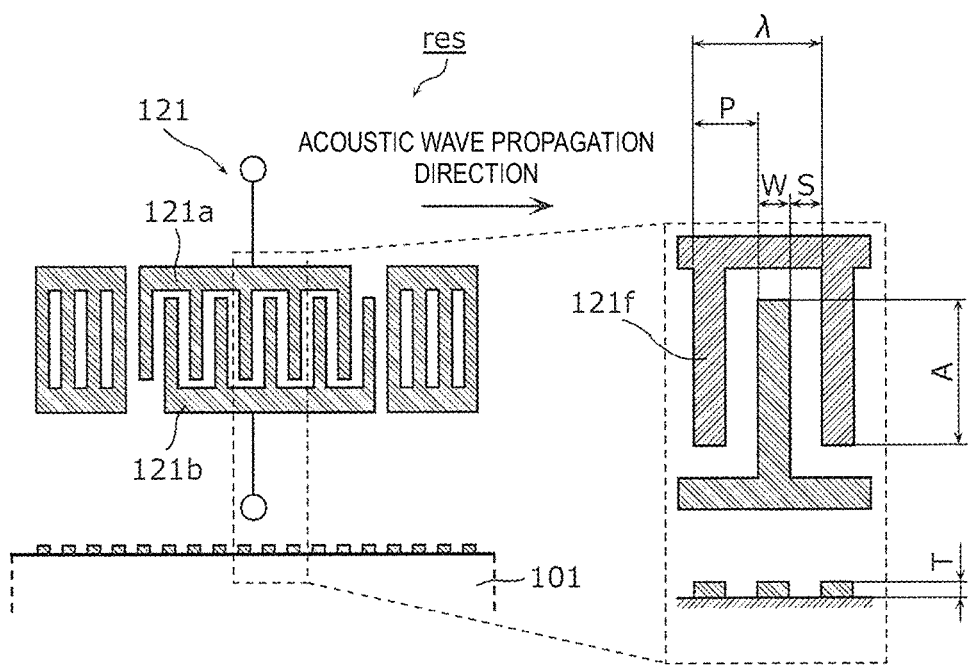
FIG. 18A includes a plan view and a sectional view illustrating an electrode structure of an acoustic wave resonator according to Preferred Embodiment 1 of the present invention.
Figure 18B:
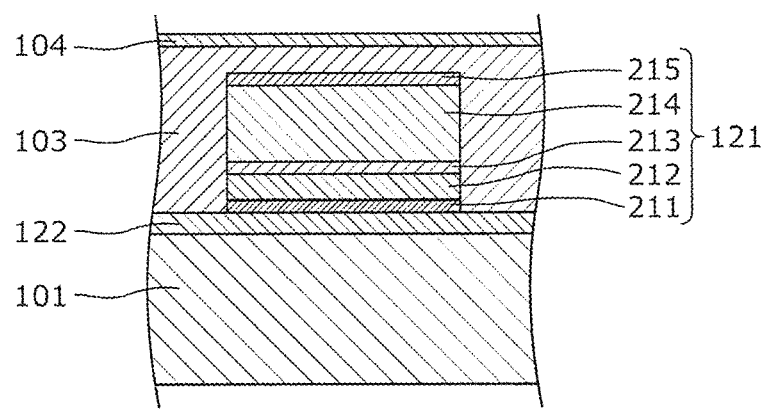
FIG. 18B is a sectional view of a structure of an electrode finger and its surroundings of the acoustic wave resonator according to Preferred Embodiment 1 of the present invention and a modification thereof.

FIG. 18A includes a plan view and a sectional view illustrating an electrode structure of an acoustic wave resonator according to Preferred Embodiment 1 and a modification thereof. FIG. 18B is a sectional view of a structure of an electrode finger and its surroundings of the acoustic wave resonator according to Preferred Embodiment 1 and a modification thereof. In FIGS. 18A and 18B, a plan view and a schematic sectional view are exemplified in which a structure of an acoustic wave resonator res corresponding to each acoustic wave resonator configuring the filters 10 and 10A is illustrated. Further, the acoustic wave resonator res illustrated in FIG. 18A is for explaining a typical structure of each acoustic wave resonator, and the number and lengths of electrode fingers configuring the electrode are not limited thereto.

As illustrated in FIG. 18A, the acoustic wave resonator res preferably includes an IDT electrode 121 defined by a plurality of electrode fingers 121f on a substrate 101, the substrate 101 at least partially having piezoelectricity. As a result, each resonator configuring the filters 10 and 10A is able to be made to be smaller in size, so that the filters 10 and 10A is able to be reduced in size and cost. Since an acoustic wave resonator generally exhibits high Q characteristics, the losses of the filters 10 and 10A are able to be reduced and the filters 10 and 10A are able to be made to be higher in selectivity.

Specifically, as illustrated in FIGS. 18A and 18B, the acoustic wave resonator res preferably includes the substrate 101 having the piezoelectricity, a Ksaw adjustment film 122, a protective layer 103, and a protective layer 104, in addition to the IDT electrode 121.

The substrate 101 having the piezoelectricity is preferably made of lithium tantalate ($LiTaO_3$), lithium niobate ($LiNbO_3$), potassium niobate ($KNbO_3$), quartz, or a multilayer body thereof, for example. With such a configuration, the acoustic wave resonator res having high Q and wide band characteristics is able to be provided.

Note that the substrate 101 having the piezoelectricity may be a substrate having piezoelectricity at least in a portion thereof. For example, the substrate 101 may include a piezoelectric thin film (piezoelectric body) on a surface thereof, and may be defined by a multilayer body including a film having a different acoustic velocity from that of the piezoelectric thin film, a support substrate, and the like, for example. The substrate 101 having the piezoelectricity may be a multilayer body including, for example, a high acoustic velocity support substrate and a piezoelectric thin film on the high acoustic velocity support substrate, a multilayer body including a high acoustic velocity support substrate, a low acoustic velocity film on the high acoustic velocity support substrate and a piezoelectric thin film on the low acoustic velocity film, or a multilayer body including a support substrate, a high acoustic velocity film on the support substrate, a low acoustic velocity film on the high acoustic velocity film and a piezoelectric thin film on the low acoustic velocity film. Further, the substrate 101 having the piezoelectricity may have piezoelectricity over the entire substrate. In this case, the substrate 101 having the piezoelectricity is defined by one layer of piezoelectric layer.

As illustrated in FIG. 18A, the IDT electrode 121 preferably includes a pair of comb-shaped electrodes 121a and 121b facing each other. Each of the comb-shaped electrodes 121a and 121b includes a plurality of electrode fingers 121f that are parallel or substantially parallel to each other and a busbar electrode that connects the plurality of electrode fingers 121f. The plurality of electrode fingers 121f are provided along a direction orthogonal or substantially orthogonal to a propagation direction. Reflectors are preferably provided on both sides of the IDT electrode 121. The reflectors may be provided by weighting, for example, or may not be provided with a reflector.

The IDT electrode 121 is preferably defined by a low-density metal layer, or a multilayer body defined by a low-density metal layer and a high-density metal layer. The low-density metal layer is preferably metal layers made of one or more low-density metals selected from Al, Ti, Cu, Ag, Ni, Cr and alloys thereof, or a multilayer body of these metal layers, for example. The high-density metal layer is metal layers made of one or more a high-density metals selected from Au, Pt, Ta, Mo and W, for example. Note that the low-density metal is not limited to the above materials, and may be a metal having a density lower than that of the high-density metal configuring the high-density metal layer.

For example, the IDT electrode 121 illustrated in FIG. 18B is preferably formed by, for example, laminating a metal film 211 made of NiCr, a metal film 212 made of Pt, a metal film 213 made of Ti, a metal film 214 made of AlCu (an alloy of Al and Cu), and a metal film 215 made of Ti in this order from a side of the substrate 101 having the piezoelectricity. That is, the IDT electrode 121 is preferably defined by, for example, a multilayer body of four metal films 211, 213, 214, and 215 each of which is a low-density metal layer, and one metal film 215 that is a high-density metal layer.

The protective layer 103 and the protective layer 104 protect the IDT electrode 121 from external environment, adjust frequency-temperature characteristics, improve moisture resistance, and the like.

The Ksaw adjustment film 122 is the first adjustment film that is provided between the substrate 101 having the piezoelectricity and the IDT electrode 121, and that adjusts an electromechanical coupling coefficient.

The protective layers 103 and 104 and the Ksaw adjustment film 122 are preferably made of silicon oxide (SiO$_2$), silicon nitride (SiN), aluminum nitride (AlN), or a multilayer body thereof, for example, the protective layer 103 and the Ksaw adjustment film 122 are preferably made of SiO$_2$, and the protective layer 104 is made of SiN, for example. Further, the protective layer 103 and the protective layer 104 define the second adjustment film.

Note that the configuration of the IDT electrode 121 illustrated in FIG. 18B is an example, and is not limited thereto. As described above, the IDT electrode 121 may be a single layer of a metal film, instead of a laminated structure of metal films. Moreover, materials configuring each metal film and each protective layer are not limited to those described above. The IDT electrode 121 may be made of, for example, a metal or alloy such as Ti, Al, Cu, Pt, Au, Ag, Pd, or the like, or may be defined by a plurality of multilayer bodies made of the metal or alloy described above. Further, the configurations of the protective layers 103, and 104 and the Ksaw adjustment film 122 are not limited to those described above, and may be defined by, for example, a dielectric or an insulator such as SiO$_2$, SiN, AlN, polyimide, or a multilayer body thereof. Further, the protective layers 103 and 104 and the Ksaw adjustment film 122 may not be provided.

In the acoustic wave resonator res configured as described above, a wave length of an acoustic wave to be excited is defined according to desired design parameters of the IDT electrode 121, or the like.

The wave length of the acoustic wave is defined by a repetition period λ of one electrode finger 121$f$ electrically connected to the busbar electrode among the plurality of electrode fingers 121$f$. Further, an electrode finger pitch (pitch of the plurality of electrode fingers 121$f$, i.e., an electrode finger period) P is about ½ of the repetition period λ, and when a line width of the electrode finger 121$f$ is W and a space width between the adjacent electrode fingers 121$f$ is S, the electrode finger pitch P is defined by P=(W+S). An intersecting width A of the IDT electrode 121 is an overlapping electrode finger length when the electrode finger 121$f$ electrically connected to one of a pair of busbar electrodes and the electrode finger 121$f$ electrically connected to the other of the pair of busbar electrodes are viewed from the propagation direction of the acoustic wave. An electrode duty (duty ratio) is a line width occupancy of the plurality of electrode fingers 121$f$, and is defined by a ratio of the line width to a sum of the line width and the space width of the plurality of electrode fingers 121$f$, that is, W/(W+S). That is, the electrode duty is defined by a ratio of the width of each of the plurality of electrode fingers 121$f$ to the electrode finger pitch (the pitch of the plurality of electrode fingers 121$f$), namely, W/P. Further, the number of pairs is the number of paired electrode fingers 121$f$, and is defined as (total number of electrode fingers 121$f$−1)/2. A film thickness T of the IDT electrode 121 (i.e., a film thickness of each of the plurality of electrode fingers 121$f$) is the total film thickness of the metal films 211 to 215. Further, a capacitance value C$_0$ of the acoustic wave resonator res is represented by the following Equation 1.

[Equation 1]

$$\text{ELECTROSTATIC CAPACITY } C_0 = \frac{\varepsilon_0 \cdot \varepsilon_r \cdot \text{THE NUMBER OF PAIRS} \cdot \text{INTERSECTING WIDTH}}{2 \cdot (1 - \text{ELECTRODE DUTY})} \quad \text{(Equation 1)}$$

In addition, $\varepsilon_0$ is a dielectric constant in a vacuum, and $\varepsilon_r$ is a dielectric constant of the substrate 101 having the piezoelectricity.

Next, adjustment of the band width ratios BWR of the series arm resonator and the parallel arm resonator having an acoustic wave resonator structure will be described.

Figure 19:
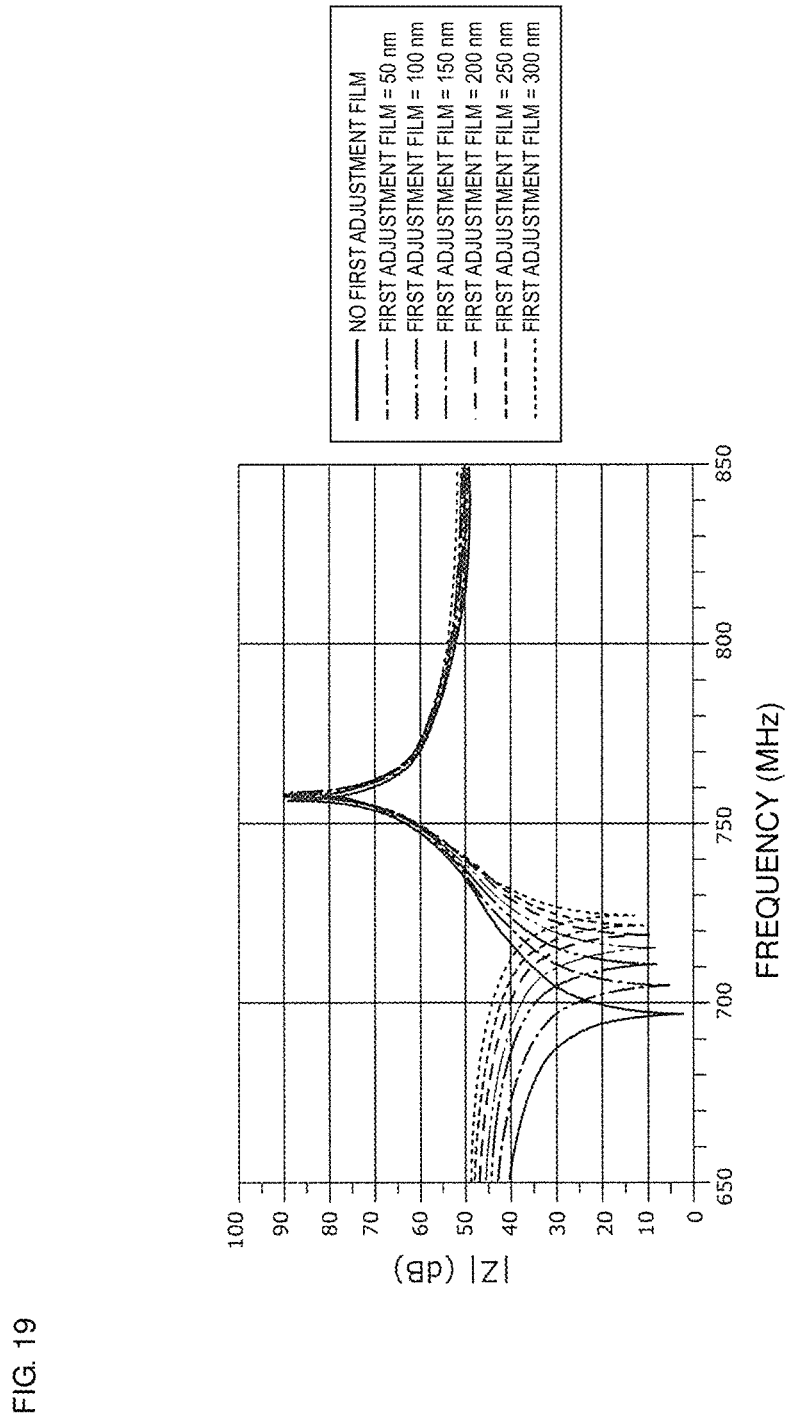
FIG. 19 is a graph illustrating a relation between a film thickness of a first adjustment film (Ksaw adjustment film) configuring the electrode structure and an impedance of the acoustic wave resonator.
Figure 20:
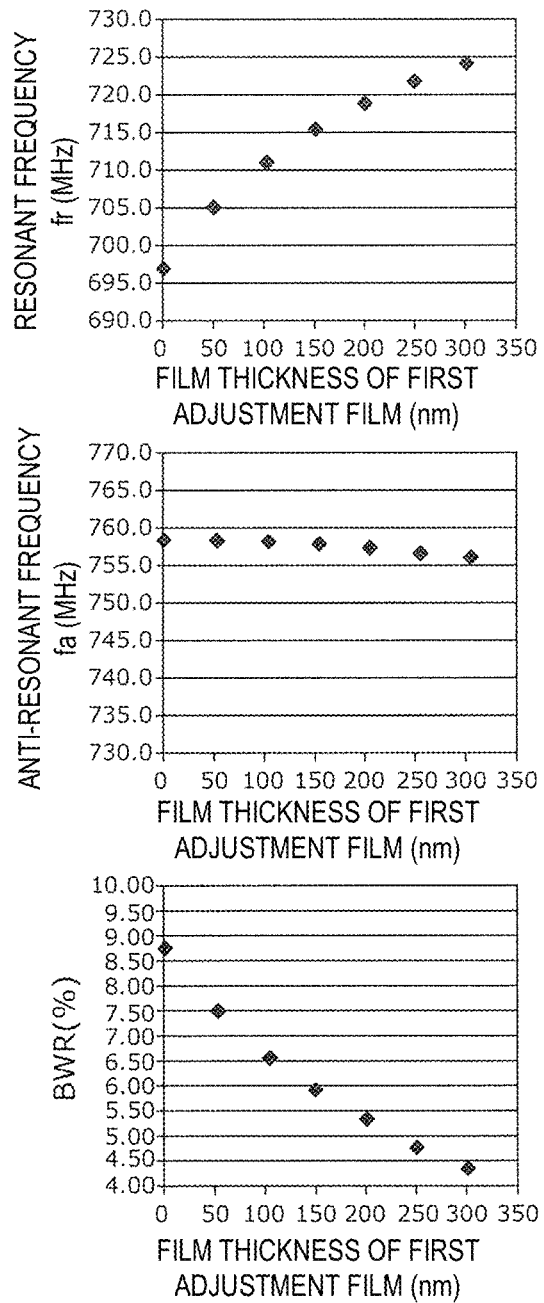
FIG. 20 includes graphs illustrating relations between the film thickness of the first adjustment film, and each of a resonant frequency, an anti-resonant frequency, and a band width ratio of the acoustic wave resonator.

FIG. 19 is a graph illustrating a relationship between a film thickness of the first adjustment film (Ksaw adjustment film) of the electrode structure and an impedance of the acoustic wave resonator. FIG. 20 includes graphs illustrating relationships between the film thickness of the first adjustment film, and each of a resonant frequency, an anti-resonant frequency, and a band width ratio of the acoustic wave resonator. FIG. 19 illustrates frequency characteristics of the impedance of the acoustic wave resonator when the film thickness of the first adjustment film illustrated in FIG. 18B is changed. Note that, at this time, a −10° Y cut LiNbO$_3$ substrate is used as the substrate 101 having the piezoelectricity, and the film thickness of the IDT electrode is 595 nm. In addition, the upper portion of FIG. 20 illustrates the relationship between the film thickness of the first adjustment film and the resonant frequency fr, the middle portion of FIG. 20 illustrates the relationship between the film thickness of the first adjustment film and the anti-resonant frequency fa, and the lower portion of FIG. 20 illustrates the relationship between the film thickness of the first adjustment film and the band width ratio BWR.

As illustrated in FIG. 19, when the film thickness of the first adjustment film is changed, the anti-resonant frequency fa is hardly moved, and the resonant frequency fr is shifted. More specifically, as illustrated in FIG. 20, as the film thickness of the first adjustment film is increased, the resonant frequency fr shifts to the high frequency side, and the band width ratio BWR becomes smaller.

From the above results, in the filters 10, 10A according to Preferred Embodiment 1 and the modifications thereof, as a configuration in which the band width ratio of the series arm resonator s1$a$ is made to be wider than that of at least one another acoustic wave resonator, (1) a configuration in which the first adjustment film on the IDT electrode of the series arm resonator s1$a$ is made to be thinner than the first adjustment film on the IDT electrode of the at least one other acoustic wave resonator, or (2) a configuration in which the first adjustment film is not provided on the IDT electrode of the series arm resonator s1$a$, can be considered.

Figure 21:
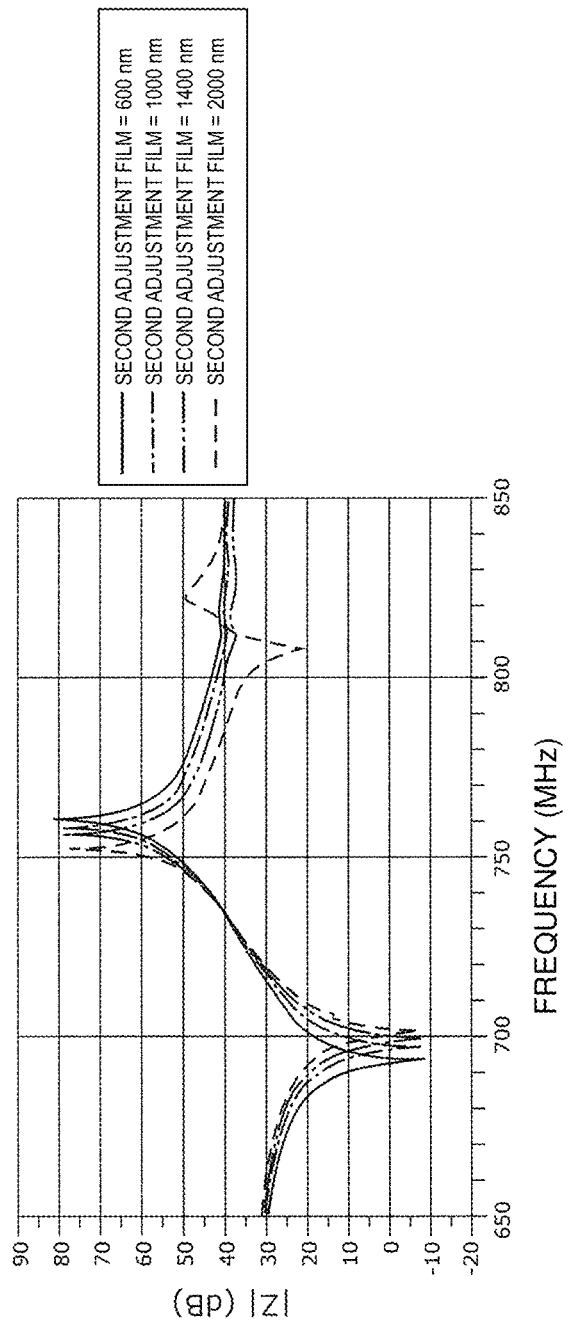
FIG. 21 is a graph illustrating a relation between a film thickness of a second adjustment film configuring the electrode structure and the impedance of the acoustic wave resonator.

FIG. 21 is a graph illustrating a relationship between a film thickness of the second adjustment film of the electrode structure and an impedance of the acoustic wave resonator.

Figure 22:
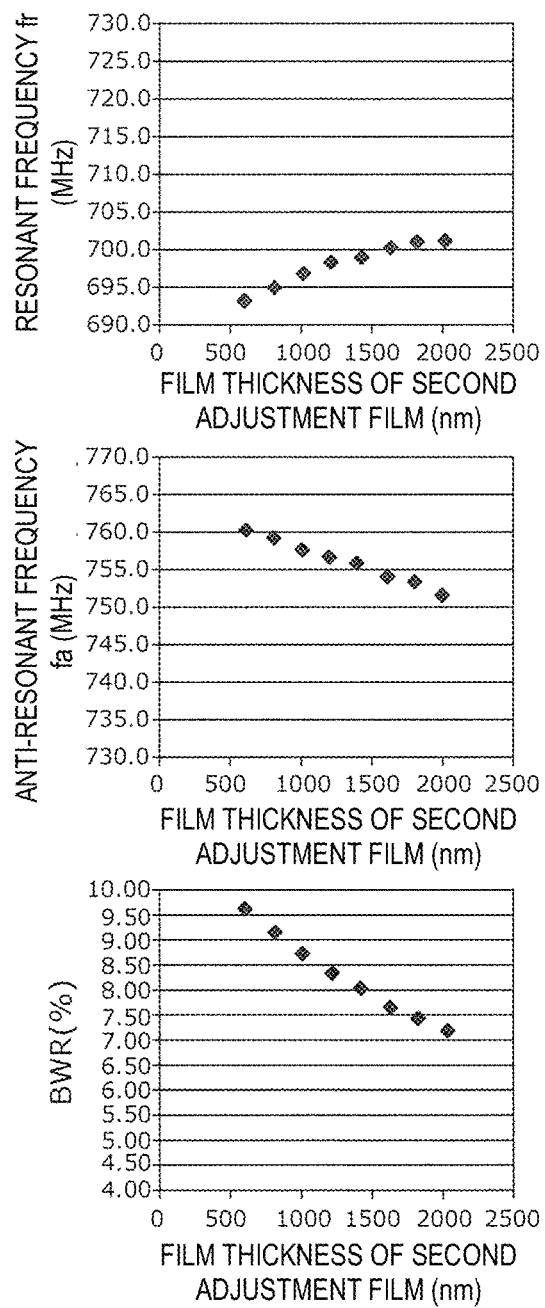
FIG. 22 includes graphs illustrating relations between the film thickness of the second adjustment film, and each of a resonant frequency, an anti-resonant frequency, and a band width ratio of the acoustic wave resonator.

FIG. 22 includes graphs illustrating relationships between the film thickness of the second adjustment film, and each of a resonant frequency, an anti-resonant frequency, and a band width ratio of the acoustic wave resonator. FIG. 21 illustrates frequency characteristics of a resonant impedance of the acoustic wave resonator when the film thickness of the second adjustment film (protective layers 103+104) illustrated in FIG. 18B is changed. Note that, at this time, a −10° Y cut $LiNbO_3$ substrate is used as the substrate 101 having the piezoelectricity, and the film thickness of the IDT electrode is about 595 nm, for example. In addition, the upper portion of FIG. 22 illustrates a relationship between the film thickness of the second adjustment film and the resonant frequency fr, the middle portion of FIG. 22 illustrates a relationship between the film thickness of the second adjustment film and the anti-resonant frequency fa, and the lower portion of FIG. 22 illustrates a relation between the film thickness of the second adjustment film and the band width ratio BWR.

As illustrated in FIG. 21, when the film thickness of the second adjustment film is changed, the anti-resonant frequency fa and the resonant frequency fr are shifted. More specifically, as illustrated in FIG. 22, as the film thickness of the second adjustment film is increased, the resonant frequency fr is shifted to the higher frequency side and the anti-resonant frequency fa is shifted to the lower frequency side, so that the band width ratio BWR becomes smaller.

From the above results, in the filters 10, and 10A according to Preferred Embodiment 1 and the modifications thereof, as a configuration in which the band width ratio of the series arm resonator S1a is made to be wider than that of the at least one other acoustic wave resonator, (1) a configuration in which the second adjustment film on the IDT electrode of the series arm resonator s1a is made to be thinner than the second adjustment film on the IDT electrodes of the at least one other acoustic wave resonator, or (2) a configuration in which the second adjustment film is not provided on the IDT electrode of the series arm resonator s1a.

As described above, the first adjustment film and the second adjustment film may be appropriately set in accordance with required filter characteristics. Specifically, for example, since the second adjustment film increases frequency-temperature characteristics and moisture resistance, the second adjustment film may be set in consideration of the frequency-temperature characteristics and the moisture resistance necessary for the required filter, and the adjustment of the band width ratio may be mainly determined by the presence or absence and the film thickness of the first adjustment film.

Preferred Embodiment 2

In Preferred Embodiment 1, the series arm circuit of the first filter has the configuration in which the series arm resonator s1a (first series arm resonator) and the series arm resonator s1b (second series arm resonator) are electrically connected in parallel. In contrast, in the present preferred embodiment, the series arm circuit of the first filter preferably has a configuration in which another circuit element is added to the above-described configuration.

Figure 23:
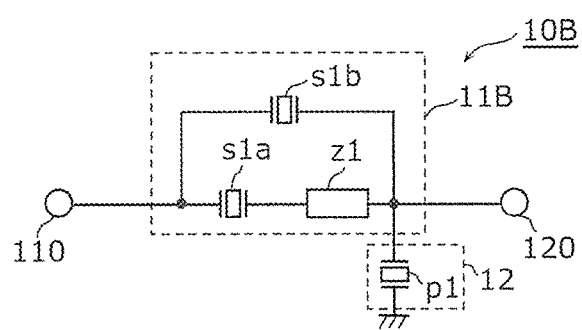
FIG. 23 is a circuit configuration diagram of a filter (first filter) according to Preferred Embodiment 2 of the present invention.

FIG. 23 is a circuit configuration diagram of a filter 10B (first filter) according to Preferred Embodiment 2. The filter 10B illustrated in FIG. 23 preferably includes a series arm circuit 11B and the parallel arm circuit 12, and the series arm circuit 11B includes the series arm resonator s1a, the series arm resonator s1b, and an impedance element z1. The filter 10B illustrated in FIG. 23 preferably differs from the filter 10 according to Preferred Embodiment 1 only in that the filter 10B includes the impedance element z1. Hereinafter, the filter 10B according to the present preferred embodiment will be described mainly with respect to the difference from the filter 10 according to Preferred Embodiment 1.

The series arm resonator s1a (first series arm resonator) is electrically connected between the input/output terminal 110 and the input/output terminal 120, and is an acoustic wave resonator having a resonant frequency within the pass band of the filter 10B (first filter).

The impedance element z1 is a first impedance element electrically connected in series to the series arm resonator s1a, and is exemplified by a capacitor or an inductor.

The series arm resonator s1b (second series arm resonator) is an acoustic wave resonator which is electrically connected in parallel to a circuit in which the series arm resonator s1a and the impedance element z1 are electrically connected in series, and has a resonant frequency located on the higher frequency side with respect to the high frequency end of the pass band of the filter 10B.

According to the filter 10B configured as described above, similarly to the filter 10 according to Preferred Embodiment 1, the loss in the pass band of the other filter (here, filter 20) of the multiplexer 1 together with the filter 10 which is an acoustic wave filter is able to be reduced. Further, by appropriately selecting the impedance element, it is possible to adjust the pass band or the attenuation band. The impedance element may preferably be capable of adjusting the element value, such as a varicap and a variable capacitor such as a digitally tunable capacitor (DTC), for example.

The principle of obtaining the resonant frequency and the anti-resonant frequency as described above will be described by analysis (resonance analysis) of impedance characteristics (resonance characteristics) using an equivalent circuit model of the resonator.

First, the resonance characteristics of the resonator alone will be described.

Figure 24A:
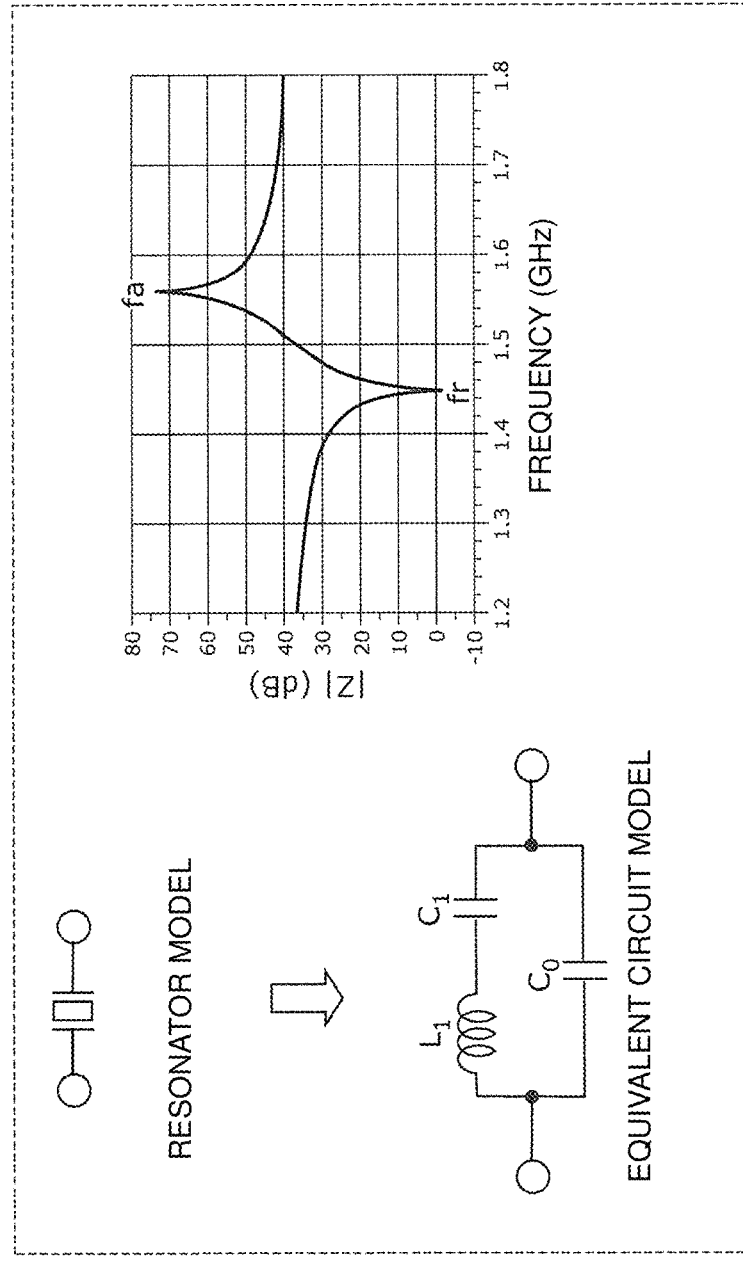
FIG. 24A is a diagram illustrating an equivalent circuit model of a resonator and resonance characteristics thereof.

FIG. 24A is a diagram illustrating an equivalent circuit model of one resonator and the resonance characteristics thereof. As illustrated in FIG. 24A, the resonator may be represented by a circuit in which a capacitor $C_1$ and an inductor $L_1$ are electrically connected in series, and a circuit in which the capacitor $C_0$ is electrically connected in parallel to the circuit in which the capacitor $C_1$ and the inductor $L_1$ are electrically connected in series (parallel connection circuit). Here, the capacitor $C_0$ is the electrostatic capacity of the resonator.

In the equivalent circuit described above, since the resonant frequency fr of the resonator is defined by the circuit in which the capacitor $C_1$ and the inductor $L_1$ are electrically connected in series, and is a frequency at which the impedance of the equivalent circuit becomes 0, the resonant frequency fr is expressed by Equation 3 by solving Equation 2.

Equation 2

$$Z = 0 = j\omega L_1 + \frac{1}{j\omega C_1} \quad \text{(Equation 2)}$$

Equation 3

$$f_r = \frac{1}{2\pi\sqrt{L_1 C_1}} \quad \text{(Equation 3)}$$

Since the anti-resonant frequency fa of the resonator is a frequency at which an admittance Y of the above equivalent circuit becomes 0, the anti-resonant frequency fa is expressed by Equation 5 by solving Equation 4.

Equation 4

$$Y = \frac{1}{Z} = 0 = \frac{1}{\frac{1}{j\omega C_0}} + \frac{1}{j\omega L_1 + \frac{1}{j\omega C_1}} \quad \text{(Equation 4)}$$

Equation 5

$$f_a = \frac{\sqrt{1 + \frac{C_1}{C_0}}}{2\pi\sqrt{L_1 C_1}} = f_r\sqrt{1 + \frac{C_1}{C_0}} \quad \text{(Equation 5)}$$

From the above Equation 3 and Equation 5, as illustrated in a right side graph of FIG. 24A, the anti-resonant frequency fa appears on the higher frequency side with respect to the resonant frequency fr.

That is, the resonator has one resonant frequency and one anti-resonant frequency located on the higher frequency side with respect to the resonant frequency.

Next, the resonance characteristics in a case where the impedance element is electrically connected in series to the resonator will be described with reference to an equivalent circuit model.

Figure 24B:
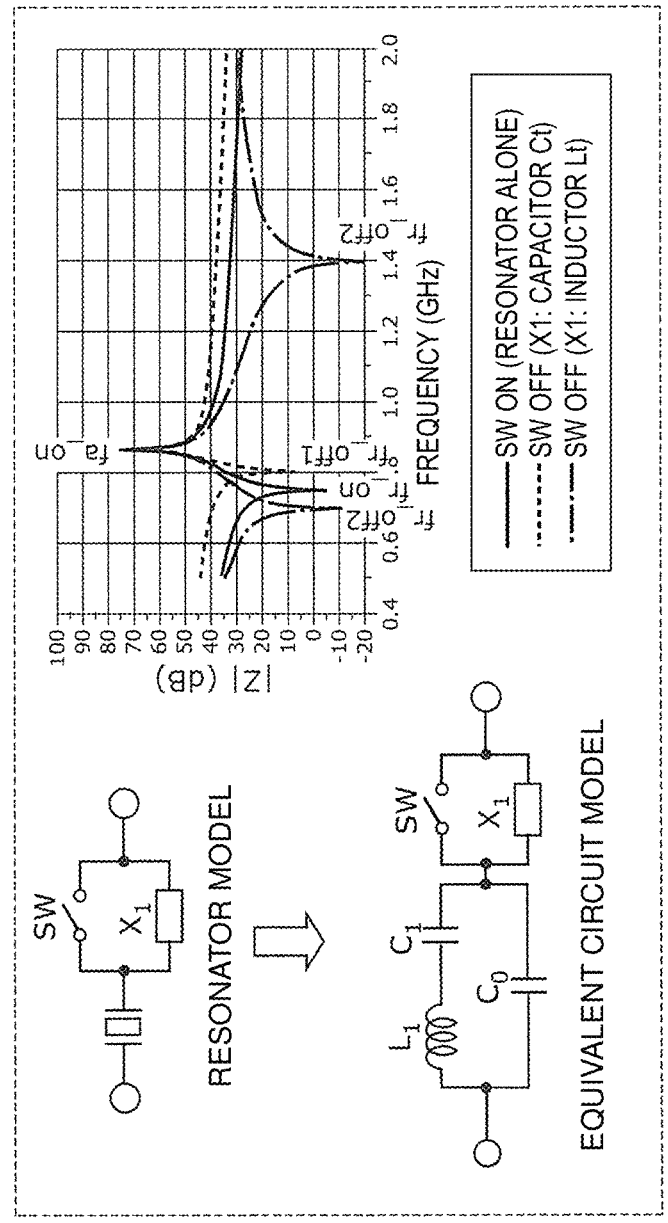
FIG. 24B is a diagram illustrating an equivalent circuit model and resonance characteristics thereof when an impedance element is electrically connected in series to a resonator.

FIG. 24B is a diagram illustrating an equivalent circuit model and resonance characteristics thereof when an impedance element $X_1$ is electrically connected in series to the resonator. As illustrated in FIG. 24B, the resonator can be represented by a circuit in which the capacitor $C_1$ and the inductor $L_1$ are electrically connected in series, and a circuit in which the capacitor $C_0$ is electrically connected in parallel to the circuit in which the capacitor $C_1$ and the inductor $L_1$ are electrically connected in series. Here, the capacitor $C_0$ is the electrostatic capacity of the resonator. Further, a parallel circuit of the impedance element $X_1$ and the switch SW is electrically connected to the resonator.

First, a description will be provided of the resonance characteristics of the above equivalent circuit in a case where a switch SW is on. When the switch SW is on, the impedance element $X_1$ becomes short-circuited, so that the resonant frequency fr_on and the anti-resonant frequency fa_on are the same as the resonant frequency fr and the anti-resonant frequency fa of the resonator alone in FIG. 24A, and are expressed by Equation 6 and Equation 7.

Equation 6

$$f_r\_on = \frac{1}{2\pi\sqrt{L_1 C_1}} \quad \text{(Equation 6)}$$

Equation 7

$$f_a\_on = \frac{\sqrt{1 + \frac{C_1}{C_0}}}{2\pi\sqrt{L_1 C_1}} = f_r\_on\sqrt{1 + \frac{C_1}{C_0}} \quad \text{(Equation 7)}$$

Next, when the switch SW is off, (1) a case where the impedance element $X_1$ is a capacitor and (2) a case where the impedance element $X_1$ is an inductor will be described separately.

(1) The impedance element $X_1$ is a capacitor Ct.

Since the resonant frequency fr_off1 when the switch SW is off is set to a frequency at which the impedance Z of the above equivalent circuit becomes 0, the resonant frequency fr_off1 is expressed by Equation 9 by solving Equation 8.

Equation 8

$$Z = 0 = \frac{1}{\frac{1}{\frac{1}{j\omega C_0}} + \frac{1}{j\omega L_1 + \frac{1}{j\omega C_1}}} + \frac{1}{j\omega C_t} \quad \text{(Equation 8)}$$

Equation 9

$$f_r\_off1 = \frac{\sqrt{\frac{C_0 + C_1 + C_t}{L_1 C_1 C_t + L_1 C_0 C_t}}}{2\pi} \quad \text{(Equation 9)}$$

On the other hand, the anti-resonant frequency fa_off1 when the switch SW is off is the same or substantially the same as the anti-resonant frequency fa_on when the switch SW is on, and is expressed by Equation 10.

Equation 10

$$f_a\_off1 = \frac{\sqrt{1 + \frac{C_1}{C_0}}}{2\pi\sqrt{L_1 C_1}} \quad \text{(Equation 10)}$$

From Equation 6, Equation 7, Equation 9, and Equation 10, when the impedance element $X_1$ is a capacitor, the anti-resonant frequencies fa_on and fa_off1 coincide with each other irrespective of whether the switch SW is turned on or off, as illustrated in a right side graph of FIG. 24B. On the other hand, it can be seen that the resonant frequency is, when the switch SW is turned off (fr_off1), shifted to the high frequency side as compared with the on state (fr_on) of the switch SW.

(2) The impedance element $X_1$ is an inductor Lt.

Since a resonant frequency fr_off2 when the switch SW is off is a frequency at which an impedance Z of the above equivalent circuit becomes 0, the resonant frequency fr_off2 is expressed by Equation 12 by solving Equation 11.

Equation 11]

$$Z = 0 = \frac{1}{\frac{1}{\frac{1}{j\omega C_0}} + \frac{1}{j\omega L_1 + \frac{1}{j\omega C_1}}} + j\omega L_t \quad \text{(Equation 11)}$$

-continued

Equation 12

$$f_r\_off2L = \frac{\sqrt{\frac{-b - \sqrt{b^2 - 4ac}}{2a}}}{2\pi}$$ (Equation 12)

$$f_r\_off2H = \frac{\sqrt{\frac{-b + \sqrt{b^2 - 4ac}}{2a}}}{2\pi}$$

$$a = L_1 L_t C_0 C_1$$
$$b = -L_1 C_1 - L_t C_0 - L_1 C_1$$
$$c = 1$$

In Equation 12, fr_off2L is a resonant frequency on the low frequency side when the switch SW is off, and fr_off2H is a resonant frequency on the high frequency side when the switch SW is off.

On the other hand, the anti-resonant frequency fa_off2, when the switch SW is off, is the same as the anti-resonant frequency fa_on when the switch SW is on, and is expressed by Equation 13.

Equation 13

$$f_a\_off2 = \frac{\sqrt{1 + \frac{C_1}{C_0}}}{2\pi\sqrt{L_1 C_1}}$$ (Equation 13)

According to Equation 6, Equation 7, Equation 12, and Equation 13, when the impedance element $X_1$ is an inductor, the anti-resonant frequencies fa_on and fa_off2 coincide with each other irrespective of the switching between on and off of the switch SW, as illustrated in the right graph of FIG. 24B. On the other hand, it can be seen that the resonant frequency is, when the switch SW is turned off (fr_off2L), shifted to the lower frequency side and (fr_off2H) is added as compared with the on state (fr_on) of the switch SW.

Next, the resonance characteristics in the case where the impedance element is electrically connected in parallel to the resonator will be described. Here, a case where the impedance element is the capacitor Ct will be described, and in a case where the impedance element is the inductor Lt, description thereof will be omitted. In addition, since the equivalent circuit model in this case is merely that the capacitor Ct is electrically connected in parallel to the equivalent circuit model of the resonator illustrated in FIG. 24A, the explanation will be simplified.

In the case where the impedance element $X_1$ is the capacitor Ct, the configuration is obtained in which the capacitor Ct is electrically connected in parallel to the capacitor $C_0$ in the equivalent circuit model illustrated in FIG. 24A. Therefore, the resonant frequency in this case is expressed by the equation where $C_0$ of Equation 6 is replaced by a composite capacitance ($C_0$+Ct) of the capacitor $C_0$ and the capacitor Ct, and it can be seen that the resonant frequency coincides with the resonant frequency of the resonator alone. Moreover, it can be seen from Equation 7 that the anti-resonant frequency in this case shifts to the lower frequency side compared with the anti-resonant frequency of the resonator alone.

Next, the characteristics in the case where two resonators are electrically connected in parallel will be described with reference to the equivalent circuit model.

Figure 24C:
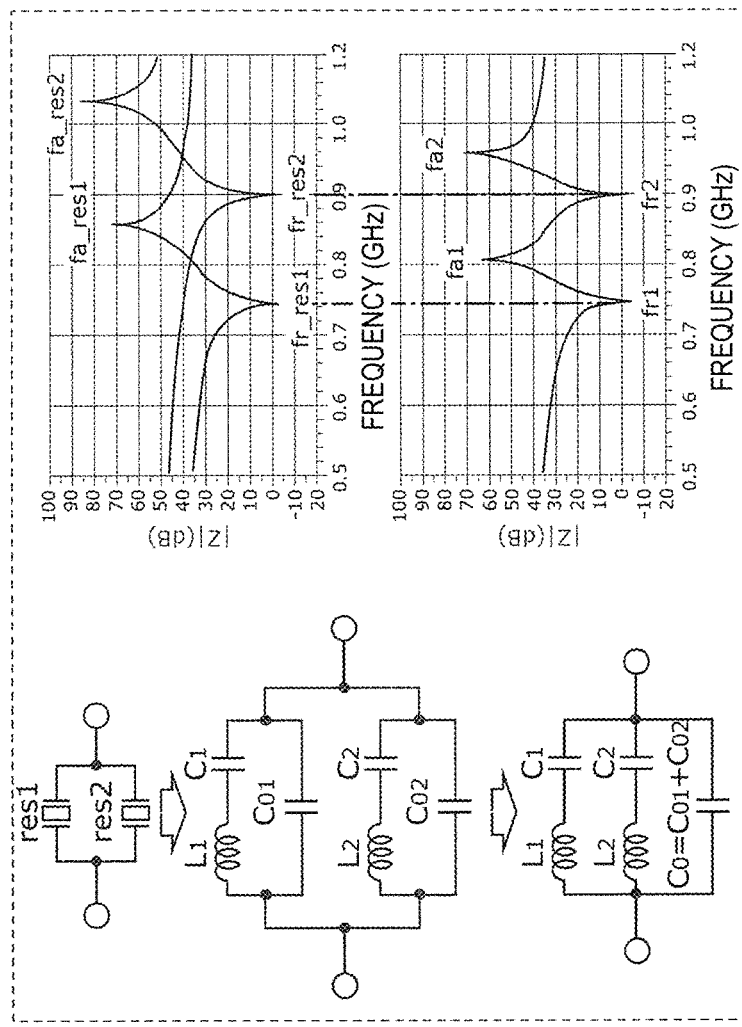
FIG. 24C is a diagram illustrating an equivalent circuit model of two resonators electrically connected in parallel to each other and resonance characteristics thereof.

FIG. 24C is a diagram illustrating an equivalent circuit model and resonance characteristics of two resonators electrically connected in parallel to each other. FIG. 24C illustrates a model in which resonators res1 and res2 are electrically connected in parallel. The resonator res1 is represented by a circuit in which the capacitor $C_1$ and the inductor $L_1$ are electrically connected in series, and a circuit in which a capacitor $C_{01}$ is electrically connected in parallel to the circuit in which the capacitor $C_1$ and the inductor $L_1$ are electrically connected in series, and the resonator res2 can be represented by a circuit in which a capacitor $C_2$ and an inductor $L_2$ are electrically connected in series, and a circuit in which a capacitor $C_{02}$ is electrically connected in parallel to the circuit in which the capacitor $C_2$ and the inductor $L_2$ are electrically connected in series. Here, each of the capacitors $C_{01}$ and $C_{02}$ is electrostatic capacitance of the resonators res1 and res2. The circuit in which the resonator res1 and the resonator res2 are electrically connected in parallel is represented by an equivalent circuit illustrated in the lower left portion of FIG. 24C. That is, the circuit in which the resonators res1 and res2 are electrically connected in parallel is represented by a circuit obtained by connecting a circuit in which the capacitor $C_1$ and the inductor $L_1$ are electrically connected in series, a circuit in which the capacitor $C_2$ and the inductor $L_2$ are electrically connected in series, and the capacitor $C_0$ (=$C_{01}$+$C_{02}$) in parallel.

In the above equivalent circuit, two resonant frequencies are defined, and the resonant frequencies fr1 and fr2 are defined by the resonant frequencies of the circuit in which the capacitor $C_1$ and the inductor $L_1$ are electrically connected in series and the circuit in which the capacitor $C_2$ and the inductor $L_2$ are electrically connected in series, respectively, and are expressed by Equation 14.

Equation 14

$$f_r1 = \frac{1}{2\pi\sqrt{L_1 C_1}}$$ (Equation 14)

$$f_r2 = \frac{1}{2\pi\sqrt{L_2 C_2}}$$

That is, the two resonant frequencies fr1 and fr2 represented by the above equivalent circuit are equal or substantially equal to the resonant frequency fr_res1 of the resonator res1 and the resonant frequency fr_res2 of the resonator res2, respectively.

Further, since the anti-resonant frequency of the equivalent circuit is a frequency at which the admittance Y of the equivalent circuit becomes 0, it can be seen that two anti-resonant frequencies (fa1, fa2) are obtained by solving Equation 15, as shown in Equation 16.

Equation 15

$$Y = \frac{1}{Z} = 0 = j\omega C_0 + \frac{1}{j\omega L_1 + \frac{1}{j\omega C_1}} + \frac{1}{j\omega L_2 + \frac{1}{j\omega C_2}}$$ (Equation 15)

-continued

Equation 16

$$f_a1 = \frac{\sqrt{\frac{-b - \sqrt{b^2 - 4ac}}{2a}}}{2\pi}$$ (Equation 16)

$$f_a2 = \frac{\sqrt{\frac{-b + \sqrt{b^2 - 4ac}}{2a}}}{2\pi}$$

$$a = L_1 L_2 C_0 C_1 C_2$$
$$b = -L_1 C_0 C_1 - L_2 C_0 C_2 - L_1 C_1 C_2 - L_2 C_1 C_2$$
$$c = C_0 + C_1 + C_2$$

It can be seen that the anti-resonant frequencies fa1 and fa2 obtained by the above Equation 15 are different from the anti-resonant frequency (fa_res1 and fa_res2 in the graph of FIG. 24C) of the resonator alone obtained by Equation 4. Further, the anti-resonant frequency fa1 derived from Equation 15 is lower than the anti-resonant frequency fa_res1 of the resonator res1 alone, and the anti-resonant frequency fa2 is lower than the anti-resonant frequency fa_res2 of the resonator res2 alone.

Further, a model in which the capacitors are electrically connected in series to the resonators res1 and res2 is analyzed.

First, a configuration in which the capacitor Cx is electrically connected in series to the resonator res2, that is, a circuit in which the resonator res2 and the capacitor Cx are electrically connected in series is electrically connected to the resonator res1 in parallel (circuit A), is assumed.

(i) In a case of resonant frequency $fr_{res1}$ of resonator res1 < resonant frequency $fr_{res2}$ of resonator res2, two resonant frequencies frL (low frequency side) and frH (high frequency side) of the circuit A are the frequencies at which the impedance of the circuit A becomes 0, and therefore, the frequencies are expressed by Equation 19 and Equation 20 by solving Equation 17 and Equation 18.

Equation 17

$$Z_{rL} = 0 = j\omega_{rL} L_1 + \frac{1}{j\omega_{rL} C_1}$$ (Equation 17)

Equation 18

$$Z_{rH} = 0 = \frac{1}{\frac{1}{\frac{1}{j\omega_{rH} C_{02}} + \frac{1}{j\omega_{rH} L_2 + \frac{1}{j\omega_{rH} C_2}}}} + \frac{1}{j\omega_{rH} C_x}$$ (Equation 18)

Equation 19

$$f_{rL} = \frac{1}{2\pi \sqrt{L_1 C_1}}$$ (Equation 19)

Equation 20

$$f_{rH} = \frac{\sqrt{\frac{C_{02} + C_2 + C_x}{L_2 C_2 C_x + L_2 C_{02} C_2}}}{2\pi}$$ (Equation 20)

(ii) In a case of resonant frequency $fr_{res1}$ > resonance frequency $fr_{res2}$, two resonant frequencies frL (low frequency side) and frH (high frequency side) of the circuit A are frequencies at which the impedance of the circuit A becomes 0, and therefore, the frequencies are expressed by Equation 23 and Equation 24 by solving Equation 21 and Equation 22.

Equation 21

$$Z_{rL} = 0 = \frac{1}{\frac{1}{\frac{1}{j\omega_{rL} C_{02}} + \frac{1}{j\omega_{rL} L_2 + \frac{1}{j\omega_{rL} C_2}}}} + \frac{1}{j\omega_{rL} C_x}$$ (Equation 21)

Equation 22

$$Z_{rH} = 0 = j\omega_{rH} L_1 + \frac{1}{j\omega_{rH} C_1}$$ (Equation 22)

Equation 23

$$f_{rL} = \frac{\sqrt{\frac{C_{02} + C_2 + C_x}{L_2 C_2 C_x + L_2 C_{02} C_2}}}{2\pi}$$ (Equation 23)

Equation 24

$$f_{rH} = \frac{1}{2\pi \sqrt{L_1 C_1}}$$ (Equation 24)

(iii) Two anti-resonant frequencies faL (low frequency side) and faH (high frequency side) of the circuit A are the frequencies at which an admittance Ya of the circuit A becomes 0, and therefore, the frequencies are expressed by Equation 26 by solving Equation 25.

Equation 25

$$Y_a = \frac{1}{\frac{1}{j\omega_a C_{01}} + j\omega_a L_1 + \frac{1}{j\omega_a C_1}} + \frac{1}{\frac{1}{\frac{1}{\frac{1}{j\omega_a C_{02}} + j\omega_a L_2 + \frac{1}{j\omega_a C_2}}} + \frac{1}{j\omega_a C_x}}$$ (Equation 25)

Equation 26

$$f_{aL} = \frac{\sqrt{\frac{-B - \sqrt{B^2 - 4AC}}{2A}}}{2\pi}$$ (Equation 26)

$$f_{aH} = \frac{\sqrt{\frac{-B + \sqrt{B^2 - 4AC}}{2A}}}{2\pi}$$

$$A = L_1 L_2 C_1 C_2 (C_{01} C_{02} + C_{01} C_x + C_{02} C_x)$$
$$B = -C_{01} C_{02} (L_1 C_1 + L_2 C_2) -$$
$$\quad C_1 C_2 (L_1 C_{01} + L_2 C_{02} + L_1 C_x + L_2 C_x) -$$
$$\quad C_x (L_1 C_{01} C_1 + L_1 C_{02} C_1 + L_2 C_{01} C_2 + L_2 C_{02} C_2)$$
$$C = C_{01} C_x + C_{01} C_{02} + C_{02} C_x + C_{02} C_1 +$$
$$\quad C_{01} C_2 + C_1 C_2 + C_1 C_x + C_2 C_x$$

First, the resonance characteristics of the series arm circuit 11B of the filter 10B will be described.

Figure 25:
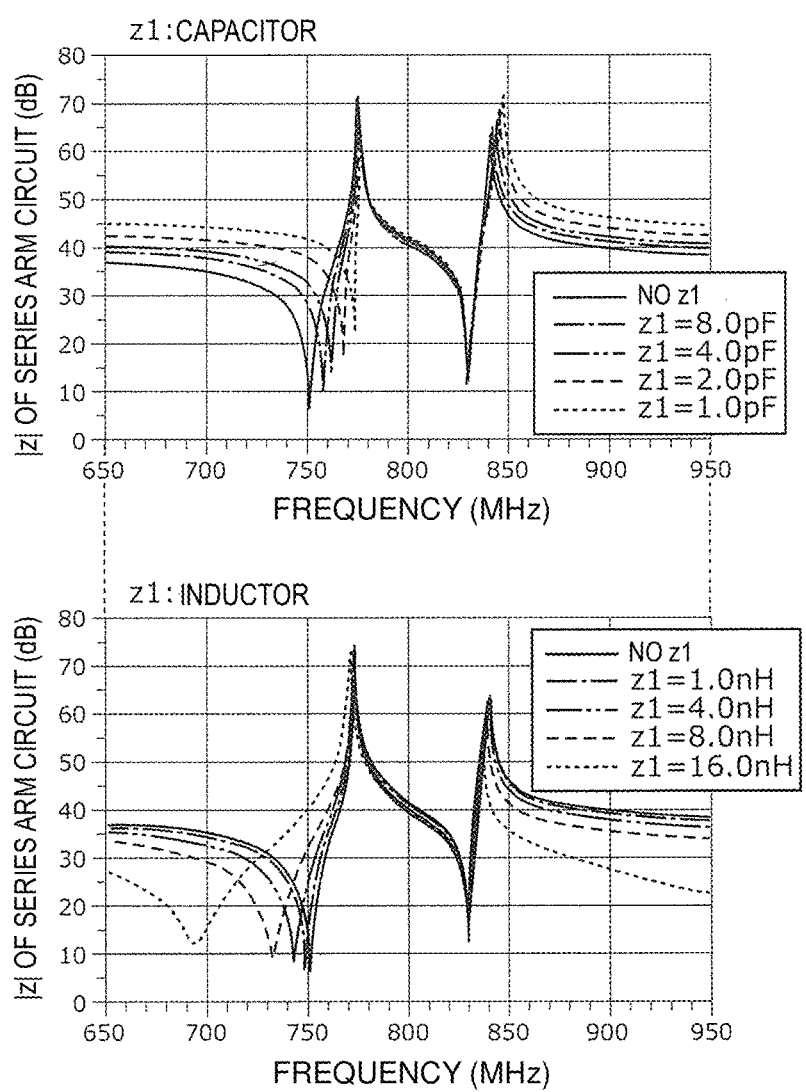
FIG. 25 includes graphs illustrating impedance characteristics of a series arm circuit of the filter (first filter) according to Preferred Embodiment 2 of the present invention.

FIG. 25 includes graphs illustrating impedance characteristics of the series arm circuit 11B of the filter 10B (first filter) according to Preferred Embodiment 2. In an upper portion of FIG. 25, the resonance characteristics are illustrated when the impedance element z1 is a capacitor, and the resonance characteristics when the impedance element z1 is an inductor are illustrated in the lower portion.

Note that a circuit constant of the filter 10B (first filter) at this time is the same as the circuit constant of the filter (first filter) of Example 2 described in Preferred Embodiment 1. That is, the characteristic of the series arm circuit 11B in the absence of the impedance element z1 is equal or substantially equal to the characteristic of the series arm circuit in Example 2.

As illustrated in the upper portion of FIG. 25, when the impedance element z1 is a capacitor, the resonant frequency of the series arm circuit 11B is expressed by Equation 23 and Equation 24, and the resonant frequency (fr1) on the low frequency side is shifted to a higher frequency side as the capacitance value of the capacitor is smaller, and the resonant frequency (fr2) on the high frequency side is constant regardless of the capacitance value of the capacitor. With respect to the anti-resonant frequency, since the derivation of the above equation becomes complicated, although omitted, the anti-resonant frequency (fa1) at the low frequency side is slightly shifted to the high frequency side as the capacitance value of the capacitor becomes smaller, and the anti-resonant frequency (fa2) at the high frequency side shifts to the higher frequency side as the capacitance value of the capacitor becomes smaller.

Therefore, in this case, for the series arm circuit 11B, the low frequency side band width ratio (BWR1) defined as a value obtained by dividing the frequency difference (fa1−fr1) between the low frequency side anti-resonant frequency (fa1) and the low frequency side resonant frequency (fr1) by the low frequency side resonant frequency (fr1) ((fa1−fr1)/fr1) (or percentage thereof) becomes significantly smaller as the capacitance value of the capacitor becomes smaller. In this case, in the series arm circuit 11B, the high frequency side band width ratio (BWR2) defined as a value obtained by dividing the frequency difference (fa2−fr2) between the high frequency side anti-resonant frequency (fa2) and the high frequency side resonant frequency (fr2) by the high frequency side resonant frequency (fr2) ((fa2−fr2)/fr2) (or percentage thereof) becomes larger as the capacitance value of the capacitor becomes smaller.

Table 6 shows a series arm circuit in a case where the impedance element z1 is a capacitor, and shows a resonant frequency (fr1) on the low frequency side, an anti-resonant frequency (fa1) on the low frequency side, a band width ratio (BWR1) on the low frequency side, a resonant frequency (fr2) on the high frequency side, an anti-resonant frequency (fa2) on the high frequency side, and a band width ratio (BWR2) on the high frequency side. In FIG. 25, a case where the capacitance value of the capacitor is about 16 pF is omitted for the sake of simplicity, but numerical values in this case are also shown in Table 6. In addition, in the "-" field in the "capacitance value" column in Table 6, the numerical values of the series arm circuit without the capacitor, that is, defined by only the resonator, are shown.

TABLE 6

| | Low Frequency Side | | | High Frequency Side | | |
|---|---|---|---|---|---|---|
| Capacitance Value | Resonant Frequency fr1 (MHz) | Anti-Resonant Frequency fa1 (MHz) | Band Width Ratio BWR1 (%) | Resonant Frequency fr2 (MHz) | Anti-Resonant Frequency fa2 (MHz) | Band Width Ratio BWR2 (%) |
| — | 750.0 | 774.0 | 3.20 | 830.0 | 840.5 | 1.27 |
| 16 pF | 754.0 | 774.0 | 2.65 | 830.0 | 841.5 | 1.39 |
| 8 pF | 757.0 | 774.5 | 2.31 | 830.0 | 842.0 | 1.45 |
| 4 pF | 761.5 | 775.0 | 1.77 | 830.0 | 843.0 | 1.57 |
| 2 pF | 767.0 | 776.0 | 1.17 | 830.0 | 844.5 | 1.75 |
| 1 pF | 772.5 | 777.5 | 0.65 | 830.0 | 847.5 | 2.11 |

On the other hand, as illustrated in the lower portion of FIG. 25, when the impedance element z1 is an inductor, the derivation of the above equation is omitted, but the resonant frequency (fr1) on the low frequency side is significantly shifted to the low frequency side as the inductance value of the inductor increases, and the resonant frequency (fr2) on the high frequency side is substantially constant regardless of the inductance value of the inductor. Further, the anti-resonant frequency (fa1) on the low frequency side shifts slightly to the lower frequency side as the inductance value of the inductor becomes larger, and the anti-resonant frequency (fa2) on the high frequency side shifts to the lower frequency side as the inductance value of the inductor is larger.

Therefore, in this case, the band width ratio (BWR1) on the low frequency side of the series arm circuit 11B becomes significantly larger as the inductance value of the inductor becomes larger. In this case, the band width ratio (BWR2) on the high frequency side becomes smaller as the inductance value of the inductor becomes larger.

Table 7 shows a series arm circuit in a case where the impedance element z1 is an inductor, namely a resonant frequency (fr1) on the low frequency side, an anti-resonant frequency (fa2) on the low frequency side, a band width ratio (BWR1) on the low frequency side, a resonant frequency (fr2) on the high frequency side, an anti-resonant frequency (fa2) on the high frequency side, and a band width ratio (BWR2) on the high frequency side. In FIG. 25, a case where the impedance value of the inductor is about 2 nH is omitted in order to simplify the explanation, but the numerical values in this case are also shown in Table 7. In addition, in the "-" field in the "inductance value" column in Table 7, the numerical values of the series arm circuit which is configured without the inductor, that is, defined by only the resonator are shown.

TABLE 7

| | Low Frequency Side | | | High Frequency Side | | |
|---|---|---|---|---|---|---|
| Inductance Value | Resonant Frequency fr1 (MHz) | Anti-Resonant Frequency fa1 (MHz) | Band Width Ratio BWR1 (%) | Resonant Frequency fr2 (MHz) | Anti-Resonant Frequency fa2 (MHz) | Band Width Ratio BWR2 (%) |
| — | 750.0 | 774.0 | 3.20 | 830.0 | 840.5 | 1.27 |
| 1 nH | 748.5 | 773.5 | 3.34 | 830.0 | 840.5 | 1.27 |
| 2 nH | 746.5 | 773.5 | 3.62 | 830.0 | 840.0 | 1.20 |
| 4 nH | 742.5 | 773.5 | 4.18 | 830.0 | 839.5 | 1.14 |
| 8 nH | 732.0 | 772.5 | 5.53 | 830.0 | 838.5 | 1.02 |
| 16 nH | 694.5 | 771.0 | 11.02 | 830.0 | 836.0 | 0.72 |

Figure 26:
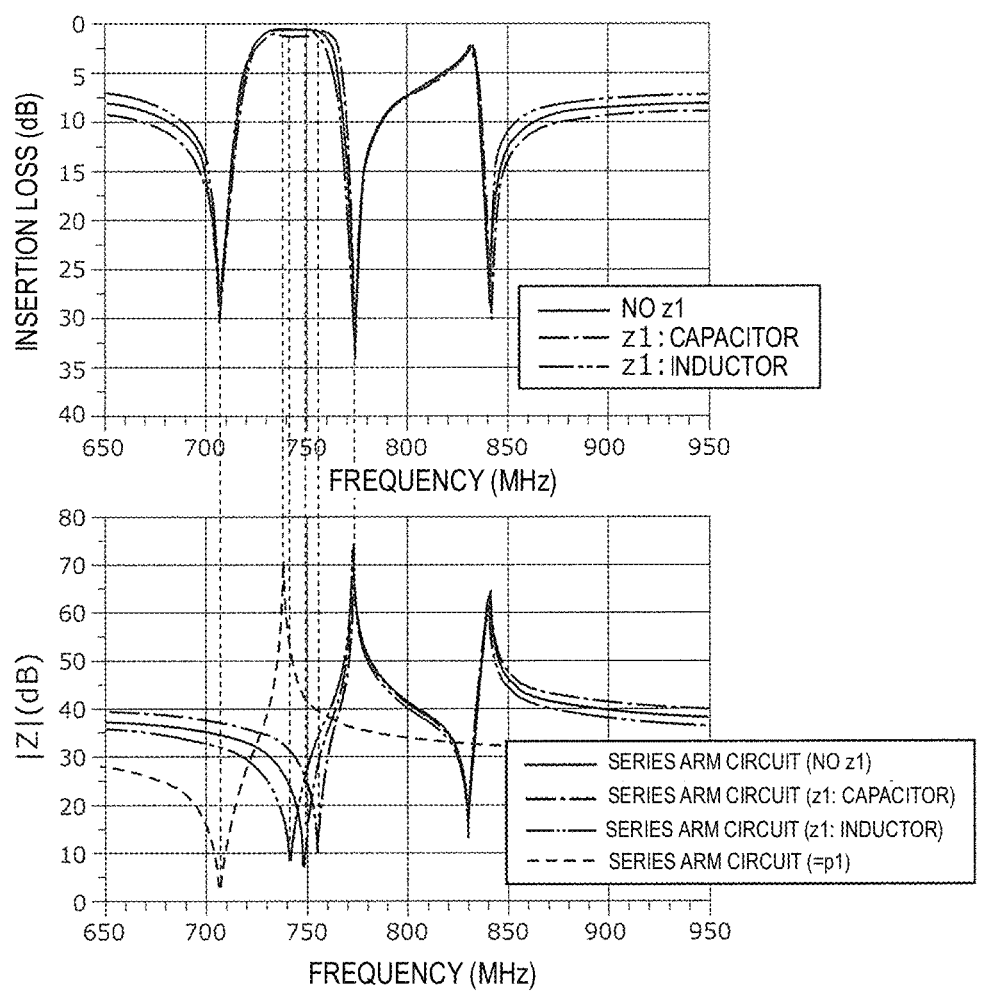
FIG. 26 includes graphs illustrating filter characteristics and impedance characteristics of the filter (first filter) according to Preferred Embodiment 2 of the present invention.

FIG. 26 includes graphs illustrating filter characteristics and impedance characteristics of the filter (first filter) according to Preferred Embodiment 2. In the upper portion of FIG. 26, the transmission characteristics (filter characteristics) when the impedance element z1 is not present, when the impedance element z1 is a capacitor having a capacitance value of about 8 pF, and when the impedance element z1 is an inductor having an inductance value of about 4 nH, are illustrated, and in the lower part, the resonance characteristics (impedance characteristics) of the series arm circuit 11B and the parallel arm circuit 12 (i.e., parallel arm resonator p1) when the impedance element z1 is not present, when the impedance element z1 is the capacitor having the capacitance value of about 8 pF, and when the impedance element z1 is the inductor having the inductance value of about 4 nH are illustrated.

Note that the circuit constant of the filter 10B (first filter) at this time is the same as the circuit constant of the filter (first filter) of Example 2 described in Preferred Embodiment 1. That is, the characteristic in the absence of the impedance element z1 is preferably equal or substantially equal to the characteristic in Example 2.

As described above, by the configuration of the impedance element z1, the band width ratio of the series arm circuit 11B is changed, and particularly, the band width ratio on the low frequency side is significantly changed. Thus, in the filter 10B, it is possible to adjust the steepness of the attenuation slope on the high frequency side of the pass band. Specifically, in the present preferred embodiment, as illustrated in the lower portion of the figure, the anti-resonant frequency on the low frequency side of the series arm circuit 11B is adjusted to a predetermined frequency, so that the pass band width is adjusted. Note that, the resonant frequency on the low frequency side of the series arm circuit 11B may be adjusted to a predetermined frequency, and in this case, the attenuation band may be adjusted. That is, according to the filter 10B of the present preferred embodiment, since the steepness of the attenuation slope on the high frequency side of the pass band is able to be adjusted by appropriately selecting the impedance element, it becomes possible to adjust the pass band width or the attenuation band.

Modification 1 of Preferred Embodiment 2

Figure 27:
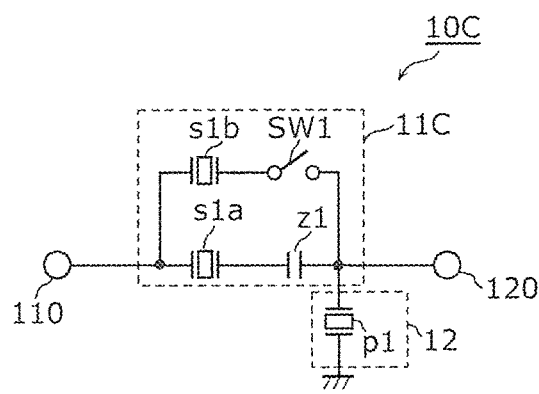
FIG. 27 is a circuit diagram of a filter (first filter) according to Modification 1 of Preferred Embodiment 2 of the present invention.

FIG. 27 is a circuit configuration diagram of a filter 10C according to Modification 1 of Preferred Embodiment 2. The filter 10C illustrated in the figure includes a series arm circuit 11C and the parallel arm circuit 12, and the series arm circuit 11C includes the series arm resonator s1a, the series arm resonator s1b, and a switch SW1. The filter 10C illustrated in FIG. 27 preferably differs from the filter 10B according to Preferred Embodiment 2 only in that the impedance element z1 is a capacitor and further includes the switch SW1. Hereinafter, the filter 10C according to the present modification will be described mainly with respect to the difference from the filter 10B according to Preferred Embodiment 2.

The series arm resonator s1a (first series arm resonator) is electrically connected between the input/output terminal 110 and the input/output terminal 120, and is an acoustic wave resonator having a resonant frequency within the pass band of the filter 10C (first filter).

The series arm resonator s1b (second series arm resonator) is an acoustic wave resonator which is electrically connected in parallel to a circuit in which the series arm resonator s1a and the impedance element z1 are electrically connected in series, and has a resonant frequency located on the higher frequency side with respect to the high frequency end of the pass band of the filter 10C.

The switch SW1 is a first switch which is electrically connected in series with the series arm resonator s1b.

The circuit in which the series arm resonator s1a and the impedance element z1 are electrically connected in series is electrically connected in parallel to the circuit in which the series arm resonator s1b and the switch SW1 are electrically connected in series.

The filter 10C configured as described above is capable of switching the frequency of the pass band and the frequency of the attenuation pole by switching on and off the switch SW1 in accordance with a control signal from a controller (not illustrated) such as an RFIC, for example.

For example, the controller selects one of on and off of the switch SW1 in the environment in which the Band-A is used, and selects the other of on and off of the switch SW1 in the environment in which the Band-B is used. That is, for the switch SW1, one of on and off is selected under certain circumstances, the on and off of the switch SW1 are fixed (unchanged) under this circumstance.

Figure 28:
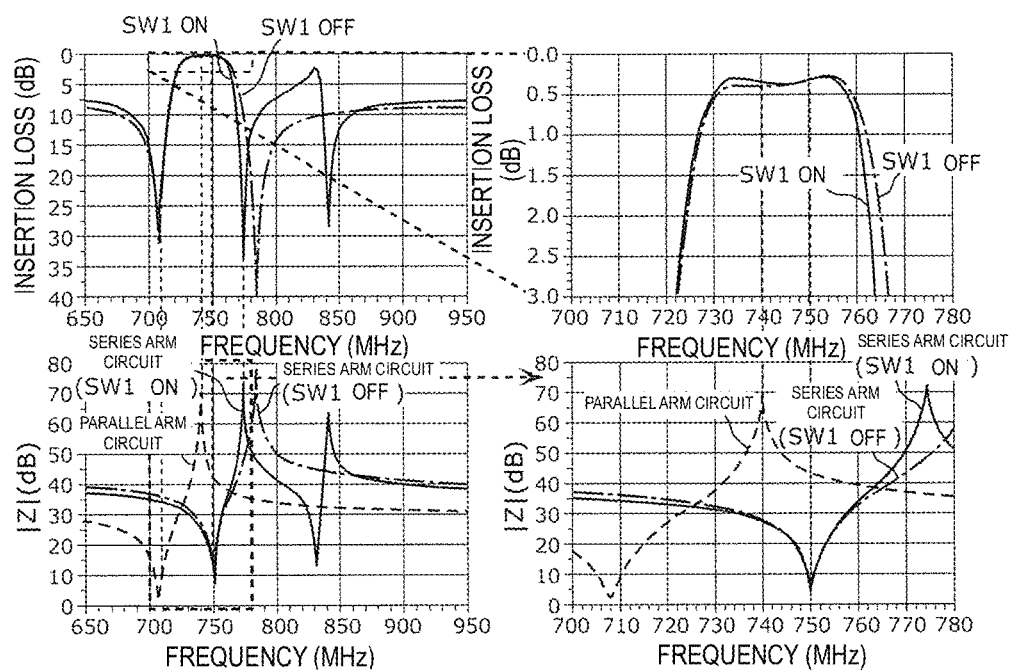
FIG. 28 includes graphs illustrating comparison between a case where a switch is in an on state and a case where a switch is in an off state, regarding various characteristics of the filter according to Modification 1 of Preferred Embodiment 2 of the present invention.

FIG. 28 includes graphs illustrating a comparison between a case in which the switch SW1 is on and a case in which the switch SW1 is off with regard to various characteristics of the filter 10C according to Modification 1 of Preferred Embodiment 2. Specifically, transmission characteristics of the filter 10C for on and off of the switch SW1 are illustrated in the upper portion of the left column of the figure, and resonance characteristics of the series arm circuit 11C and the parallel arm circuit 12 for on and off of the switch SW1 are illustrated in the lower portion of the left column. In the right column of FIG. 28, the characteristics in the pass band and the vicinity thereof in the graph illustrated in the left column are enlarged and illustrated.

The circuit constant of the filter 10C (first filter) at this time is the same or substantially the same as the circuit constant of the filter (first filter) of Example 2 described in Preferred Embodiment 1. Moreover, the capacitance value of the impedance element z1 (here, capacitor) is preferably about 8 pF, for example.

In the circuit illustrated in FIG. 27, when the switch SW1 is in a conduction (on) state, the series arm resonator s1b is electrically connected in parallel to the circuit in which the series arm resonator s1a and the impedance element z1 are electrically connected in series, so that the radio frequency signal input to the filter 10C is subjected to power distribution by the series arm resonator s1a and the impedance element z1 and the series arm resonator s1b. Therefore, according to the filter 10C of this modification, the bulk wave loss in the frequency band corresponding to the pass band of the filter 20 (second filter) is able to be reduced by combining characteristics of the series arm resonators s1a and s1b and the impedance element z1, so that the return loss in the frequency band is able to be reduced.

On the other hand, when the switch SW1 is in a non-conduction (off) state, as illustrated in FIG. 28, the anti-resonant frequency on the low frequency side of the series arm circuit 11C is shifted to the high frequency side. In this regard, since the anti-resonant frequency defines the attenuation pole on the high frequency side of the pass band of the filter 10C, the frequency at the high frequency end of the pass band and the frequency of the attenuation pole on the high frequency side of the pass band are able to be varied in accordance with the switching between on and off of the switch SW1.

According to the multiplexer including such a filter 10C (first filter), the loss in the pass band of the filter 20 (second filter) is able to be reduced by turning on the switch SW1. Therefore, when the Band (here, B26Rx) corresponding to the pass band of the filter 20 is selected in the multiplexer (i.e., when the filter 20 is selected), the switch SW1 of the filter 10C is turned on, such that the loss in the pass band of the filter 20 is able to be reduced to achieve high performance. According to the present modification, the frequency of the pass band of the filter 10C (first filter) and the frequency of the attenuation pole are able to be varied in accordance with on and off of the switch SW1. Therefore, a multiplexer corresponding to a larger number of bands is able to be realized. In other words, according to the present modification, since the frequency of the pass band and the attenuation band of the filter 10C (first filter) are able to be varied while reducing the loss in the pass band of the filter 20 (second filter), it is possible to achieve a low loss multiplexer corresponding to a larger number of bands. This advantageous effect is applied in a same or similar manner to a case where the impedance element z1 is not provided. For this reason, in the filter 10C, the impedance element Z1 may not be provided.

Modification 2 of Preferred Embodiment 2

Figure 29:
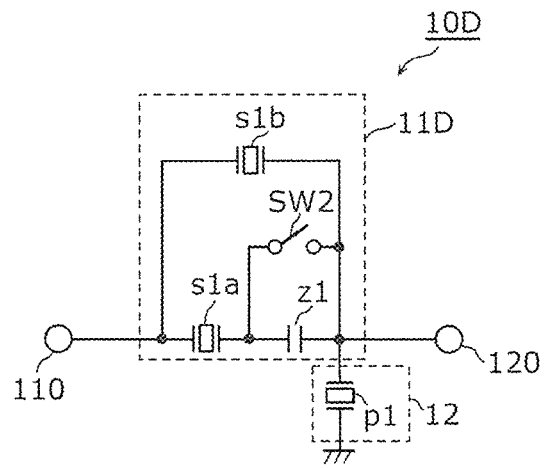
FIG. 29 is a circuit configuration diagram of a filter (first filter) according to Modification 2 of Preferred Embodiment 2 of the present invention.

FIG. 29 is a circuit configuration diagram of a filter 10D according to Modification 2 of Preferred Embodiment 2. The filter 10D illustrated in FIG. 29 includes a series arm circuit 11D and the parallel arm circuit 12, and the series arm circuit 11D includes the series arm resonator s1a, the series arm resonator s1b, the impedance element z1, and a switch SW2. The filter 10D illustrated in FIG. 29 preferably differs from the filter 10B according to Preferred Embodiment 2 only in that the impedance element z1 is a capacitor and further the filter 10D includes the switch SW2. Hereinafter, the filter 10D according to the present modification will be described mainly with respect to the difference from the filter 10B according to Preferred Embodiment 2.

The series arm resonator s1a (first series arm resonator) is electrically connected between the input/output terminal 110 and the input/output terminal 120, and is an acoustic wave resonator having a resonant frequency within the pass band of the filter 10D (first filter).

The series arm resonator s1b (second series arm resonator) is an acoustic wave resonator which is electrically connected in parallel to a circuit in which the series arm resonator s1a and the impedance element z1 are electrically connected in series, and has a resonant frequency located on the higher frequency side with respect to the high frequency end of the pass band of the filter 10D.

The impedance element z1 is a first impedance element which is electrically connected in series to the series arm resonator s1a.

The circuit in which the series arm resonator s1a and the impedance element z1 are electrically connected in series, and the series arm resonator s1b are electrically connected in parallel.

The switch SW2 is a second switch which is electrically connected in parallel to the impedance element z1.

The filter 10D configured as described above is able to vary the frequency of the pass band or the frequency of the attenuation pole by switching on and off the switch SW2 in accordance with a control signal from a controller (not illustrated) such as an RFIC, for example.

Figure 30:
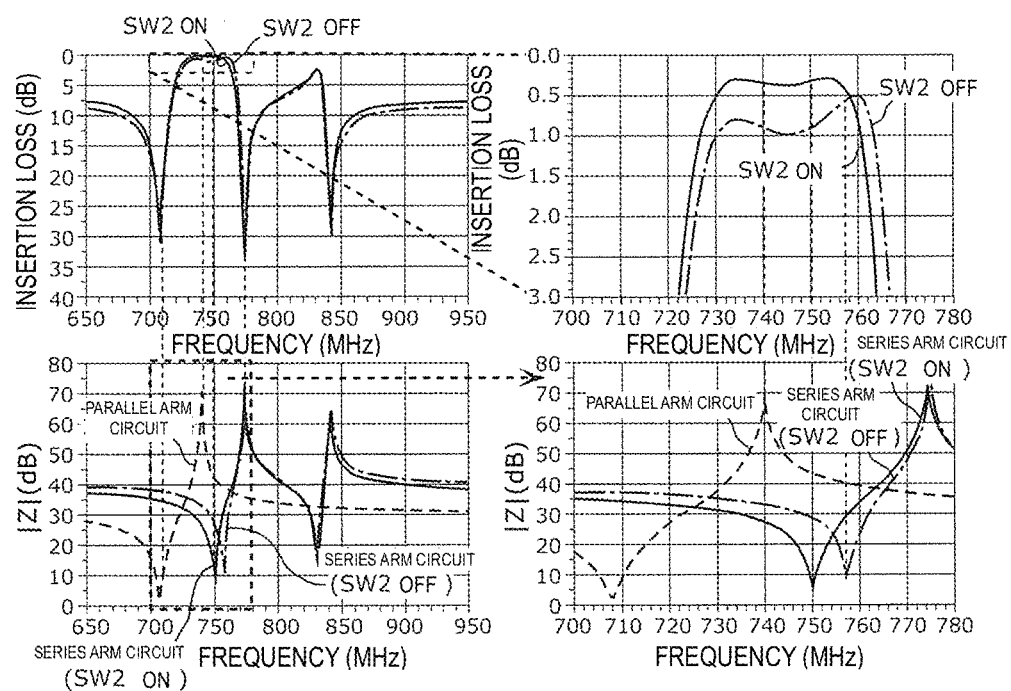
FIG. 30 includes graphs illustrating comparison between a case where a switch is in an on state and a case where the switch is in an off state, regarding various characteristics of the filter according to Modification 2 of Preferred Embodiment 2 of the present invention.

FIG. 30 includes graphs illustrating transmission characteristics and impedance characteristics of the filter 10D according to Modification 2 of Preferred Embodiment 2. Specifically, the transmission characteristics of the filter 10D used to turn on and off the switch SW2 are illustrated in the upper portion of left column of the figure, and resonance characteristics of the series arm circuit 11D and the parallel arm circuit 12 used to turn on and off the switch SW2 are illustrated in the lower portion of the left column. In the right column of the figure, the characteristics in the pass band and the vicinity thereof in the graph illustrated in the left column are enlarged and illustrated.

Note that the circuit constant of the filter 10D (first filter) at this time is the same or substantially the same as the circuit constant of the filter (first filter) of Example 2 described in Preferred Embodiment 1. Moreover, the capacitance value of the impedance element z1 (here, capacitor) is preferably about 8 pF, for example.

In the circuit illustrated in FIG. 29, when the switch SW2 is turned on, the impedance element z1 is short-circuited by the switch SW2, so that the circuit configuration is the same as that of the filter 10 of Preferred Embodiment 1, and the transmission characteristics and the resonance characteristics illustrated in FIG. 30 are similar to those of Preferred Embodiment 2 illustrated in FIG. 3. That is, when the switch SW2 is turned on, the bulk wave loss in the frequency band corresponding to the pass band of the filter 20 (second filter) is able to be reduced by the composite characteristics of the series arm resonators s1a and s1b and the impedance element z1, so that the return loss in the frequency band corresponding to the pass band of the filter 20 is able to be reduced.

On the other hand, when the switch SW2 is turned off, the circuit configuration is the same as that of the filter 10B (impedance element z1 is a capacitor) according to Preferred Embodiment 2, and as illustrated in FIG. 30, the transmission characteristics and the resonance characteristics are similar to the characteristics (z1: capacitor) of Preferred Embodiment 2 illustrated in FIG. 26. That is, as illustrated in the lower portion of FIG. 30, the resonant frequency on the low frequency side of the series arm circuit 11D shifts to the high frequency side as compared with the case in which the switch SW2 is in the on state. In this regard, since the resonant frequency defines the pass band of the filter 10D, the frequency at the high frequency end of the pass band is able to be varied in accordance with the switching between on and off of the switch SW2.

In this case, as in Preferred Embodiment 2, the radio frequency signal input to the filter 10D is subjected to power distribution by the series arm resonator s1a and the impedance element z1 and the series arm resonator s1b. Therefore, even in this case, by reducing the bulk wave loss due to the composite characteristics of the series arm resonators s1a and s1b and the impedance element z1, it is possible to reduce the return loss in the frequency band corresponding to the pass band of the filter 20.

According to the multiplexer including the filter 10D (first filter), the loss in the pass band of the filter 20 (second filter) is able to be reduced in any case whether the switch SW2 is turned on or off. In addition, the frequency at the high frequency end of the pass band of the filter 10D (first filter) is able to be varied in accordance with the switching between on and off of the switch SW2. That is, according to the present modification, the frequency at the high frequency end of the pass band of the filter 10D (first filter) is able to be varied while reducing the loss in the pass band of the filter 20 (second filter), so that it is possible to realize a low loss multiplexer corresponding to a larger number of bands.

Modification 3 of Preferred Embodiment 2

Figure 31:
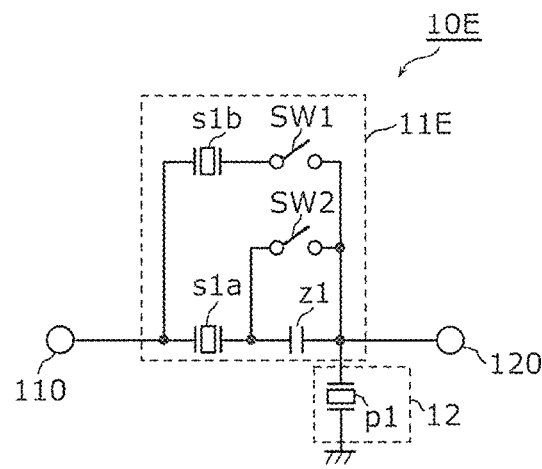
FIG. 31 is a circuit configuration diagram of a filter (first filter) according to Modification 3 of Preferred Embodiment 2 of the present invention.

FIG. 31 is a circuit configuration diagram of a filter 10E according to Modification 3 of Preferred Embodiment 2. The filter 10E illustrated in FIG. 31 includes a series arm circuit 11E and the parallel arm circuit 12, and the series arm circuit 11E includes the series arm resonator s1a, the series arm resonator s1b, the impedance element z1, and the switches SW1 and SW2. The filter 10E illustrated in FIG. 31 differs from the filter 10B according to Preferred Embodiment 2 only in that the impedance element z1 is a capacitor and further the filter 10E includes the switches SW1 and SW2. Hereinafter, the filter 10E according to the present modification will be described mainly with respect to the point different from that of Preferred Embodiment 2.

The series arm resonator s1a (first series arm resonator) is electrically connected between the input/output terminal 110 and the input/output terminal 120, and is an acoustic wave resonator having a resonant frequency within the pass band of the filter 10E (first filter).

The series arm resonator s1b is a second series arm resonator which is electrically connected to the series arm resonator s1a.

The switch SW1 is the first switch which is electrically connected in series to the series arm resonator s1b.

The switch SW2 is the second switch which is electrically connected in parallel to the impedance element Z1.

A circuit in which the series arm resonator s1a and the impedance element z1 are electrically connected in series is electrically connected in parallel to a circuit in which the series arm resonator s1b and the switch SW1 are electrically connected in series.

Figure 32:
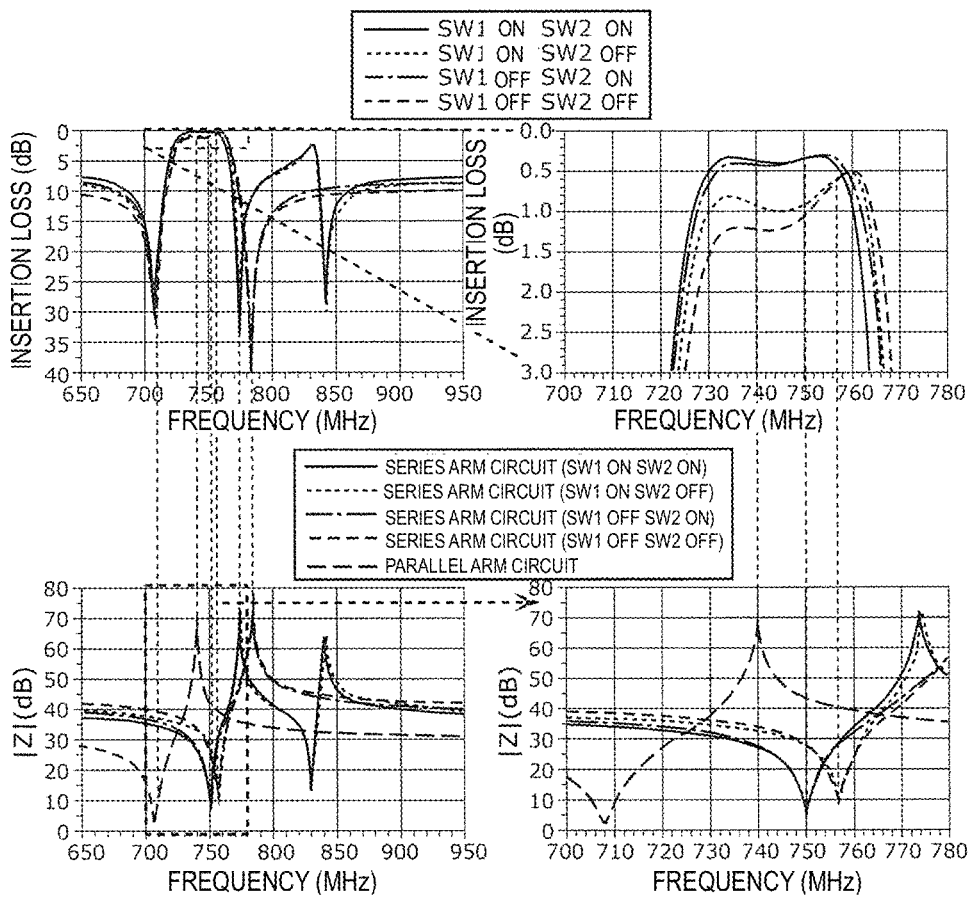
FIG. 32 includes graphs illustrating comparison between a case where a switch is in an on state and a case where the switch is in an off state, regarding various characteristics of the filter according to Modification 3 of Preferred Embodiment 2 of the present invention.

FIG. 32 includes graphs illustrating transmission characteristics and impedance characteristics of the filter 10E according to Modification 3 of Preferred Embodiment 2. Specifically, the transmission characteristics of the filter 10E for turning on and off the switches SW1 and SW2 are illustrated in the upper portion of the left column of the figure, and resonance characteristics of the series arm circuit 11E and the parallel arm circuit 12 for turning on and off the switches SW1 and SW2 are illustrated in the lower portion of the left column. In the right column of the figure, the characteristics in the pass band and the vicinity thereof in the graph illustrated in the left column are enlarged and illustrated.

The circuit constant of the filter 10E (first filter) at this time is the same or substantially the same as the circuit constant of the filter (first filter) of Example 2 described in Preferred Embodiment 1. Moreover, the capacitance value of the impedance element z1 (here, capacitor) is preferably about 8 pF, for example.

In the circuit illustrated in FIG. 31, when the switch SW1 is turned on and the switch SW2 is turned on, the same circuit configuration as that of the filter 10 according to Example 2 of Preferred Embodiment 1 is obtained. Further, when the switch SW1 is turned on and the switch SW2 is turned off, the same circuit configuration as that of the filter 10B according to Preferred Embodiment 2 is obtained. Further, when the switch SW1 is turned off and the switch SW2 is turned on, the same circuit configuration as that of the filter according to Comparative Example 2 is obtained. In other words, in this case, the circuit configuration is obtained in which the series arm resonator s1b is not provided in the filter 10 according to Preferred Embodiment 1. In addition, when the switch SW1 is turned off and the switch SW2 is turned off, the circuit configuration is the same as that of the filter 10C according to Modification 1 of Preferred Embodiment 2 when the switch SW1 is turned off. That is, by switching the on and off states of the switches SW1 and SW2, the frequency at the high frequency end of the pass band and the frequency of the attenuation pole on the high frequency side of the pass band are able to be varied. When the switch SW1 is in a conduction (on) state, the radio frequency signal input to the filter 10E is subjected to power distribution by at least the series arm resonator s1a and the series arm resonator s1b. Therefore, in this case, the bulk wave loss in the frequency band corresponding to the pass band of the filter 20 (second filter) is able to be reduced, so that the return loss in the frequency band is able to be reduced.

According to the multiplexer including such a filter 10E (first filter), by switching on and off of the switch SW1 and the switch SW2, the frequency at the high frequency end of the pass band and the frequency of the attenuation pole on the high frequency side of the pass band of the filter 10E (first filter) is able to be varied while reducing the loss in the pass band of the filter 20 (second filter), so that it is possible to achieve a low loss multiplexer corresponding to a larger number of bands.

Preferred Embodiment 3

In Preferred embodiments 1 and 2, although the parallel arm circuit of the first filter is defined by only one parallel arm resonator, the first filter including a parallel arm circuit to which circuit elements other than the parallel arm resonator are added will be described in the present preferred embodiment.

Figure 33:
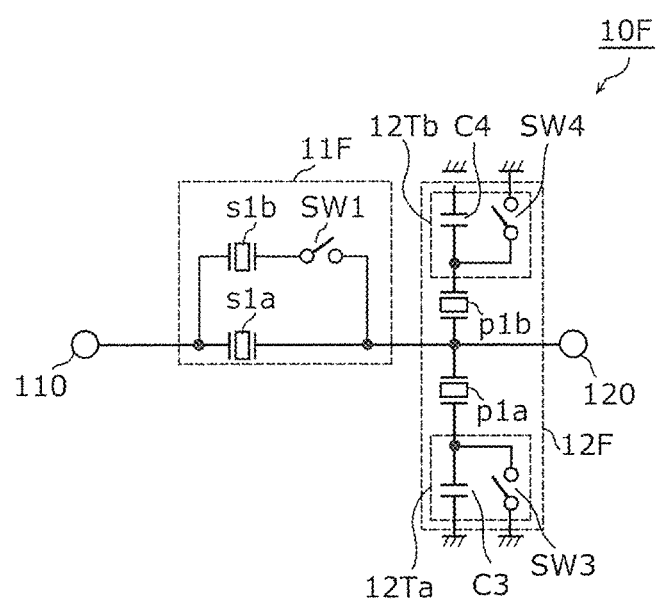
FIG. 33 is a circuit configuration diagram of a filter according to Preferred Embodiment 3 of the present invention.

FIG. 33 is a circuit configuration diagram of a filter 10F according to Preferred Embodiment 3. The filter 10F illustrated in the figure preferably includes a series arm circuit 11F and a parallel arm circuit 12F. The series arm circuit 11F includes the series arm resonator s1a, the series arm resonator s1b, and the switch SW1. The parallel arm circuit 12F includes a parallel arm resonator p1a, a first frequency variable circuit 12Ta, a parallel arm resonator p1b, and a second frequency variable circuit 12Tb. The filter 10F illustrated in FIG. 33 differs from the filter 10 according to Preferred Embodiment 1 in the circuit configuration of the series arm circuit 11F and the parallel arm circuit 12F. Hereinafter, the filter 10F according to the present preferred embodiment will be described mainly with respect to the difference from the filter 10 according to Preferred Embodiment 1.

The series arm resonator s1a (first series arm resonator) is electrically connected between the input/output terminal 110 and the input/output terminal 120, and is an acoustic wave resonator having a resonant frequency within the pass band of the filter 10F (first filter).

The series arm resonator s1b (second series arm resonator) is an acoustic wave resonator having a resonant frequency located on a higher frequency side with respect to a high frequency end of the pass band of the filter 10F.

The switch SW1 is the first switch which is electrically connected in series to the series arm resonator s1b.

The series arm resonator s1a is electrically connected in parallel to a circuit in which the series arm resonator s1b and the switch SW1 are electrically connected in series.

The parallel arm resonator p1a is a first parallel arm resonator electrically connected between the node on the series arm and the ground. The parallel arm resonator p1a has a resonant frequency located on a lower frequency side with respect to a frequency at a low frequency end of the pass band of the filter 10F (first filter), and corresponds to the parallel arm resonator p1 of the filter 10 according to Preferred Embodiment 1.

The first frequency variable circuit 12Ta is electrically connected to the parallel arm resonator p1a, and in the present preferred embodiment, includes a capacitor C3 (second impedance element) electrically connected in series to the parallel arm resonator p1a (first parallel arm resonator), and a switch SW3 (third switch) electrically connected in parallel to the capacitor C3. The first frequency variable circuit 12Ta is able to vary at least one of the resonant frequency and the anti-resonant frequency of the parallel arm circuit 12F by switching on and off of the switch SW3.

The parallel arm resonator p1b is preferably a second parallel arm resonator electrically connected between the node on the series arm and the ground. That is, the parallel arm resonator p1a and the parallel arm resonator p1b are electrically connected to the same node on the series arm.

The parallel arm resonator p1b has a resonant frequency located on a higher frequency side with respect to the resonant frequency of the parallel arm resonator p1a, and has a resonant frequency located on a higher frequency side with respect to the resonant frequency of the parallel arm resonator p1a, for example.

The second frequency variable circuit 12Tb is electrically connected to the parallel arm resonator p1b, and in the present preferred embodiment, includes a capacitor C4 (third impedance element) electrically connected in series to the parallel arm resonator p1b (second parallel arm resonator), and a switch SW4 (fourth switch) electrically connected in parallel to the capacitor C4. The second frequency variable circuit 12Tb is able to vary at least one of the resonant frequency and the anti-resonant frequency of the parallel arm circuit 12F by switching on and off of the switch SW4.

Here, a circuit in which the parallel arm resonator p1a and the first frequency variable circuit 12Ta are electrically connected in series, and a circuit in which the parallel arm resonator p1b and the second frequency variable circuit 12Tb are electrically connected in series are electrically connected in parallel.

In the present preferred embodiment, the capacitor C3 is described as an example of the second impedance element electrically connected in series to the parallel arm resonator p1a (the first parallel arm resonator), but the second impedance element is not limited to this, and, for example, an inductor may be used instead.

In the present preferred embodiment, the first frequency variable circuit 12Ta is electrically connected between the parallel arm resonator p1a and the ground, and the second frequency variable circuit 12Tb is electrically connected between the parallel arm resonator p1b and the ground. That is, the parallel arm resonators p1a and p1b are preferably electrically connected to the side of the series arm, and the capacitors C3 and C4 and the switches SW3 and SW4 are electrically connected to the ground side. However, the connection order is not particularly limited, and the connection order may be reversed. In this regard, however, when the connection order is reversed, the loss in the pass band of the filter 10F becomes worse. In addition, when the parallel arm resonators p1a and p1b are provided in the resonator chip (package) together with the other acoustic wave resonators, the size of the chip is increased due to the increase in the number of terminals of the chip. Therefore, from the viewpoint of filter characteristics and miniaturization, connection is preferably performed in the connection order according to the present preferred embodiment.

In Preferred Embodiment 1, for the model in which capacitors (frequency variable circuits) are electrically connected in series to the resonators res1 and res2, the circuit (circuit A) in which the resonator res1 and the series circuit of the resonator res2 and the capacitor Cx are electrically connected in parallel is assumed to be analyzed. In the following description, an analysis is performed by assuming a configuration in which the capacitor Cx is electrically connected in series to the resonator res2, and a capacitor Cy is electrically connected in series to the resonator res1, that is, a circuit (circuit B) in which a series circuit of the resonator res1 and the capacitor Cy and a series circuit of the resonator res2 and the capacitor Cx are electrically connected in parallel.

(iv) In a case of resonant frequency $fr_{res1}$<resonant frequency $fr_{res2}$, since two resonant frequencies frL (low frequency side) and frH (high frequency side) of the circuit B are the frequencies at which the impedance of the circuit B becomes 0, and therefore, the frequencies are expressed by Equation 29 and Equation 30 by solving Equation 27 and Equation 28.

Equation 27

$$Z_{rL} = 0 = \cfrac{1}{\cfrac{1}{\cfrac{1}{j\omega_{rL}C_{01}} + j\omega_{rL}L_1 + \cfrac{1}{j\omega_{rL}C_1}}} + \cfrac{1}{j\omega_{rL}C_y} \quad \text{(Equation 27)}$$

Equation 28

$$Z_{rH} = 0 = \cfrac{1}{\cfrac{1}{\cfrac{1}{j\omega_{rH}C_{02}} + j\omega_{rH}L_2 + \cfrac{1}{j\omega_{rH}C_2}}} + \cfrac{1}{j\omega_{rH}C_x} \quad \text{(Equation 28)}$$

Equation 29

$$f_{rL} = \frac{\sqrt{\frac{C_{01} + C_1 + C_y}{L_1 C_1 C_y + L_1 C_{01} C_1}}}{2\pi} \quad \text{(Equation 29)}$$

Equation 30

$$f_{rH} = \frac{\sqrt{\frac{C_{02} + C_2 + C_x}{L_2 C_2 C_x + L_2 C_{02} C_2}}}{2\pi} \quad \text{(Equation 30)}$$

(v) In a case of resonant frequency $fr_{res1}$>resonant frequency $fr_{res2}$, two resonant frequencies frL (low frequency side) and frH (high frequency side) of the circuit B are frequencies at which the impedance of the circuit B becomes 0, and therefore, the frequencies are expressed by Equation 33 and Equation 34 by solving Equation 31 and Equation 32.

Equation 31

$$Z_{rL} = 0 = \cfrac{1}{\cfrac{1}{\cfrac{1}{j\omega_{rL}C_{02}} + j\omega_{rL}L_2 + \cfrac{1}{j\omega_{rL}C_2}}} + \cfrac{1}{j\omega_{rL}C_x} \quad \text{(Equation 31)}$$

Equation 32

$$Z_{rH} = 0 = \cfrac{1}{\cfrac{1}{\cfrac{1}{j\omega_{rH}C_{01}} + j\omega_{rH}L_1 + \cfrac{1}{j\omega_{rH}C_1}}} + \cfrac{1}{j\omega_{rH}C_y} \quad \text{(Equation 32)}$$

Equation 33

$$f_{rL} = \frac{\sqrt{\frac{C_{02} + C_2 + C_x}{L_2 C_2 C_x + L_2 C_{02} C_2}}}{2\pi} \quad \text{(Equation 33)}$$

Equation 34

$$f_{rH} = \frac{\sqrt{\frac{C_{01} + C_1 + C_y}{L_1 C_1 C_y + L_1 C_{01} C_1}}}{2\pi} \quad \text{(Equation 34)}$$

(vi) Also, since two anti-resonant frequencies faL (low frequency side) and faH (high frequency side) of the circuit B are frequencies at which the admittance Ya of the circuit B becomes 0, the frequencies are expressed by Equation 36 by solving Equation 35.

Equation 35

$$Y_a = 0 = \cfrac{1}{\cfrac{1}{\cfrac{1}{j\omega_a C_{01}} + j\omega_a L_1 + \cfrac{1}{j\omega_a C_1}}} + \cfrac{1}{j\omega_a C_y} + \cfrac{1}{\cfrac{1}{\cfrac{1}{j\omega_a C_{02}} + j\omega_a L_2 + \cfrac{1}{j\omega_a L_2}}} + \cfrac{1}{j\omega_a C_x} \quad \text{(Equation 35)}$$

Equation 36

$$f_{aL} = \frac{\sqrt{\frac{-B - \sqrt{B^2 - 4AC}}{2A}}}{2\pi} \quad \text{(Equation 36)}$$

$$f_{aH} = \frac{\sqrt{\frac{-B + \sqrt{B^2 - 4AC}}{2A}}}{2\pi}$$

$$A = L_1 L_2 C_{01} C_{02} C_1 C_2 (C_y + C_x) + \\ L_1 L_2 C_1 C_2 C_x C_y (C_{01} + C_{02})$$

$$B = C_x C_y (L_1 C_{01} C_1 + L_2 C_{02} C_2 + L_2 C_{01} C_2 + L_1 C_{02} C_1) + \\ C_{01} C_{02} (L_1 C_{01} C_y + L_2 C_2 C_x + L_2 C_2 C_y + L_1 C_1 C_x) + \\ C_1 C_2 (L_1 C_{01} C_y + L_2 C_{02} C_x + L_2 C_x C_y + \\ L_2 C_{02} C_y + L_1 C_x C_y + L_1 C_{01} C_x)$$

$$C = C_x C_y (L_2 C_{01} C_2 + L_1 C_{02} C_1) + \\ C_{01} C_{02} (L_2 C_2 C_y + L_1 C_1 C_x) + \\ C_1 C_2 (L_2 C_x C_y + L_2 C_{02} c_y + L_1 C_x C_y + L_1 C_{01} C_x)$$

Figure 34A:
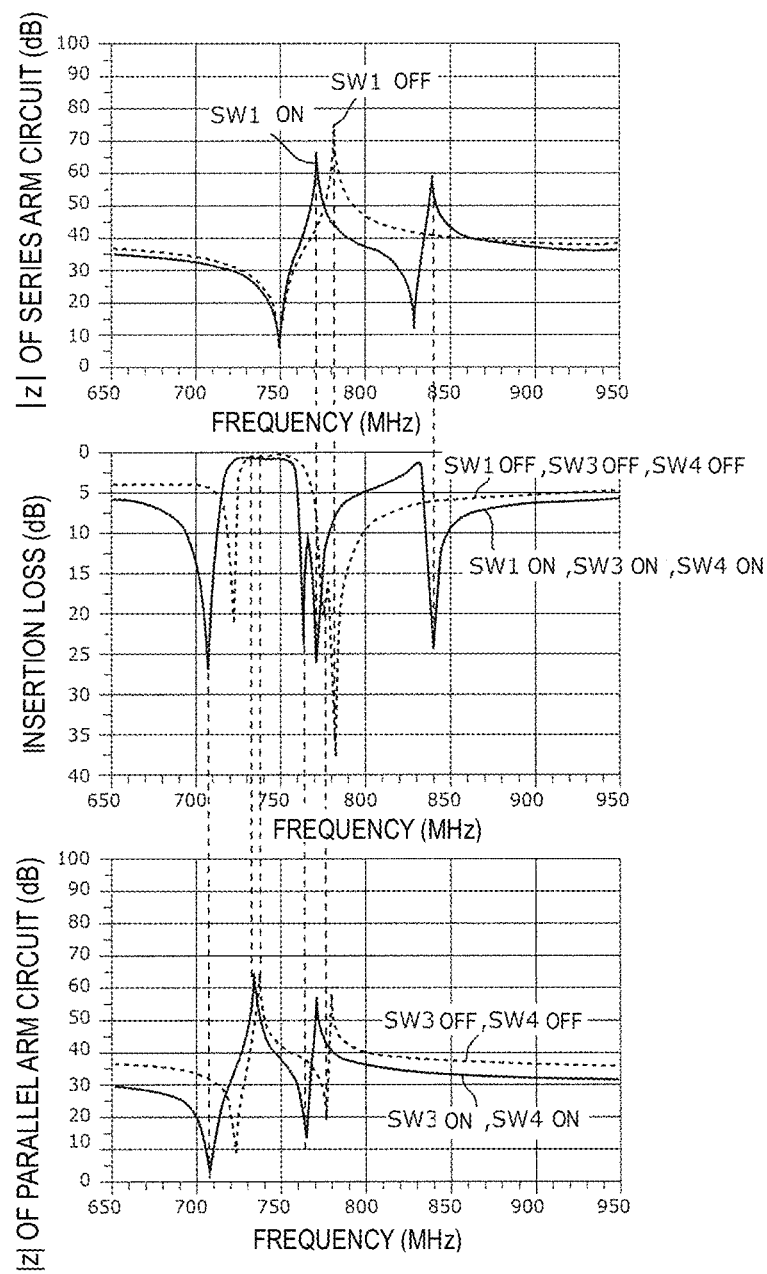
FIG. 34A includes graphs illustrating comparison between a case where a switch is in an on state and a case where the switch is in an off state, regarding various characteristics of the filter according to Preferred Embodiment 3 of the present invention.
Figure 34B:
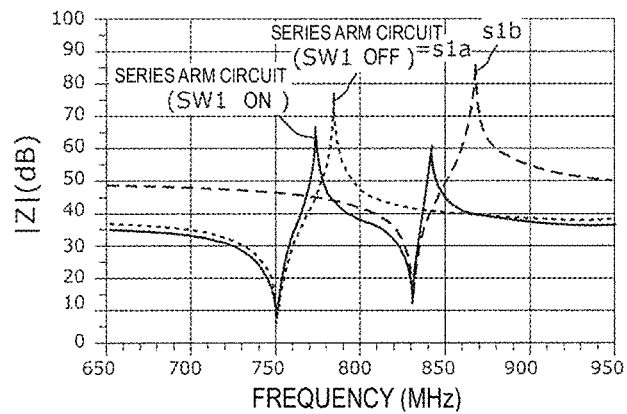
FIG. 34B is a graph illustrating impedance characteristics relating to a series arm circuit in Preferred Embodiment 3 of the present invention.
Figure 34C:
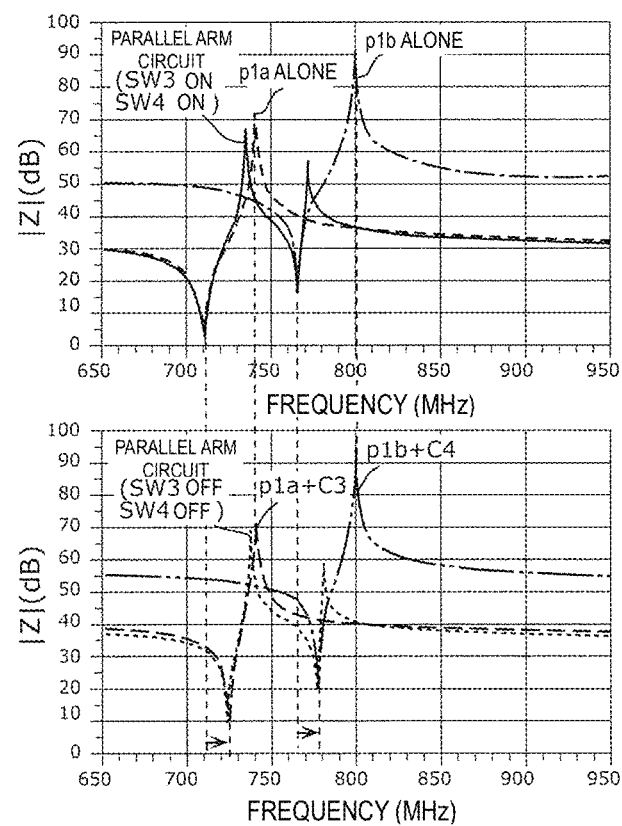
FIG. 34C includes graphs illustrating impedance characteristics relating to a parallel arm circuit in Preferred Embodiment 3 of the present invention.

FIGS. 34A to 34C include graphs illustrating various characteristics of the filter 10F (first filter) according to Preferred Embodiment 3, and FIG. 34A includes graphs illustrating characteristics of the filter 10F when all of the switches SW1, SW3, and SW4 are turned on or off. Specifically, the upper portion of the figure illustrates the impedance characteristics of the series arm circuit 11F for on and off of the switch SW1, the lower portion of the figure illustrates the impedance characteristics of the parallel arm circuit 12F for on and off of the switches SW3 and SW4, and the middle portion of the figure illustrates the filter characteristics for on and off of the switches SW1, SW3 and SW4. FIG. 34B is a graph illustrating impedance characteristics for the series arm circuit 11F. Specifically, the impedance characteristics of the series arm resonators s1a and s1b alone defining the series arm circuit 11F and the impedance characteristics of the series arm circuit 11F for turning on and off the switch SW1 are illustrated in the figure. FIG. 34C includes graphs illustrating impedance characteristics for the parallel arm circuit 12F. Specifically, impedance characteristics for the parallel arm circuit 12F when the switches SW3 and SW4 are on are illustrated in the upper portion of the figure, and impedance characteristics for the parallel arm circuit 12F when the switches SW3 and SW4 are off are illustrated in the lower portion of the figure.

As illustrated in FIG. 34B, in the series arm circuit 11F, the numbers of resonant frequencies and anti-resonant frequencies change according to the switching of the switch SW1 between on and off, and the anti-resonant frequency defining the attenuation pole of the high frequency side of the pass band of the filter 10F is able to vary.

Specifically, when the switch SW1 is in the conduction (on) state, the series arm resonator s1b is electrically connected in parallel to the series arm resonator s1a, so that the series arm circuit 11F exhibits a combined impedance characteristic of the series arm resonator s1a and the series arm resonator s1b, and has two resonant frequencies and two anti-resonant frequencies.

On the other hand, when the switch SW1 is in the non-conduction (off) state, the series arm circuit 11F has characteristics equivalent to those of the series arm resonator s1a.

Accordingly, when the switch SW1 is switched from on to off, the anti-resonant frequency on the low frequency side is able to be varied to the high frequency side.

As illustrated in FIG. 34C, in the parallel arm circuit 12F, the resonant frequency on the low frequency side and the resonant frequency on the high frequency side are able to be varied in accordance with the switching between on and off of the switches SW3 and SW4.

Specifically, when both of the switches SW3 and SW4 are in the conduction (on) state, the parallel arm circuit 12F has a circuit configuration in which the parallel arm resonator p1a and the parallel arm resonator p1b are electrically connected in parallel. Therefore, the resonant frequency of the parallel arm circuit 12F is equal to the resonant frequency of the parallel arm resonator p1a and the resonant frequency of the parallel arm resonator p1b, and the anti-resonant frequency of the parallel arm circuit 12F is lower than each of the anti-resonant frequency of the parallel arm resonator p1a and the anti-resonant frequency of the parallel arm resonator p1b.

On the other hand, when the switches SW3 and SW4 are in the non-conduction (off) state, the parallel arm circuit 12F is a circuit having a configuration in which the capacitor C3 is electrically connected in series to the parallel arm resonator p1a and the capacitor C4 is electrically connected in series to the parallel arm resonator p1b, that is, a circuit in which a series circuit of the parallel arm resonator p1a and the capacitor C3 and a series circuit of the parallel arm resonator p1b and the capacitor C4 are electrically connected in parallel. Therefore, in this case, the resonant frequency of the parallel arm circuit 12F is expressed by Equation 33 and Equation 34 above described, and the capacitance value of the capacitor is shifted to the higher frequency side as the capacitance value becomes smaller.

In other words, when both of the switches SW3 and SW4 are turned on, two resonant frequencies and two anti-resonant frequencies are generated depending on the combined characteristics of the parallel arm resonator p1a and the parallel arm resonator p1b. When both of the switches SW3 and SW4 are off, the resonant frequency is shifted to the high frequency side in the impedance characteristic on the parallel arm resonator p1a and the capacitor C3 side, and the resonant frequency is shifted to the high frequency side also in the impedance characteristic on the parallel arm resonator p1b and the capacitor C4 side. Therefore, in the parallel arm circuit 12F, characteristics of the parallel arm resonator p1a and the capacitor C3 are combined with those of the parallel arm resonator p1b and the capacitor C4, so that two resonant frequencies and two anti-resonant frequencies are respectively generated, and the resonant frequency on the lower frequency side is shifted to the higher frequency side as compared with the case where both of the switches SW3 and SW4 are on.

Therefore, as illustrated in FIG. 34A, by switching on and off of the switches SW1, SW3 and SW4, all of the frequency at the low frequency end of the pass band, the attenuation pole on the low frequency side of the pass band, the frequency at the high frequency end of the pass band, and the attenuation pole on the high frequency side of the pass band are able to be varied.

Note that on and off of the switches SW1, SW3 and SW4 may be switched individually.

Figure 35:
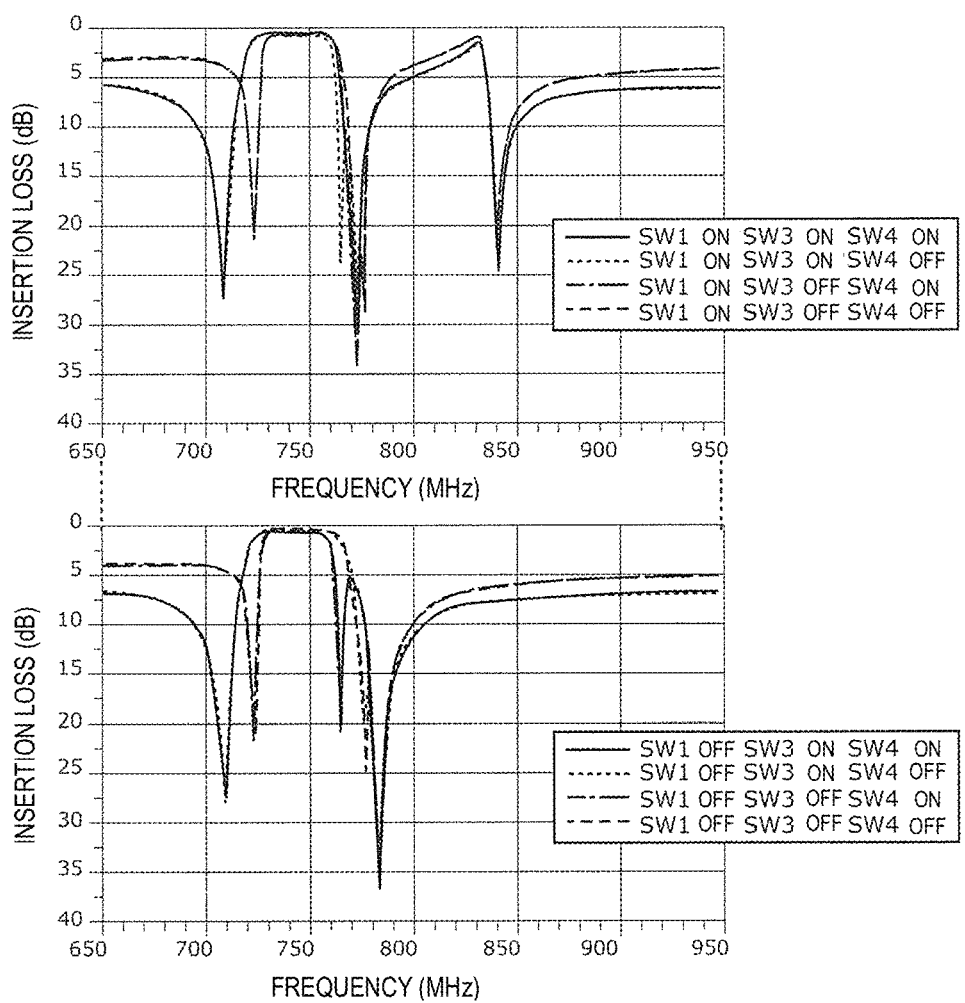
FIG. 35 includes graphs illustrating changes in filter characteristics when switches are individually switched between on and off in Preferred Embodiment 3 of the present invention.

FIG. 35 includes graphs illustrating a change in filter characteristics when the switches SW1, SW3 and SW4 of the filter 10F according to Preferred Embodiment 3 are switched on and off individually. Specifically, the filter characteristics when the switch SW1 is turned on, and on and off of the switches SW3 and SW4 are individually switched are illustrated in the upper portion of the figure, and the filter characteristics when the switch SW1 is turned off, and on and off of the switches SW3 and SW4 are individually switched are illustrated in the lower portion of the figure.

As illustrated in the figure, the filter 10F is able to vary the frequency at the low frequency end of the pass band, the attenuation pole on the low frequency side of the pass band, the frequency at the high frequency end of the pass band, the attenuation pole on the high frequency side of the pass band, and the like by appropriately switching on and off of the switches SW1, SW3, and SW4. That is, frequencies for the attenuation band, the pass band, and the like are variable, such as varying the bandwidth or varying the center frequency. Therefore, it is possible to provide a filter characteristic conforming to the required frequency specifications.

Specifically, in accordance with the switching on and off of the switch SW3 (third switch), both the resonant frequency on the low frequency side and the anti-resonant frequency on the low frequency side of the parallel arm circuit 12F are able to be switched, so that the frequency of the attenuation pole on the low frequency side of the pass band is able to be switched while reducing the loss at the low frequency end of the pass band. Further, in accordance with the switching on and off of the switch SW4 (fourth switch), the resonant frequency on the high frequency side and the anti-resonant frequency on the low frequency side of the parallel arm circuit 12F are able to be switched, so that the frequency of the attenuation pole on the high frequency side of the pass band is able to be switched while reducing the loss at the high frequency end of the pass band.

Modification of Preferred Embodiment 3

The configuration of the parallel arm circuit 12F is not limited to the configuration described above, and may be configured as follows, for example.

For example, the parallel arm circuit may be defined by only the parallel arm resonator p1a and the parallel arm resonator p1b. That is, the parallel arm circuit includes the parallel arm resonator p1a (first parallel arm resonator) electrically connected between the node on the series arm and the ground, and the parallel arm resonator p1b (second parallel arm resonator) electrically connected in parallel to the parallel arm resonator p1a, and the resonant frequency of the parallel arm resonator p1b is higher than the resonant frequency of the parallel arm resonator p1a.

According to such a parallel arm circuit, the frequency difference between the anti-resonant frequency on the lowest frequency side and the resonant frequency on the lowest frequency side of the parallel arm circuit are able to be made narrower than the frequency difference between the anti-resonant frequency and the resonant frequency of the parallel arm resonator p1a alone, and a new resonant frequency is generated on the high frequency side of the anti-resonant frequency on the lowest frequency side. Therefore, the steepness of the filter 10F on both sides of the pass band is improved.

Further, for example, the parallel arm circuit may be defined by only the parallel arm resonator p1a and the capacitor C3 (second impedance element). That is, the parallel arm circuit includes the parallel arm resonator p1a (first parallel arm resonator) electrically connected between the node on the series arm and the ground, and the capacitor C3 electrically connected in series to the parallel arm resonator p1a, and the resonant frequency of the parallel arm resonator p1a is lower than the frequency at the low frequency end of the pass band of the filter 10F.

According to such a parallel arm circuit, since the frequency difference between the anti-resonant frequency of the parallel arm circuit and the resonant frequency is able to be adjusted by appropriately selecting the capacitor C3 (the second impedance element), it is possible to adjust the steepness of the attenuation slope on the low frequency side of the pass band. Therefore, the pass band width or the frequency of the attenuation pole on the low frequency side of the pass band is able to be set as appropriate.

For example, the parallel arm circuit may include the switch SW3 (third switch) in addition to the parallel arm resonator p1a and the capacitor C3 (second impedance element). That is, the parallel arm circuit further includes the switch SW3 electrically connected in parallel to the capacitor C3 (second impedance element), and the parallel arm resonator p1a and the capacitor C3 define a first frequency variable circuit for varying at least one of the resonant frequency and the anti-resonant frequency of the parallel arm circuit.

According to this configuration, since the resonant frequency of the parallel arm circuit is able to be varied in accordance with the switching of the switch SW3 between on and off, it is possible to switch the frequency of the attenuation pole of the filter (first filter).

For example, the parallel arm circuit may preferably include the parallel arm resonator p1a, the capacitor C3 (second impedance element), and the switch SW3 (third switch), and additionally include the parallel arm resonator p1b (second parallel arm resonator) electrically connected between the node on the series arm and the ground. Here, the parallel arm resonator p1b and the circuit in which the parallel arm resonator p1a and the first frequency variable circuit 12Ta are electrically connected in series are electrically connected in parallel, and the resonant frequency of the parallel arm resonator p1b is higher than the resonant frequency of the parallel arm resonator p1a.

According to this configuration, the resonant frequency on the lowest frequency side and the anti-resonant frequency on the lowest frequency side of the parallel arm circuit are able to be switched (varied) in accordance with the switching between on and off of the switch SW3. Therefore, since both the frequency of the attenuation pole on the low frequency side of the pass band and the frequency at the low frequency end of the pass band are able to be varied with respect to the filter (first filter), it is possible to switch the frequency of the attenuation pole on the low frequency side of the pass band while reducing the loss at the low frequency end of the pass band of the filter (first filter).

For example, the parallel arm circuit may include the parallel arm resonator p1a, the capacitor C3 (second impedance element) and the switch SW3 (third switch), and additionally include the parallel arm resonator p1b (second parallel arm resonator) electrically connected between the node on the series arm and the ground, and a switch SW4 (fourth switch) electrically connected in series to the parallel arm resonator p1b. Here, the circuit in which the parallel arm resonator p1b and the switch SW4 are electrically connected in series is electrically connected in parallel to the circuit in which the parallel arm resonator p1a and the first frequency variable circuit 12Ta are electrically connected in series, and the resonant frequency of the parallel arm resonator p1b is higher than the resonant frequency of the parallel arm resonator p1a.

According to this configuration, the numbers of the resonant frequencies on the high frequency side and the anti-resonant frequencies of the parallel arm circuit are varied in accordance with the switching between on and off of the switch SW4, whereby the number of attenuation poles on the high frequency side of the pass band of the filter (first filter) is switched. In addition, according to the switching of the switch SW3 between on and off, the resonant frequency on the lowest frequency side and the anti-resonant frequency on the lowest frequency side of the parallel arm circuit each are varied, so that the frequency at the low frequency end of the pass band of the filter (first filter) and the frequency of the attenuation pole on the low frequency side of the pass band are able to be switched. Therefore, it is possible to switch between the frequency at the low frequency end of the pass band of the filter (first filter) and the frequency of the attenuation pole on the low frequency side of the pass band.

For example, the parallel arm circuit may include only the parallel arm resonators p1a and p1b, the switch SW4 (fourth switch). That is, the parallel arm circuit includes the parallel arm resonator p1a (first parallel arm resonator) electrically connected between the node on the series arm and the ground, the parallel arm resonator p1b (second parallel arm resonator) electrically connected between the node and the ground, and the switch SW4 (fourth switch) electrically connected in series to the parallel arm resonator p1b. Here, the resonant frequency of the parallel arm resonator p1a is lower than the frequency at the low frequency end of the pass band of the filter (first filter), and the resonant frequency of the parallel arm resonator p1b is higher than the resonant frequency of the parallel arm resonator p1a.

According to this configuration, the numbers of the resonant frequencies on the high frequency side and the anti-resonant frequencies of the parallel arm circuit are switched in accordance with the switching between on and off of the switch SW4, whereby the number of attenuation poles on the high frequency side of the pass band of the filter (first filter) is switched. Therefore, the number of the frequency of the attenuation pole on the high frequency side of the pass band of the filter (first filter) is able to be switched.

Further, the capacitor C4 (third impedance element) electrically connected in parallel to the switch SW4 (fourth switch) may also be provided. Here, the switch SW4 (fourth switch) and the capacitor C4 define the second frequency variable circuit 12Tb which is able to vary at least one of the resonant frequency and the anti-resonant frequency of the parallel arm circuit.

According to this configuration, it is possible to switch the resonant frequency on the high frequency side and the anti-resonant frequency on the low frequency side of the parallel arm circuit in accordance with the switching between on and off of the switch SW4. Therefore, both the frequency of the attenuation pole on the high frequency side of the pass band of the filter (first filter) and the frequency at the high frequency end of the pass band are able to be switched, so that the frequency of the attenuation pole on the high frequency side of the pass band is able to be switched while reducing the loss at the high frequency end of the pass band.

Preferred Embodiment 4

The configuration of the filter described in Preferred Embodiment 2 may be applied to a filter including a plurality of series arm circuits and a plurality of parallel arm circuits. In the present preferred embodiment, a multiplexer having such a filter will be described.

Figure 36A:
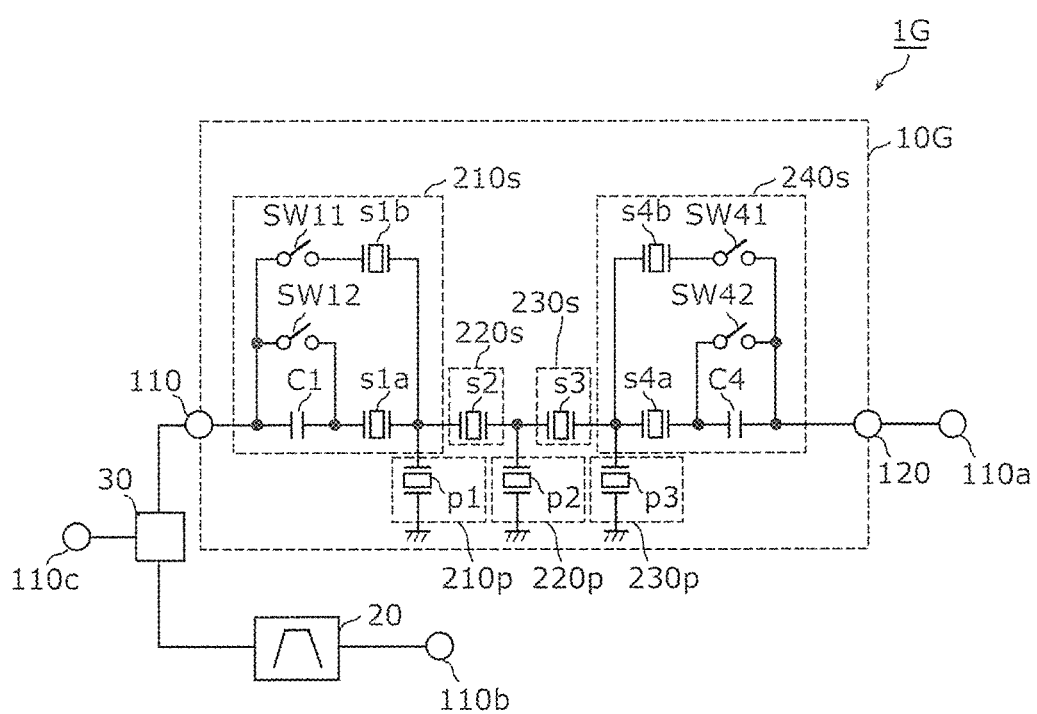
FIG. 36A is a circuit block diagram of a multiplexer according to Preferred Embodiment 4 of the present invention.

FIG. 36A is a circuit block diagram of a multiplexer 1G according to Preferred Embodiment 4. In this figure, the circuit configuration of a filter 10G is also illustrated.

The multiplexer 1G illustrated in the figure preferably includes a ladder filter circuit defined by a plurality of series arm circuits (four series arm circuits 210s, 220s, 230s and 240s in the present preferred embodiment) and one or more parallel arm circuits (three parallel arm circuits 210p, 220p, and 230p in the present preferred embodiment) as the filter 10G (first filter). Specifically, the filter 10G is a frequency variable band-pass filter having a plurality of bands as the pass band, and has the series arm resonators s1a and s1b, series arm resonators s2, s3, s4a and s4b, and further has parallel arm resonators p1, p2, and p3 and switches SW11, SW12, SW41, and SW42 and capacitors C1 and C4. The number of the series arm circuits and the parallel arm circuits is not limited to the number described above.

Here, among the series arm circuits 210s, 220s, 230s and 240s, the series arm circuit 210s provided closest to the input/output terminal 110 and the series arm circuit 240s provided closest to the input/output terminal 120 correspond to the series arm circuit 11E illustrated in Modification 3 of Preferred Embodiment 2. Accordingly, the switches SW11 and SW41 correspond to the switch SW1 of the series arm circuit 11E, the switches SW12 and SW42 correspond to the switch SW2 of the series arm circuit 11E, and the capacitors C1 and C4 correspond to the impedance element z1 of the series arm circuit 11E. Further, the parallel arm circuits 210p, 220p, and 230p correspond to the parallel arm circuit 12 of the filter according to Preferred Embodiments 1 and 2. Therefore, the parallel arm resonators p1, p2, and p3 correspond to the parallel arm resonator p1 of the parallel arm circuit 12. That is, the filter 10G is provided with a configuration corresponding to the filter 10E according to Modification 3 of Preferred Embodiment 2 at a position closest to the input/output terminal 110, and is provided with a configuration corresponding to the filter 10E according to Modification 3 of Preferred Embodiment 2 at a position closest to the input/output terminal 120.

Note that the configuration of the filter 10G is not limited to this. For example, at least one of the plurality of series arm circuits may correspond to any one of the series arm circuits of Preferred Embodiments 1 to 3, only the series arm circuit provided closest to one input/output terminal may correspond to any one of the series arm circuits of Preferred Embodiments 1 to 3, and the series arm circuit different from the series arm circuit provided closest to the one input/output terminal also may correspond to any one of the series arm circuits of Preferred Embodiments 1 to 3.

Further, a parallel arm circuit connecting the node on the path between the input/output terminal (input/output terminal 110 or input/output terminal 120) and the series arm circuit provided closest to the input/output terminal and the ground may be provided. Further, the parallel arm circuit may include a frequency variable circuit.

Since the multiplexer 1G configured as described above includes the filter 10G including the configuration of any one of the filters of Preferred Embodiments 1 to 3, it is possible to reduce the loss in the pass band of the filter 20 whose pass band is relatively higher than the pass band of the filter 10G.

Figure 36B:
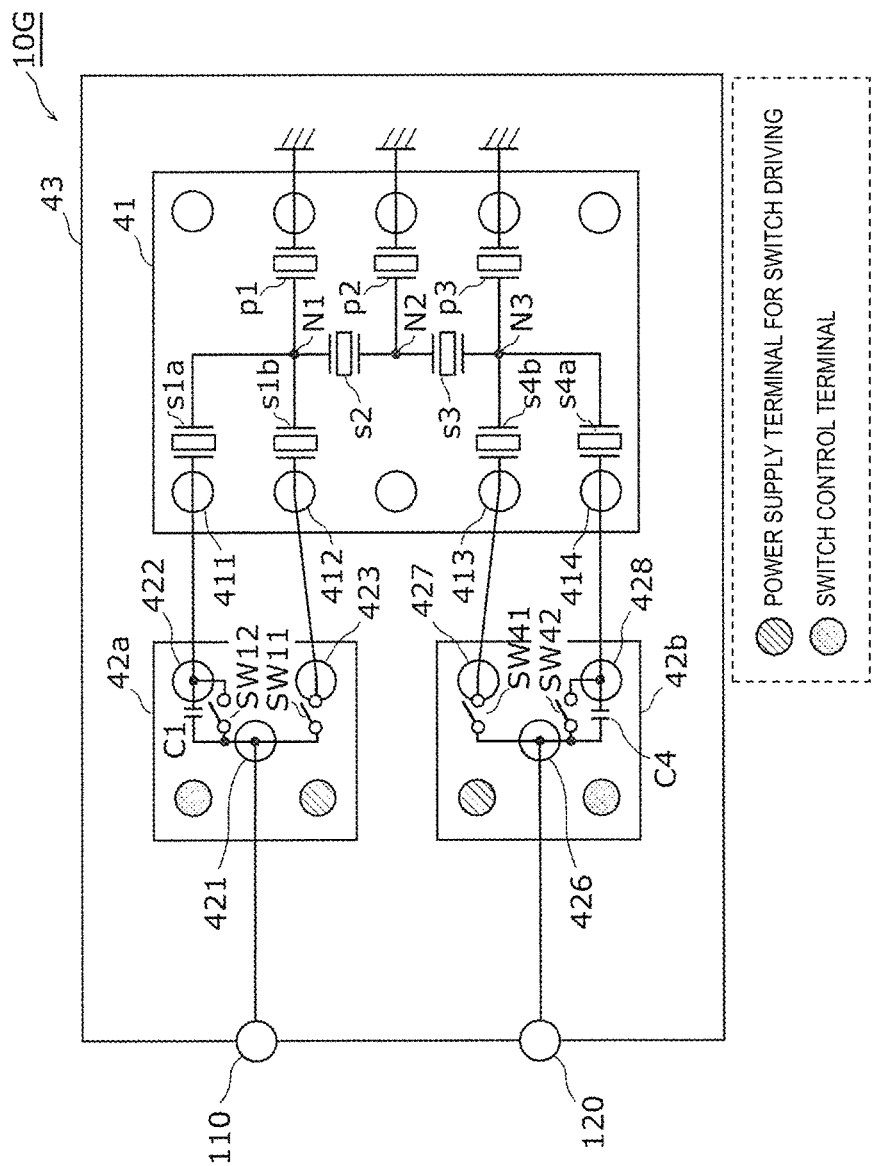
FIG. 36B is a plan view illustrating a structure of a filter according to Preferred Embodiment 4 of the present invention.

FIG. 36B is a plan view illustrating the structure of the filter 10G according to Preferred Embodiment 4.

As illustrated in the figure, in the present preferred embodiment, a plurality of resonators (series arm resonators s1a, s1b, s2, s3, s4a, s4b and parallel arm resonators p1 to p3) are defined by one resonator package 41 (chip), other elements (switches SW11, SW12, SW41, SW42 and capacitors C1, C4) are defined by packages 42a, 42b separate from the package 41 for the resonator, and these packages 41, 42a and 42b are mounted on the wiring substrate 43. That is, the resonator and the switch are provided in separate packages.

The packages 41 42a and 42b preferably have surface electrodes (also referred to as circles, "lands" or "pads" in FIG. 36B) used in mounting the packages 41 42a and 42b on the bottom surface by the wiring substrate 43. In FIG. 36B, circuit elements and wirings provided in each package are schematically illustrated for the sake of simplicity, and the surface electrodes on the bottom surface are illustrated seeing through the interiors of the packages 41, 42a and 42b.

Further, the wiring substrate 43 preferably includes external connection electrodes (circles in FIG. 36B) defining the input/output terminal 110 and the input/output terminal 120. The external connection electrode is preferably, for example, a portion of a surface electrode for mounting the wiring substrate 43 on a mother substrate or the like, a connector for connecting the wiring substrate 43 to other electronic components, or a pattern wiring that connects other electronic components to the package 42a or the package 42b when another electronic component is mounted on the wiring substrate 43.

As is apparent from the figure, in the package 42a, one terminal of the switch SW11 and one terminal of the switch SW12 are made common to each other, thereby being electrically connected to the input/output terminal 110 as a common terminal 421 of the package 42a. Further, the other terminal of the switch SW11 is electrically connected to a second terminal 423 of the package 42a. Further, the other terminal of the switch SW12 is electrically connected to a first terminal 422 of the package 42a. Note that the capacitor C1 is electrically connected in parallel with the switch SW12.

In the package 42b, one terminal of the switch SW41 and one terminal of the switch SW42 are made common to each other, thereby being electrically connected to the input/output terminal 120 as a common terminal 426 of the package 42b. Further, the other terminal of the switch SW42 is electrically connected to a second terminal 428 of the package 42b. Further, the other terminal of the switch SW41 is electrically connected to a first terminal 427 of the package 42b. Note that the capacitor C4 is electrically connected in parallel with the switch SW42.

In the package 41 of the resonator, the series arm resonator s1a is electrically connected between a first terminal 411 of the package 41 and a node N1, and the series arm resonator s1b is electrically connected between a second terminal 412 of the package 41 and the node N1. The series arm circuit 220s (series arm resonator s2) is electrically connected between the node N1 and a node N2 of the package 41, and the series arm circuit 230s (series arm resonator s3) is electrically connected between the node N2 and a node N3. Also, the series arm resonator s0b is electrically connected between a third terminal 413 of the package 41 and the node N3, and the series arm resonator s4a is electrically connected between a fourth terminal 414 of the package 41 and the node N3. The parallel arm circuit 210*p* (parallel arm resonator p1) is electrically connected between the node N1 of the package 41 and the ground terminal, the parallel arm circuit 220*p* (parallel arm resonator p2) is electrically connected between the node N2 and the ground terminal, and the parallel arm circuit 230*p* (parallel arm resonator p3) is electrically connected between the node N3 and the ground terminal.

The wiring substrate 43 connects the first terminal 422 of the package 42*a* to the first terminal 411 of the package 41, connects the second terminal 423 of the package 42*a* to the second terminal 412 of the package 41, connects the first terminal 427 of the package 42*b* and the third terminal 413 of the package 41, and connects the second terminal 428 of the package 42*b* and the fourth terminal 414 of the package 41.

In this way, in a case where one terminal of the switch provided in the series arm is electrically connected to one of the input/output terminals 110 and 120, when the packages 42*a* and 42*b* including the switches are provided separately from the package 41 including the resonator group, since the switch is positioned closer to one of the input/output terminals than the resonator group, the number of the terminals of the resonator package 41 and the switch packages 42*a* and 42*b* is able to be reduced, thus reducing the size of the filter 10G.

In the circuit configuration illustrated in FIG. 36A, at least one of the parallel arm resonators p1 to p3 may be provided separately from the resonator package, or the switches SW11, SW12, SW41, and SW42 and the capacitors C1 and C4 may be packaged in combinations different from those described above.

Preferred Embodiment 5

The filter and multiplexer described in the above Preferred Embodiments 1 to 4 may also be applied to a radio frequency front-end circuit corresponding to a system having a large number of bands to be used. Therefore, in the present preferred embodiment, the radio frequency front-end circuit and the communication device will be described.

Figure 37:
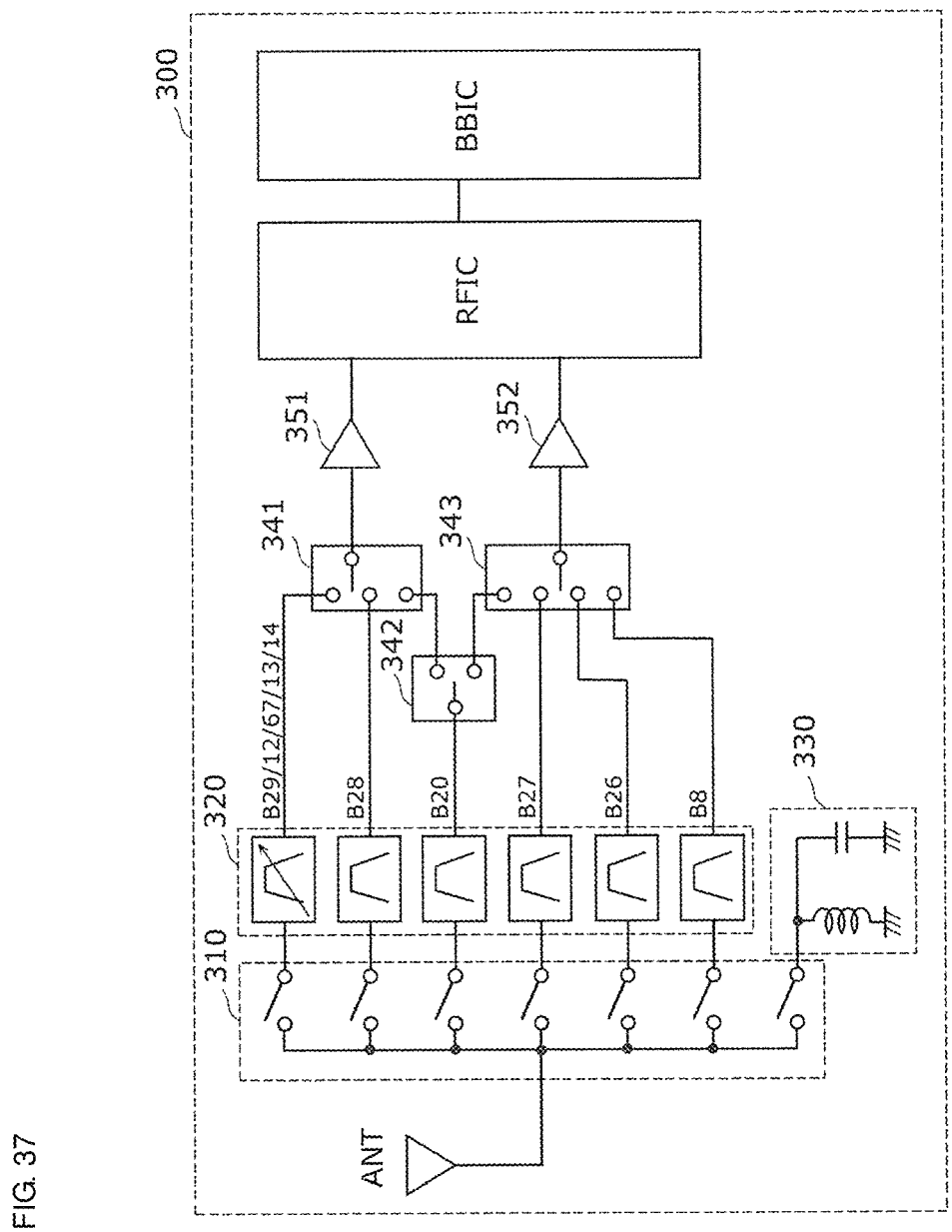
FIG. 37 is a configuration diagram of a communication device according to Preferred Embodiment 5 of the present invention.

FIG. 37 is a configuration diagram of a communication device 300 according to Preferred Embodiment 5.

As illustrated in the figure, the communication device 300 preferably includes a switch group 310 including a plurality of switches, a filter group 320 including a plurality of filters, a matching circuit 330, reception-side switches 341, 342, and 343, reception amplifier circuits 351 and 352, an RF signal processing circuit (RFIC), and a baseband signal processing circuit (BBIC).

The switch group 310 connects an antenna element (ANT) and a signal path corresponding to a predetermined band according to a control signal from a controller (not illustrated), and is a SPnT type switch defined by a plurality of SPST type switches, for example, and one or more switches are turned on. Note that the signal path to be electrically connected to the antenna element (ANT) is not limited to one, and may be a plurality of signal paths. That is, the communication device 300 may correspond to a carrier aggregation. Although the antenna element (ANT) is preferably incorporated in the communication device 300, the antenna element (ANT) may be provided separately from the communication device 300.

The filter group 320 is preferably defined by a plurality of filters (including duplexers) having, for example, the following band in the pass band. Specifically, the pass band is (i) a reception band of Band 29 or Band 12 or Band 67 or Band 13 or Band 14, (ii) a reception band of Band 28, (iii) a reception band of Band 20, (iv) a reception band of Band 27, (v) a reception band of Band 26, and (vi) a reception band of Band 8, for example.

The matching circuit 330 is preferably defined by, for example, an inductor and a capacitor, and is a matching circuit selected to perform simultaneous selection (carrier aggregation-compatible) of two or more filters among the filters (i) to (vi) described above.

The reception-side switch 341 is a switch circuit including a plurality of selection terminals electrically connected to a plurality of reception side signal paths on a low band side and a common terminal electrically connected to the reception amplifier circuit 351. The reception-side switch 342 is a switch circuit including a common terminal electrically connected to a reception side signal path of a predetermined band (here, Band 20), and two selection terminals electrically connected to a selection terminal of the reception-side switch 341 and a selection terminal of the reception-side switch 343. The reception-side switch 343 is a switch circuit including a plurality of selection terminals electrically connected to a plurality of reception side signal paths on a high band side and a common terminal electrically connected to the reception amplifier circuit 352. The reception-side switches 341 to 343 are provided at a subsequent stage of the filter group 320 (in this case, the subsequent stage in the reception side signal path), and the connection state is switched in accordance with a control signal from a controller (not illustrated). As a result, a radio frequency signal (here, a radio frequency reception signal) input to the antenna element (ANT) is amplified by the reception amplifier circuits 351 and 352 through a predetermined filter in the filter group 320, and is then output to the RF signal processing circuit (RFIC). The RF signal processing circuit (RFIC) corresponding to the low band and the RF signal processing circuit (RFIC) corresponding to the high band may be separately provided.

The reception amplifier circuit 351 is a low-noise amplifier that provides power-amplifying of the radio frequency reception signal of the low band, and the reception amplifier circuit 352 is a low-noise amplifier for power-amplifying the radio frequency reception signal of the high band.

The RF signal processing circuit (RFIC) is a circuit that processes a radio frequency signal transmitted and received by the antenna element (ANT). Specifically, the RF signal processing circuit (RFIC) processes the radio frequency signal (here, the radio frequency reception signal) input from the antenna element (ANT) via the reception side signal path by down-converting or the like, and outputs the reception signal generated by signal processing to the baseband signal processing circuit (BBIC). Further, the RF signal processing circuit (RFIC) processes a transmission signal input from the baseband signal processing circuit (BBIC) by up-converting or the like, and outputs the radio frequency signal (here, a radio frequency transmission signal) generated by the signal processing to a transmission side signal path.

The communication device 300 configured as described above includes the filter according to any one of Preferred Embodiments 1 to 3 as at least one of the filters having the reception bands of above described (i) to (vi) in the pass band. That is, the filter switches the pass band in accordance with the control signal.

In the communication device 300, the switch group 310, the filter group 320, the matching circuit 330, the reception-side switches 341 to 343, the reception amplifier circuits 351 and 352, and the controller preferably define the radio frequency front-end circuit.

Here, although not illustrated in FIG. 37, the controller may be included in the RF signal processing circuit (RFIC), or may define a switch IC together with each switch controlled by the controller.

According to the radio frequency front-end circuit and the communication device 300 configured as described above, it is possible to provide a radio frequency front-end circuit and a communication device capable of reducing a loss in the pass band of the second filter having a relatively high pass band (i.e., having a pass band on the higher frequency side with respect to the first filter) by including any one of the multiplexers according to Preferred Embodiments 1 to 4 or the first filter of the multiplexer.

According to the radio frequency front-end circuit of the present preferred embodiment, the reception-side switches 341 to 343 (switch circuit) are preferably provided at a preceding stage or the subsequent stage of the filter group 320 (a plurality of radio frequency filter circuits). As a result, a portion of the signal path on which the radio frequency signal is transmitted is able to be made common. Therefore, for example, the reception amplifier circuits 351 and 352 (amplifier circuits) corresponding to the plurality of radio frequency filter circuits are able to be used in common. Therefore, it is possible to reduce the size and cost of the radio frequency front-end circuit.

It should be noted that at least one of the reception-side switches 341 to 343 may be provided. However, the number of the reception-side switches 341 to 343 is not limited to the number described above, and for example, one reception-side switch may be provided. Also, the number of selection terminals or the like of the reception-side switches is not limited to the present preferred embodiment, and may be two for each switch.

In addition, instead of being defined by only the reception side signal path like the communication device 300 according to the preferred embodiment, a radio frequency front-end circuit and a communication device which include only the transmission side signal path, or include both the reception side signal path and the transmission side signal path may also be adopted.

Other Preferred Embodiments

Although the multiplexer, the radio frequency front-end circuit, and the communication device according to the preferred embodiment of the present invention have been described with reference to Preferred Embodiments 1 to 5 and modifications, the multiplexer, the radio frequency front-end circuit, and the communication device of the present invention are not limited to the above preferred embodiments and modifications. Other preferred embodiments which are realized by combining any of the constituent elements in the above described preferred embodiments and modifications, variations which are obtained by those skilled in the art without departing from the gist of the present invention with respect to the above preferred embodiments, and various devices which incorporate therein the filter device, the multiplexer, the radio frequency front-end circuit and the communication device according to the present disclosure are also included in the present invention.

In addition, in the filter according to Preferred Embodiments 1 to 5 and the modifications thereof, the substrate 101 having piezoelectricity when providing the acoustic wave filter may have a lamination structure in which the high acoustic velocity support substrate, the low acoustic velocity film, and the piezoelectric film are laminated in this order. The piezoelectric film is preferably made of, for example, a 50° Y-cut X propagation $LiTaO_3$ piezoelectric single crystal or piezoelectric ceramics (a lithium tantalate single crystal obtained by cutting a plane with an axis as a normal line rotated about an X-axis as a center axis by 50° from a Y-axis, or ceramics, that is, a single crystal or ceramics in which an acoustic wave propagates in an X-axis direction). The piezoelectric film preferably has a thickness equal to or less than about 3.5λ, for example, when the wavelength determined by the electrode finger pitch of the IDT electrode is λ. The high acoustic velocity support substrate is a substrate that supports the low acoustic velocity film, the piezoelectric film, and the electrode film. The high acoustic velocity support substrate is a substrate in which the acoustic velocity of the bulk wave in the high acoustic velocity support substrate is higher than that of the acoustic wave such as the surface acoustic wave or the boundary wave propagating through the piezoelectric film, and functions to confine the acoustic wave to a portion where the piezoelectric film and the low acoustic velocity film are laminated, so as to prevent the acoustic wave from leaking below the high acoustic velocity support substrate. The high acoustic velocity support substrate is, for example, a silicon substrate, and preferably has a thickness of, for example, about 120 µm. The low acoustic velocity film is a film in which the sound velocity of the bulk wave in the low acoustic velocity film is lower than that of the acoustic wave propagating through the piezoelectric film, and is disposed between the piezoelectric film and the high acoustic velocity support substrate. Due to this structure and the nature of the acoustic wave energy concentration in the medium with essentially low acoustic velocity, the leakage of the acoustic wave energy out of the IDT electrode is reduced. The low acoustic velocity film is, for example, a film containing silicon dioxide as a main component, and preferably has a thickness of, for example, about 670 nm. According to this lamination structure, Q values at the resonant frequency and the anti-resonant frequency are able to be significantly increased compared to the structure in which the piezoelectric substrate 101 is used as a single layer. That is, since the elastic wave resonator having a high Q value is provided, it is possible to construct a filter with a small insertion loss by using the acoustic wave resonator.

The high acoustic velocity support substrate may have a structure in which the support substrate and a high acoustic velocity film in which the acoustic velocity of the propagating bulk wave is higher than that of the acoustic wave such as the surface acoustic wave or the boundary wave propagating through the piezoelectric film are laminated. In this case, the supporting substrate may preferably be made of a piezoelectric material such as, for example, sapphire, lithium tantalate, lithium niobate or quartz, various ceramics such as, for example, alumina, magnesia, silicon nitride, aluminum nitride, silicon carbide, zirconia, cordierite, mullite, steatite or forsterite, a dielectric such as, for example, glass, or a semiconductor such as, for example, silicon or gallium nitride, and a resin substrate, or the like. The high acoustic velocity film may be made of various high acoustic velocity materials such as aluminum nitride, aluminum oxide, silicon carbide, silicon nitride, silicon oxynitride, DLC film or diamond, a medium containing the above material as a main component, or a medium containing a mixture of the above materials as a main component.

Further, the switches SW1 to SW4, SW11, SW12, SW41 and SW42 are preferably, for example, a single pole single throw (SPST) type switch element. The switches SW1 to SW4, SW11, SW12, SW41 and SW42 are switched on and off by a control signal from the controller to thereby make the respective connection nodes be conductive or non-conductive.

Examples of the switches SW1 to SW4, SW11, SW12, SW41 and SW42 include a field effect transistor (FET) switch made of GaAs or a complementary metal oxide semiconductor (CMOS), and a diode switch, for example. Thus, each of the switches SW1 to SW4 may preferably be defined by one FET switch or diode switch, so that the filter is able to be made compact.

In addition, in the multiplexer, the radio frequency front-end circuit, and the communication device according to Preferred Embodiments 1 to 5 and the modifications thereof, an inductance element or a capacitance element may be electrically connected between each of the input/output terminals and the common terminal. Further, an inductance component by a wiring connecting the circuit elements may be included.

INDUSTRIAL APPLICABILITY

Preferred embodiments of the present invention are widely applicable to a communication apparatus such as a mobile phone, for example, as a small filter device, a multiplexer, a radio frequency front-end circuit, and a communication device which may be applied to a multiband and a multi-mode system using a plurality of adjacent bands simultaneously or exclusively.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal;
a first filter that is an acoustic wave filter electrically connected to the common terminal and that has a pass band; and
a second filter that is electrically connected to the common terminal and that has a pass band on a higher frequency side of the pass band of the first filter; wherein
the first filter includes:
a first input/output terminal;
a second input/output terminal;
a series arm circuit provided on a path connecting the first input/output terminal and the second input/output terminal; and
a parallel arm circuit electrically connected to a node on the path and ground;
in the parallel arm circuit or the series arm circuit, a frequency at which an impedance is locally minimum is defined as a resonant frequency, and a frequency at which an impedance is locally maximum is defined as an anti-resonant frequency, a frequency at which an impedance of a resonator is locally minimum is defined as a resonant frequency, and a frequency at which an impedance of the resonator is locally maximum is defined as an anti-resonant frequency, and the parallel arm circuit has a resonant frequency located on a lower frequency side of a frequency at a low frequency end of the pass band of the first filter;
the series arm circuit includes:
a first series arm resonator defined by an acoustic wave resonator having a resonant frequency in the pass band of the first filter; and
a second series arm resonator defined by an acoustic wave resonator that is electrically connected in parallel to the first series arm resonator and that has a resonant frequency located on a higher frequency side of a frequency at a high frequency end of the pass band of the first filter; and
the resonant frequency of the second series arm resonator is lower than a frequency at a low frequency end of the pass band of the second filter.

2. A multiplexer comprising:
a common terminal;
a first filter that is an acoustic wave filter electrically connected to the common terminal and that has a pass band; and
a second filter that is electrically connected to the common terminal and that has a pass band on a higher frequency side of the pass band of the first filter;
wherein the first filter includes:
a first input/output terminal;
a second input/output terminal;
a series arm circuit provided on a path connecting the first input/output terminal and the second input/output terminal; and
a parallel arm circuit electrically connected to a node on the path and ground;
in the parallel arm circuit or the series arm circuit, a frequency at which an impedance is locally minimum is defined as a resonant frequency, and a frequency at which an impedance is locally maximum is defined as an anti-resonant frequency, a frequency at which an impedance of a resonator is locally minimum is defined as a resonant frequency, and a frequency at which an impedance of the resonator is locally maximum is defined as an anti-resonant frequency,
and the parallel arm circuit has a resonant frequency located on a lower frequency side of a frequency at a low frequency end of the pass band of the first filter;
the parallel arm circuit includes a first parallel arm resonator electrically connected between the node and the ground, and a second parallel arm resonator electrically connected in parallel to the first parallel arm resonator;
a resonant frequency of the first parallel arm resonator is lower than the frequency at the low frequency end of the pass band of the first filter, and a resonant frequency of the second parallel arm resonator is higher than the resonant frequency of the first parallel arm resonator; and
the series arm circuit includes:
a first series arm resonator defined by an acoustic wave resonator having a resonant frequency in the pass band of the first filter; and
a second series arm resonator defined by an acoustic wave resonator that is electrically connected in parallel to the first series arm resonator and that has a resonant frequency located on a higher frequency side of a frequency at a high frequency end of the pass band of the first filter.

3. The multiplexer according to claim 1, wherein
the first filter further includes another series arm circuit including an acoustic wave resonator provided on the path;
the series arm circuit is electrically connected to the first input/output terminal without the another series arm circuit being interposed therebetween; and
the first input/output terminal is electrically connected to the common terminal without any acoustic wave resonator being interposed therebetween.

4. The multiplexer according to claim 3, wherein the another series arm circuit has one or more resonant frequencies and one or more anti-resonant frequencies, and a value obtained by dividing a frequency difference between an anti-resonant frequency located at a lowest frequency and a resonant frequency located at a lowest frequency of the another series arm circuit having the one or more resonant frequencies and the one or more anti-resonant frequencies by the resonant frequency located at the lowest frequency is defined as a band width ratio of the another series arm circuit;
the parallel arm circuit has one or more resonant frequencies and one or more antiresonant frequencies, and a value obtained by dividing a frequency difference between an antiresonant frequency located at a lowest frequency and a resonant frequency located at a lowest frequency of the parallel arm circuit having the one or more resonant frequencies and the one or more anti-resonant frequencies by the resonant frequency located at the lowest frequency is defined as a band width ratio of the parallel arm circuit;
a value obtained by dividing a frequency difference between an anti-resonant frequency of a series arm resonator and a resonant frequency of the series arm resonator by the resonant frequency is defined as a band width ratio of the series arm resonator; and
a band width ratio of the first series arm resonator is wider than both a band width ratio of the another series arm circuit and a band width ratio of the parallel arm circuit.

5. The multiplexer according to claim 1, wherein
the series arm circuit further includes a first impedance element electrically connected in series to the first series arm resonator;
a circuit in which the first series arm resonator and the first impedance element are electrically connected in series and the second series arm resonator are electrically connected in parallel; and
the first impedance element is a capacitor or an inductor.

6. The multiplexer according to claim 1, wherein the series arm circuit further includes:
a first impedance element electrically connected in series to the first series arm resonator; and
a first switch electrically connected in series to the second series arm resonator;
a first circuit including the first series arm resonator and the first impedance element that are electrically connected in series and a second circuit including the second series arm resonator and the first switch that are electrically connected in series are electrically connected in parallel; and
the first impedance element is a capacitor or an inductor.

7. The multiplexer according to claim 6, wherein the first switch is electrically connected to the first input/output terminal or the second input/output terminal without any series arm resonator being interposed therebetween.

8. The multiplexer according to claim 5, further comprising a second switch electrically connected in parallel to the first impedance element.

9. The multiplexer according to claim 8, wherein the second switch is electrically connected to the first input/output terminal or the second input/output terminal without any series arm resonator being interposed therebetween.

10. The multiplexer according to claim 1, wherein
the parallel arm circuit includes a first parallel arm resonator electrically connected between the node and the ground; and
a resonant frequency of the first parallel arm resonator is lower than the frequency at the low frequency end of the pass band of the first filter.

11. The multiplexer according to claim 10, wherein
the parallel arm circuit further includes a second parallel arm resonator electrically connected in parallel to the first parallel arm resonator; and
a resonant frequency of the second parallel arm resonator is higher than the resonant frequency of the first parallel arm resonator.

12. The multiplexer according to claim 1, wherein
the parallel arm circuit includes:
a first parallel arm resonator electrically connected between the node and the ground; and
a second impedance element electrically connected in series to the first parallel arm resonator; and
a resonant frequency of the first parallel arm resonator is lower than the frequency at the low frequency end of the pass band of the first filter.

13. The multiplexer according to claim 12, wherein
the parallel arm circuit further includes a third switch electrically connected in parallel to the second impedance element; and
the first parallel arm resonator and the second impedance element define a first frequency variable circuit that changes a frequency of at least one of a resonant frequency and an anti-resonant frequency of the parallel arm circuit by switching between conduction and non-conduction of the third switch.

14. The multiplexer according to claim 13, wherein
the parallel arm circuit further includes:
a second parallel arm resonator electrically connected between the node and the ground;
the second parallel arm resonator and a circuit in which the first parallel arm resonator and the first frequency variable circuit are electrically connected in series, are electrically connected in parallel; and
a resonant frequency of the second parallel arm resonator is higher than a resonant frequency of the first parallel arm resonator.

15. The multiplexer according to claim 13, wherein
the parallel arm circuit further includes:
a second parallel arm resonator electrically connected between the node and the ground; and
a fourth switch electrically connected in series to the second parallel arm resonator;
a circuit in which the second parallel arm resonator and the fourth switch are electrically connected in series and a circuit in which the first parallel arm resonator and the first frequency variable circuit are electrically connected in series are electrically connected in parallel; and
a resonant frequency of the second parallel arm resonator is higher than a resonant frequency of the first parallel arm resonator.

16. The multiplexer according to claim 1, wherein
the parallel arm circuit includes:
- a first parallel arm resonator electrically connected between the node and the ground;
- a second parallel arm resonator electrically connected between the node and the ground; and
- a fourth switch electrically connected in series to the second parallel arm resonator,
a resonant frequency of the first parallel arm resonator is lower than the frequency at the low frequency end of the pass band of the first filter; and
a resonant frequency of the second parallel arm resonator is higher than the resonant frequency of the first parallel arm resonator.

17. The multiplexer according to claim 16, wherein
the parallel arm circuit further includes a third impedance element electrically connected in parallel to the fourth switch; and
the fourth switch and the third impedance element define a second frequency variable circuit that changes a frequency of at least one of a resonant frequency and an anti-resonant frequency of the parallel arm circuit by switching conduction and non-conduction of the fourth switch.

18. The multiplexer according to claim 1, wherein
the parallel arm circuit includes:
- a first parallel arm resonator electrically connected between the node and the ground;
- a second impedance element electrically connected in series to the first parallel arm resonator;
- a third switch electrically connected in parallel to the second impedance element;
- a second parallel arm resonator electrically connected between the node and the ground;
- a third impedance element electrically connected in series to the second parallel arm resonator; and
- a fourth switch electrically connected in parallel to the third impedance element;
a circuit in which the first parallel arm resonator and the second impedance element are electrically connected in series, and a circuit in which the second parallel arm resonator and the third impedance element are electrically connected in series are electrically connected in parallel;
the second impedance element and the third switch define a first frequency variable circuit that changes a frequency of at least one of a resonant frequency and an anti-resonant frequency of the parallel arm circuit by switching between conduction and non-conduction of the third switch;
the third impedance element and the fourth switch define a second frequency variable circuit that changes a frequency of at least one of a resonant frequency and an anti-resonant frequency of the parallel arm circuit by switching between conduction and non-conduction of the fourth switch;
a resonant frequency of the first parallel arm resonator is lower than the frequency at the low frequency end of the pass band of the first filter; and
a resonant frequency of the second parallel arm resonator is higher than the resonant frequency of the first parallel arm resonator.

19. The multiplexer according to claim 18, wherein
the first frequency variable circuit is electrically connected between the first parallel arm resonator and the ground; and
the second frequency variable circuit is electrically connected between the second parallel arm resonator and the ground.

20. A multiplexer comprising:
a common terminal;
a first filter that is an acoustic wave filter electrically connected to the common terminal and that has a pass band; and
a second filter that is electrically connected to the common terminal and that has a pass band on a higher frequency side of the pass band of the first filter;
wherein the first filter includes:
a first input/output terminal;
a second input/output terminal;
a series arm circuit provided on a path connecting the first input/output terminal and the second input/output terminal;
another series arm circuit including an acoustic wave resonator provided on the path; and
a parallel arm circuit electrically connected to a node on the path and ground;
in the parallel arm circuit or the series arm circuit, a frequency at which an impedance is locally minimum is defined as a resonant frequency, and a frequency at which an impedance is locally maximum is defined as an anti-resonant frequency, a frequency at which an impedance of a resonator is locally minimum is defined as a resonant frequency, and a frequency at which an impedance of the resonator is locally maximum is defined as an anti-resonant frequency,
and the parallel arm circuit has a resonant frequency located on a lower frequency side of a frequency at a low frequency end of the pass band of the first filter;
the series arm circuit includes:
a first series arm resonator defined by an acoustic wave resonator having a resonant frequency in the pass band of the first filter; and
a second series arm resonator defined by an acoustic wave resonator that is electrically connected in parallel to the first series arm resonator and that has a resonant frequency located on a higher frequency side of a frequency at a high frequency end of the pass band of the first filter;
the series arm circuit is electrically connected to the first input/output terminal without the another series arm circuit being interposed there between;
the first input/output terminal is electrically connected to the common terminal without any acoustic wave resonator being interposed there between;
the another series arm circuit has one or more resonant frequencies and one or more anti-resonant frequencies, and a value obtained by dividing a frequency difference between an anti-resonant frequency located at a lowest frequency and a resonant frequency located at a lowest frequency of the series arm circuit having the one or more resonant frequencies and the one or more anti-resonant frequencies by the resonant frequency located at the lowest frequency is defined as a band width ratio of the series arm circuit;
the parallel arm circuit has one or more resonant frequencies and one or more antiresonant frequencies, and a value obtained by dividing a frequency difference between an antiresonant frequency located at a lowest frequency and a resonant frequency located at a lowest frequency of the parallel arm circuit having the one or more resonant frequencies and the one or more antiresonant frequencies by the resonant frequency located at the lowest frequency is defined as a band width ratio of the parallel arm circuit;

a value obtained by dividing a frequency difference between an anti-resonant frequency of a series arm resonator and a resonant frequency of the series arm resonator by the resonant frequency is defined as a band width ratio of the series arm resonator; and a band width ratio of the first series arm resonator is wider than both a band width ratio of the another series arm circuit and a band width ratio of the parallel arm circuit.

* * * * *